United States Patent [19]
Korenage et al.

[11] Patent Number: 5,841,250
[45] Date of Patent: Nov. 24, 1998

[54] STAGE APPARATUS AND LINEAR MOTOR, AND EXPOSURE APPARATUS AND DEVICE PRODUCTION METHOD USING THE STAGE APPARATUS

[75] Inventors: Nobushige Korenage; Ryuichi Ebinuma, both of Utsunomiya, Japan

[73] Assignee: Canon Kabushiki Kaisha, Tokyo, Japan

[21] Appl. No.: 725,401

[22] Filed: Oct. 3, 1996

[30] Foreign Application Priority Data

Oct. 9, 1995 [JP] Japan .................................... 7-286345
Jul. 9, 1996 [JP] Japan .................................... 8-196924

[51] Int. Cl.$^6$ ........................... H02K 41/00; H02K 41/02
[52] U.S. Cl. ............................................. 318/135; 310/12
[58] Field of Search ............................. 318/135; 310/12, 310/13; 250/491.1; 356/401

[56] References Cited

U.S. PATENT DOCUMENTS

| | | | |
|---|---|---|---|
| 3,621,349 | 11/1971 | Reyx ........................................ | 318/135 |
| 3,736,880 | 6/1973 | Ross ......................................... | 318/135 |
| 3,803,466 | 4/1974 | Starkey ................................... | 318/135 |
| 3,958,166 | 5/1976 | Bailey ...................................... | 318/135 |
| 4,415,911 | 11/1983 | Tazaki .................................... | 318/135 |
| 4,999,506 | 3/1991 | Mizusawa et al. ................... | 250/491.1 |
| 5,083,905 | 1/1992 | Mohn ....................................... | 310/12 |
| 5,112,133 | 5/1992 | Kurosawa et al. .................... | 250/491.1 |
| 5,260,580 | 11/1993 | Itoh et al. .............................. | 250/492.2 |
| 5,365,839 | 11/1994 | Yoshino et al. ........................ | 318/135 |
| 5,402,680 | 4/1995 | Korenaga ................................. | 73/518 |
| 5,467,720 | 11/1995 | Korenaga et al. ..................... | 108/20 |
| 5,518,550 | 5/1996 | Korenaga et al. .................. | 250/442.11 |

FOREIGN PATENT DOCUMENTS 0346815  12/1989  European Pat. Off. .
0451773  10/1991  European Pat. Off. .

*Primary Examiner*—Clayton E. LaBalle
*Attorney, Agent, or Firm*—Fitzpatrick, Cella, Harper & Scinto

[57] ABSTRACT

It is an object to provide a compact, lightweight, and inexpensive stage apparatus. A stage apparatus for moving a stage in a predetermined direction includes a stage accelerating/decelerating thrust generation unit arranged along the moving direction, a stage speed control thrust generation unit arranged to be parallel to the stage accelerating/decelerating thrust generation unit, an accelerating unit for generating a stage accelerating thrust at a portion corresponding to the stage accelerating interval of the accelerating/decelerating thrust generation unit, a decelerating unit for generating a stage decelerating thrust at a portion corresponding to the stage decelerating interval of the accelerating/decelerating thrust generation unit, and a speed control unit for controlling the stage thrust generated by the speed control thrust generation unit at least within a predetermined range between the accelerating interval and the decelerating interval.

21 Claims, 35 Drawing Sheets

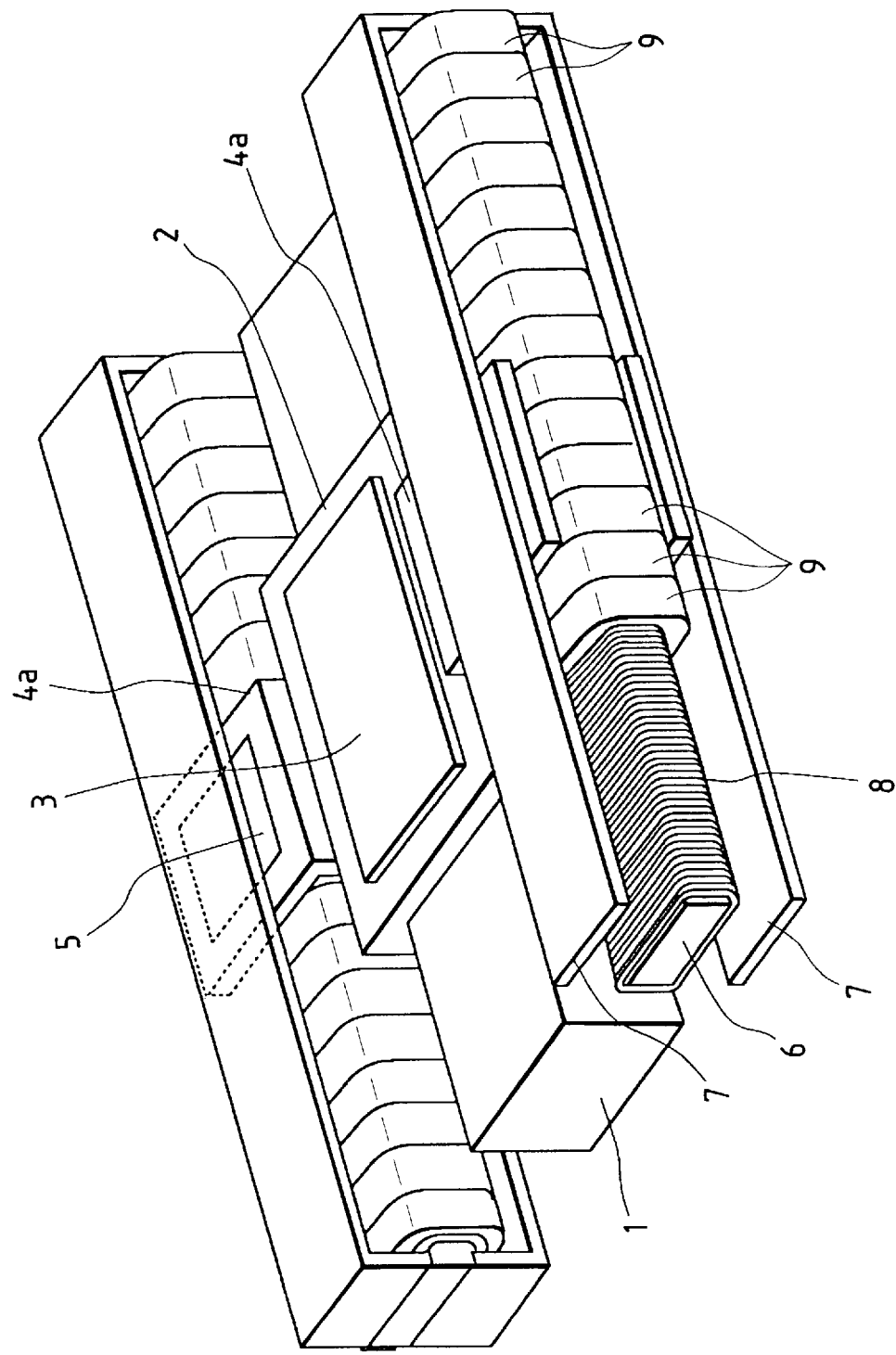

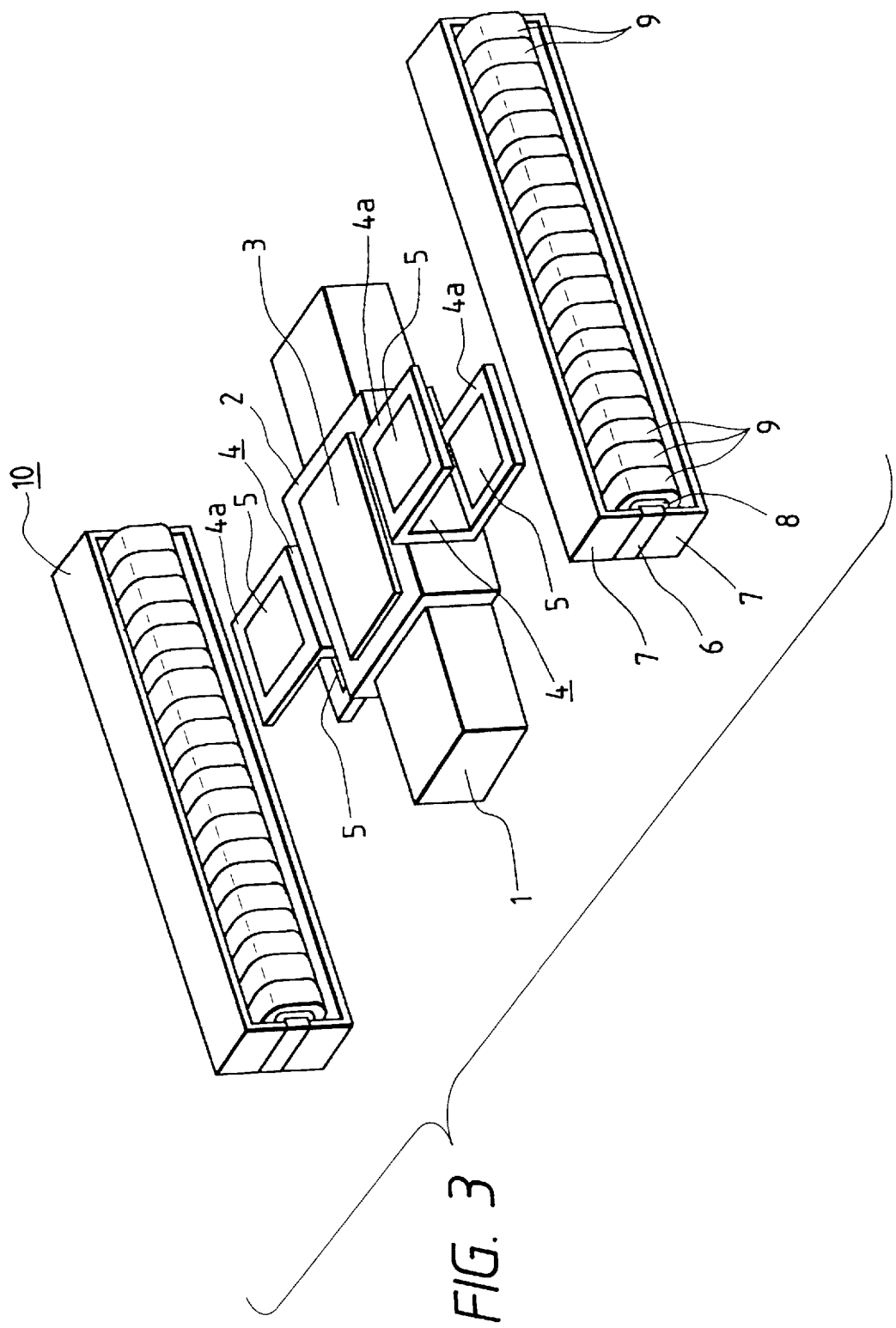

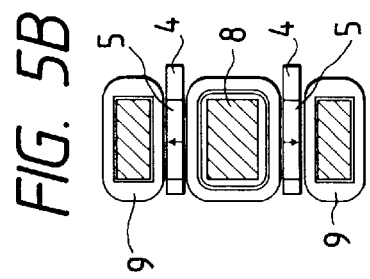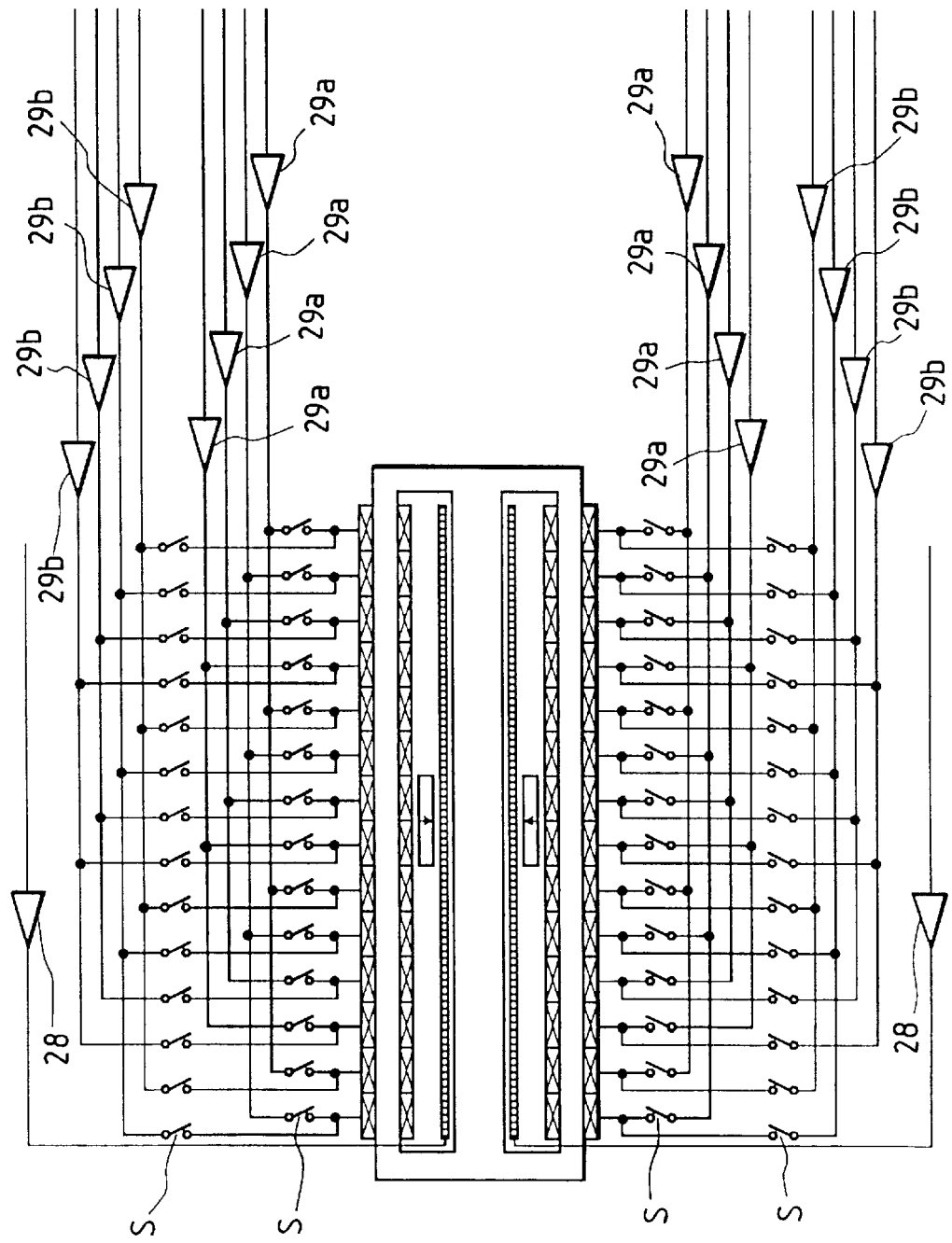

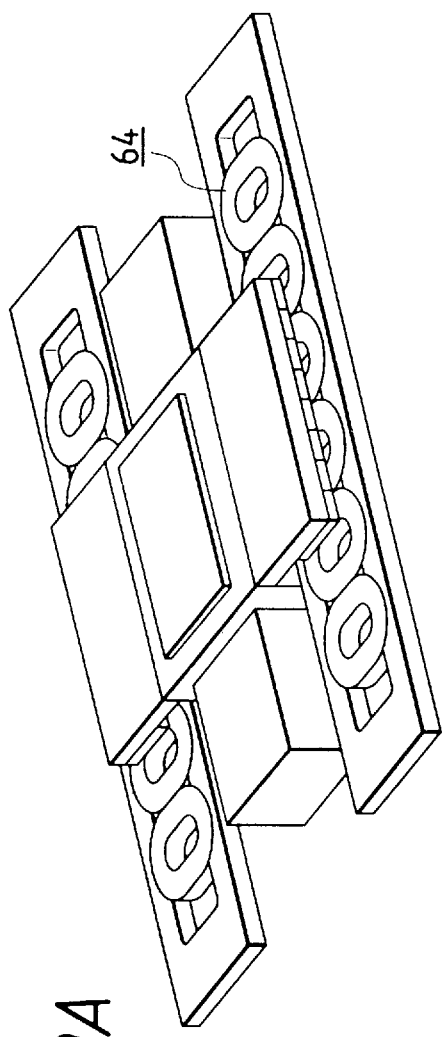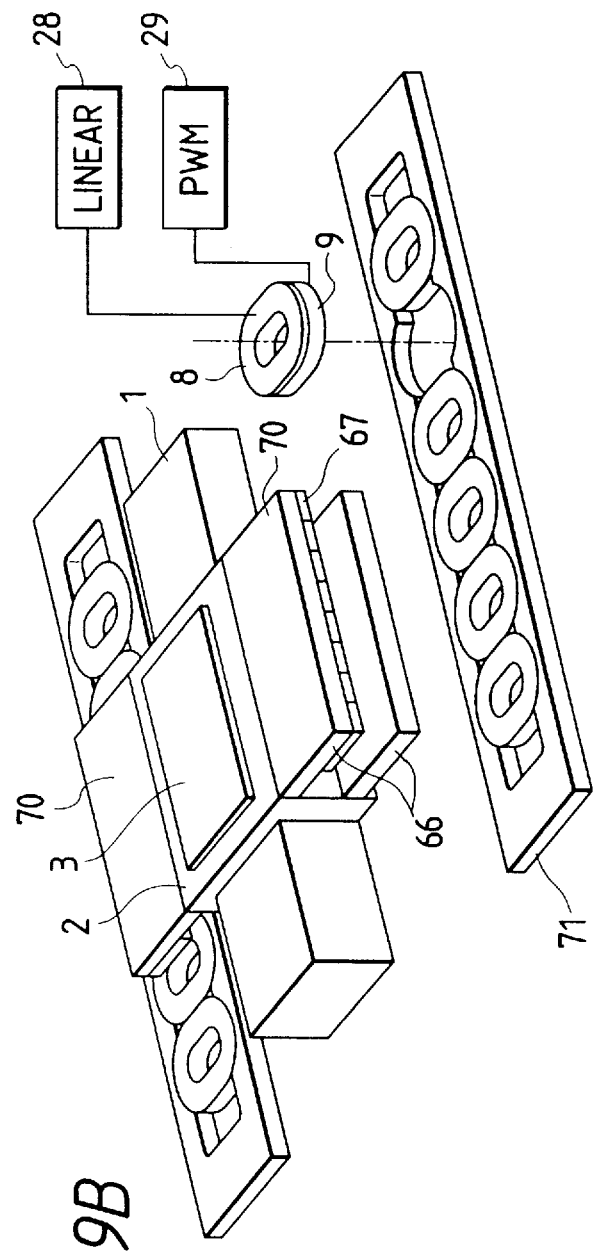
FIG. 19A
FIG. 19B

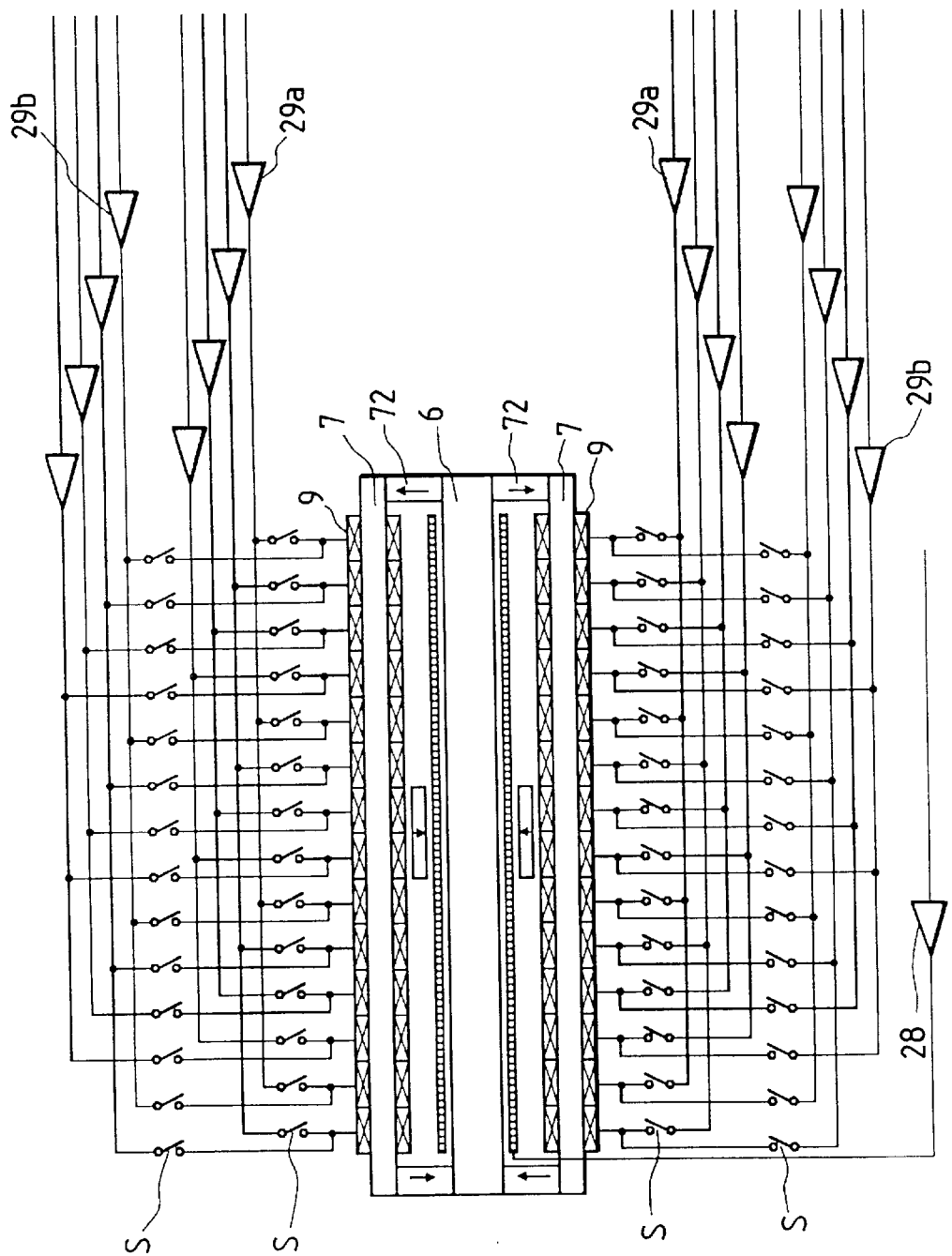

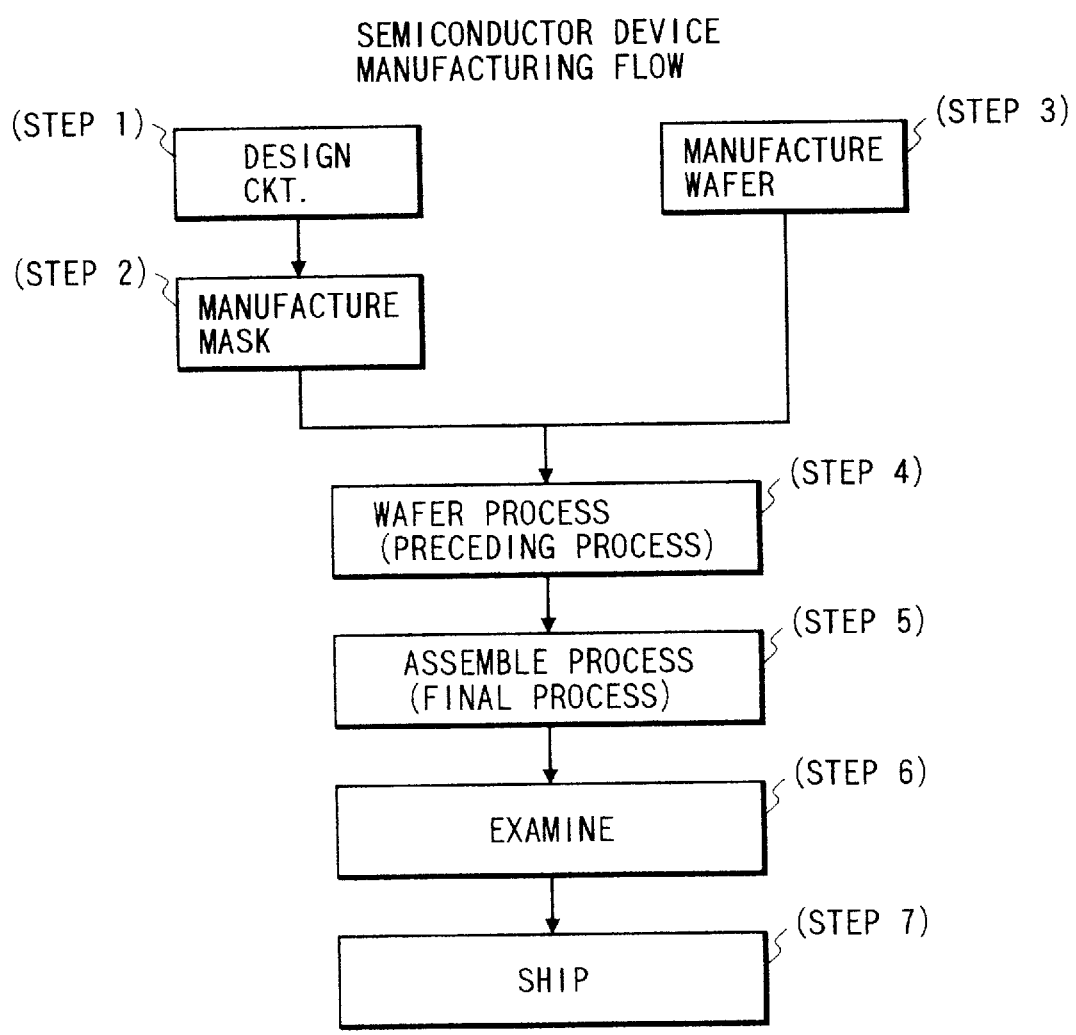

STAGE APPARATUS AND LINEAR MOTOR, AND EXPOSURE APPARATUS AND DEVICE PRODUCTION METHOD USING THE STAGE APPARATUS

BACKGROUND OF THE INVENTION

1. Field of the Invention

The present invention relates to a stage apparatus which positions, in particular, a workpiece such as a semiconductor wafer or a reticle to a predetermined position or scans the workpiece at a predetermined speed in an exposure apparatus. The present invention also relates to a linear motor used for such a stage apparatus, and an exposure apparatus and device production method using such a stage apparatus.

2. Related Background Art

FIG. 31 is a view showing a conventional semiconductor exposure apparatus to which the present invention is applied. This exposure apparatus is a so-called scan type exposure apparatus in which an image of only an arcuated or rectangular region of a reticle pattern, i.e., an original pattern is formed on a wafer as an exposure target, and both the reticle and the wafer are mechanically scanned to exposure the entire reticle pattern. FIGS. 32 and 33 are perspective views showing details of a reticle scanning system. FIG. 32 shows a system in which a driving system is arranged on one side of the reticle stage. FIG. 33 shows a system in which driving systems are arranged on both sides of the reticle stage, i.e., on both sides of the optical axis.

Referring to FIG. 31, a main body table 102 is supported on a reference base 100 through an anti-vibration means 101. A wafer stage 103 is mounted on the main body table 102 to be movable within the X-Y plane (horizontal plane). A projection optical system 106 is fixed above the wafer stage 103 through a main body supporting member 105. A reticle stage base 80, and a reticle stage 82 capable of uniaxially scanning on the reticle stage base 80 along a guide (not shown) are arranged above the supporting member 105. An interferometer second reference 104 is used to measure the position of the wafer stage 103. An interferometer first reference 107 is used to measure the position of the reticle stage 82. An illumination system 108 supplies an exposure energy to a wafer (not shown) on the wafer stage 103 through a reticle (not shown) on the reticle stage 82.

Referring to FIG. 33, a guide 81 is fixed on the reticle stage base 80. The reticle stage 82 is supported on the guide 81 through a lubricating means such as an air film to be slidable in the scanning direction. A reticle 83 as a workpiece is held on the stage 82. Driving coils 85 are fixed on both sides of the reticle stage 82. Liner motor stators each comprising a yoke 86 and a permanent magnet 87 are arranged to apply predetermined magnetic fields perpendicular to the windings to part of the driving coils 85 over the entire stroke of the reticle stage 82. The linear motor stators are fixed on the reticle stage base 80. A power amplifier (not shown) is connected to the driving coil 85. A linear power amplifier which continuously flows a current corresponding to a command value is used, so that the power amplifier can respond to a current command up to high frequencies. The wafer stage 103 can have a similar arrangement as that of the reticle stage 82. The X-Y stage is constituted by stacking two driving mechanisms (stage apparatuses).

The permanent magnet 87 is magnetized in the direction of its thickness, as shown in FIG. 34. More specifically, the magnet surface contacting the yoke 86 is magnetized to an S pole, and the opposite magnet surface opposing part of the driving coil 85 is magnetized to an N pole. The driving coil 85 is kept separated from the yoke 86 and the permanent magnet 87, i.e., the linear motor stator, over the entire stroke of the reticle stage 82.

In the above arrangement, when the workpiece 83 such as a reticle or a wafer is to be moved, the linear power amplifier flows an accelerating current or a decelerating current to the driving coil 85 upon receiving a command from a position/speed control circuit (not shown). In positioning as well, the linear power amplifier continuously flows a small current to the driving coil 85 in correspondence with a command from a control circuit (not shown) such that the positional deviation of the stage 82 is eliminated at all times. That is, for both acceleration/deceleration and positioning, the identical power amplifier and driving coil 85 are used.

In the scan type exposure apparatus shown in FIG. 31, an illumination light beam is irradiated on the reticle on the reticle stage only in its elongated rectangular or arcuated region which is perpendicular to the scanning direction of the reticle stage 82. For this reason, when the entire reticle pattern is to be exposed on the wafer, both the reticle stage 82 and the wafer stage 103 must be scanned. The scanning operation is performed at a constant speed. The ratio of the speed of the reticle stage 82 to that of the wafer stage 103 during the scanning operation is made precisely equal the reduction magnification of the projection optical system 106. The positions of the reticle stage 82 and the wafer stage 103 are measured by laser interferometers (not shown) through the interferometer first reference 107 and the interferometer second reference 104, respectively, and fed back to a control system (not shown).

In the above arrangement, the wafer stage 103 and the reticle stage 82 are moved to initial positions and accelerated. The acceleration is controlled to converge such that, before the wafer stage 103 and the reticle stage 82 enter the region where the illumination light beam is irradiated, they attain a predetermined positional relationship, and the speed ratio becomes equal to the reduction magnification of the projection optical system 108. An exposure operation is performed while maintaining this state. When the wafer stage 103 and the reticle stage 82 leave the region where the illumination light beam is irradiated, they are appropriately decelerated.

FIG. 35 is a perspective view showing another conventional art. This system differs from that shown in FIG. 32 in the arrangement of the single-phase linear motor. More specifically, the movable unit of the linear motor shown in FIG. 35 comprises a short magnet 95 with its one pole opposing a coil 98, a fixed yoke 96 arranged over the entire stroke of the movable magnet 95 to circulate the magnetic fluxes of the magnet 95, and a single-phase coil wound on part of the fixed yoke 96 over the entire stroke of the magnet 95.

SUMMARY OF THE INVENTION

For semiconductor exposure apparatuses, requirements for micropatterning, an improvement of productivity, and an increase in diameter of a workpiece are becoming stronger year by year. To improve the productivity, the exposure time must be shortened, or movement and positioning of the workpiece must be performed at a high speed. For these purposes, the acceleration and deceleration of movement must be increased. Simultaneously, to achieve an increase in diameter of the workpiece, the stage becomes bulky, and the conveyance weight increases. Therefore, a heavier structure must be moved with at a larger acceleration, so that an actuator for producing a large thrust and a power amplifier for obtaining a high output power are necessary.

In the stage driving mechanism of a conventional scan type exposure apparatus, a linear motor stator is arranged to generate a predetermined magnetic field over the entire stroke of the scanning stage. To increase the thrust, the predetermined magnetic field is made stronger to be, e.g., about 5,000 G or more. As shown in FIG. 34, however, the magnetic field circulates in the yoke 86, and magnetic fluxes corresponding to the entire stroke are concentrated at the two end portions of the yoke. The yoke consists of a material such as iron having a high saturation magnetic flux density. To prevent saturation of the concentrated magnetic fluxes, the sectional area must be large. Consequently, the volume and mass of the yoke increase, resulting in an increase in size or weight of the apparatus as a whole.

To generate a predetermined magnetic field over the entire stroke of the scanning stage, a magnet having a predetermined thickness must be arranged over the entire stroke of the scanning stage. Since the predetermined magnetic field is required to be strong, an expensive rare-earth magnetic material must be used as the magnetic material. Therefore, the cost of the driving unit increases.

It is the first object of the present invention to provide a compact, lightweight, and inexpensive linear motor type driving mechanism (stage apparatus) which is particularly suitable for the reticle stage of a scan type exposure apparatus.

Conventionally, a linear power amplifier is used as a power amplifier for driving a linear motor. The power amplifier of this type has an excellent current response characteristic, though the amplifier itself generates a large heat, so a high output power can hardly be obtained.

A PWM (Pulse Width Modulation) amplifier for outputting a discontinuous rectangular voltage whose maximum value is constant is available as an efficient amplifier. The PWM amplifier changes the current amount by changing the width of the rectangular voltage. In a system using the PWM amplifier, the frequency of the basic rectangular wave is as high as about 20 kHz, so a current response can hardly be obtained at higher frequencies. For this reason, the control frequency in positioning or constant-speed control cannot be set high, and the servo gain cannot be set high, either. That is, in the conventional system using identical power amplifier and driving coils in acceleration/deceleration and positioning, a high output power and a high accuracy cannot be simultaneously realized.

The present invention has been made in consideration of the above conventional problem, and has as its second object to provide a driving mechanism (stage apparatus) which realizes both a high output power and a high accuracy.

In all of the conventional single-phase linear motors shown in FIGS. 32, 33, and 35, the movable coil 85 or the movable magnet 95 is fixed to the movable unit which is arranged to be slidable on the guide 81 in one direction. The movable unit is moved in one direction by flowing a current to the movable coil 85 or the fixed coil 98. In any case, the thickness of the fixed yoke 86 or 96 must be so large as to prevent saturation of the magnetic fluxes generated by the permanent magnet 87 or 95. However, when the thickness of the fixed yoke 86 or 96 is set to be a minimum thickness to prevent saturation of the magnetic fluxes generated by the permanent magnet 87 or 95, and a large current is flowed to the coil 85 or 98 to obtain a large thrust in acceleration/deceleration and increase the moving speed of the movable unit, the yoke is saturated by the magnetic fluxes generated according to the current, so no large thrust can be obtained. On the other hand, when the thickness of the yoke is increased to prevent saturation of the yoke with the magnetic fluxes according to the coil current, the entire thickness increases. That is, with the conventional arrangements, a thin yoke and a large thrust cannot be simultaneously realized.

It is the third object of the present invention to provide a linear motor which simultaneously realizes a thin yoke and a large thrust.

In order to achieve the above first object, according to the first aspect of the present invention, there is provided a stage apparatus comprising a stage movable in a predetermined direction, stage accelerating/decelerating thrust generation means arranged along the moving direction, stage speed control thrust generation means arranged to be parallel to the stage accelerating/decelerating thrust generation means, accelerating means for generating a stage accelerating thrust at a portion corresponding to a stage accelerating interval of the accelerating/decelerating thrust generation means, decelerating means for generating a stage decelerating thrust at a portion corresponding to a stage decelerating interval of the accelerating/decelerating thrust generation means, and speed control means for controlling a stage thrust generated by the speed control thrust generation means at least within a predetermined range between the accelerating interval and the decelerating interval.

In a preferred embodiment of the present invention, each of the accelerating/decelerating thrust generation means and the stage speed control thrust generation means comprises a linear motor whose movable unit has a magnet with its one pole opposing coils of a fixed unit, and the fixed unit comprises a yoke for applying a predetermined magnetic field to part of the coils in accordance with a position of the magnet over an entire stroke of the stage, and, as the coils, a single-phase speed control coil wound on the yoke and a plurality of polyphase accelerating/decelerating coils.

Alternatively, each of the accelerating/decelerating thrust generation means and the stage speed control thrust generation means comprises a linear motor whose movable unit has a magnet with its two poles opposing coils of a fixed unit and separated from each other by at least a maximum stroke distance of the stage, and the fixed unit comprises a yoke for applying a predetermined magnetic field to part of the coils in accordance with a position of the magnet over an entire stroke of the stage, and, as the coils, two sets of a single-phase speed control coil wound on the yoke and a plurality of polyphase accelerating/decelerating coils, which two sets of coils are separated from each other by a distance substantially equal to a pole-to-pole distance of the magnet.

The plurality of polyphase accelerating/decelerating coils may be wound on the single-phase speed control coil. The yoke may be constituted by a main yoke having a straight portion parallel to the moving direction of the stage and arranged at least over the entire stroke of the stage, and a side yoke having a straight portion parallel to the straight portion of the main yoke at least over the entire stroke of the stage and magnetically connected to the main yoke outside the stroke. One of the single-phase speed control coil and the accelerating/decelerating coils may be wound on the main yoke, and the other may be wound on the side yoke. In addition, two side yokes may be arranged on both sides of the main yoke. The single-phase speed control coil may be wound on the main yoke, and two sets of the plurality of polyphase accelerating/decelerating coils may be wound on the side yokes, respectively.

One set of the movable unit and the fixed unit of the linear motor is arranged on one side of the stage, or two sets thereof are arranged on both sides, respectively.

The accelerating means, the decelerating means, and the speed control means further comprise position detection means for detecting a position of the stage, command means for outputting a current command on the basis of a current position of the stage, which is detected by the position detection means, and a target position of the stage, a PWM accelerating power amplifier and a PWM decelerating power amplifier each of which outputs a current corresponding to the current command, switch means for connecting an output from the accelerating power amplifier to the accelerating/decelerating thrust generation means located in the stage accelerating interval and an output from the decelerating power amplifier to the accelerating/decelerating thrust generation means located in the stage decelerating interval, and a linear speed control power amplifier for outputting a current corresponding to the current command to drive the stage speed control thrust generation means.

In order to achieve the above second object, according to the second aspect of the present invention, there is provided a stage apparatus comprising position detection means for detecting a position of a stage, command means for outputting a current command on the basis of a current position of the stage, which is detected by the position detection means, and a target position of the stage, a power amplifier for outputting a current corresponding to the current command, and driving means for driving the stage in accordance with the current, wherein the power amplifier and the driving means comprise a first power amplifier of a PWM type, first driving means for driving the stage in accordance with an output current from the first power amplifier, a second power amplifier of a linear type, and second driving means for driving the stage in accordance with an output current from the second power amplifier, the first and second driving means being arranged to be parallel to each other.

In a preferred embodiment according to the second aspect, the stage apparatus further comprises means for selecting one of the first and second power amplifiers such that, in accelerating/decelerating the stage, the stage is driven through the first power amplifier, and in positioning and speed control of the stage, the stage is driven through the second power amplifier.

Each of the first and second driving means comprises a linear motor whose movable unit has accelerating/decelerating coils connected to the first power amplifier, and a positioning/speed control coil connected to the second power amplifier.

Each of the first and second driving means comprises a linear motor whose movable unit has a magnet with its one pole opposing coils of a fixed unit, the fixed unit has a yoke for applying a predetermined magnetic field to part of the coils over an entire stroke of the stage in accordance with the position of the magnet, and the coils comprise a single-phase speed control coil wound on the yoke and a plurality of polyphase accelerating/decelerating coils.

In such a case, the velocity control coil and the accelerating/decelerating coil may be wound by a way such as the first aspect way.

The second driving means comprises a linear motor having a coil fixed on the stage, and a magnet and a yoke for applying a magnetic field to the coil, and the first driving means comprises a screwing mechanism, and a power transmission unit for transmitting a power of the screwing mechanism to the stage.

Each of the first and second driving means comprises a linear motor whose movable unit has a heteropolar magnet unit and whose fixed unit has a plurality of flat coil units, and each of the flat coil units has an accelerating/decelerating coil connected to the first power amplifier and a positioning/speed control coil connected to the second power amplifier.

In order to achieve the above third object, according to the third aspect of the present invention, there is provided a linear motor comprising a single-phase coil, a first permanent magnet movable relative to the single-phase coil in an axial direction of the single-phase coil, a first yoke consisting of a ferromagnetic substance and extending through the single-phase coil in the axial direction, a second yoke consisting of a ferromagnetic substance and having, outside the single-phase coil, a portion arranged to be parallel to the first yoke, to form a closed magnetic circuit together with the first yoke and the first permanent magnet such that the closed magnetic circuit circulates magnetic fluxes from the first permanent magnet across a winding of the single-phase coil, and a second permanent magnet for connecting the first and the second yokes.

In a preferred embodiment according to the third aspect, the single-phase coil is movable, the first and second yokes are fixed yokes each having a straight portion over an entire stroke of the single-phase coil, the first permanent magnet is a magnet fixed to the straight portion of one of the first and second yokes and opposing, with its one pole, the single-phase coil over the entire stroke of the single-phase coil, and the second magnet connects the first and the second yokes outside the stroke.

The first permanent magnet is a movable magnet with its one pole opposing the single-phase coil, the first and second yokes are fixed yokes each having a straight portion over an entire stroke of the movable magnet, the single-phase coil is wound on the first yoke over the entire stroke of the movable magnet, and the second magnet connects the first and the second yokes outside the stroke.

The single-phase coil is used for speed control, and the motor further comprises a plurality of polyphase accelerating/decelerating coils each of which is shorter than the single-phase coil and wound to be parallel to the single-phase coil for speed control.

According to the arrangement of the first aspect, the accelerating/decelerating thrust generation means and the speed control thrust generation means are arranged to be parallel to each other. For example, in correspondence with the accelerating interval, the constant-speed traveling interval, and the decelerating interval of the stage, the stage is first accelerated to a desired speed at a portion corresponding to the accelerating interval of the accelerating/decelerating thrust generation means. The stage travels through the constant-speed traveling interval while the desired speed is maintained by the speed control thrust generation means. Subsequently, the stage is decelerated at a portion corresponding to the decelerating interval of the accelerating/decelerating thrust generation means and stopped. With this arrangement, in a scan type exposure apparatus using this driving mechanism as a reticle stage, the scan exposure operation can be performed within a minimum necessary distance by setting the accelerating, constant-speed traveling, and decelerating intervals in correspondence with the exposure field angle. The thrust generation means is constituted as a linear motor having a plurality of polyphase coils for generating an accelerating/decelerating thrust and a single-phase coil for generating a speed control thrust, and in acceleration/deceleration, some of the plurality of coils for generating the accelerating/ decelerating thrust are selected and driven. With this arrangement, a current which does not contribute to the stage thrust of the linear motor serving as the accelerating/ decelerating thrust generation means, and magnetic fluxes generated by this current can be reduced, so that the volume and weight of the yoke can be reduced. This results in a decrease in size and weight of the linear motor itself and the apparatus using the linear motor as a whole. The magnet need not be arranged over the entire stroke of the scanning stage and can be arranged only over the constant-speed traveling interval. Therefore, the expensive rare-earth magnetic material can be reduced to achieve cost reduction. Particularly, when the coils serving as the accelerating/ decelerating thrust generation means and the coil serving as the speed control thrust generation means are parallelly wound on the fixed yoke side, and a magnet with its one pole opposing these coils is incorporated in the movable unit, the size of the magnet can be largely reduced.

According to the arrangement of the second aspect of the present invention, the accelerating/decelerating thrust generation means (first driving means) and the positioning/ speed control thrust generation means (second driving means) are parallelly arranged in units of drive shafts of the stage of an exposure apparatus or the like. The PWM power amplifier is connected to the accelerating/decelerating thrust generation means. The linear power amplifier is connected to the positioning/speed control thrust generation means. In acceleration/deceleration, a high output power is generated by the PWM power amplifier to achieve high-speed movement. In positioning/speed control, a highly accurate positioning and constant-speed travel can be performed by the linear amplifier.

According to the arrangement of the third aspect of the present invention, in the single-phase linear motor constituted by the first permanent magnet, the single-phase coil, and the fixed yoke consisting of a ferromagnetic substance for circulating the magnetic fluxes from the permanent magnet, the second permanent magnet is arranged on part of the fixed yoke for circulating the magnetic fluxes of the magnet in series with the magnetic circuit for passing the magnetic fluxes of the magnet. The second permanent magnet is magnetized not to impede the magnetic fluxes of the first permanent magnet. With this arrangement, only the magnetic fluxes generated by the current flowed to the single-phase coil can be shielded. Therefore, according to this single-phase linear motor, the thickness of the yoke can be reduced, and a large thrust can be obtained.

This single-phase linear motor can be used as the accelerating/decelerating thrust generation means, the speed control thrust generation means, or the first or second driving means.

The driving mechanism of the present invention can be suitably used as the reticle stage of the scan type exposure apparatus as shown in FIG. 31.

BRIEF DESCRIPTION OF THE DRAWINGS

FIG. 2 is a partially cutaway perspective view of the driving mechanism shown in FIG. 1;

FIG. 3 is an exploded perspective view of the driving mechanism shown in FIG. 1;

FIGS. 5A and 5B are a control block diagram and a sectional view of a driving mechanism according to the second embodiment of the present invention, respectively;

FIGS. 19A and 19B are perspective views showing the outer appearance and arrangement of a driving mechanism according to the eighth embodiment of the present invention, respectively;

FIGS. 28A and 28B are a control block diagram and a sectional view of a driving mechanism according to the 12th embodiment of the present invention, respectively;

FIG. 29 is a flow chart showing the operation of a scan type exposure apparatus according to the 13th embodiment of the present invention;

DETAILED DESCRIPTION OF THE PREFERRED EMBODIMENTS

Figure 1:
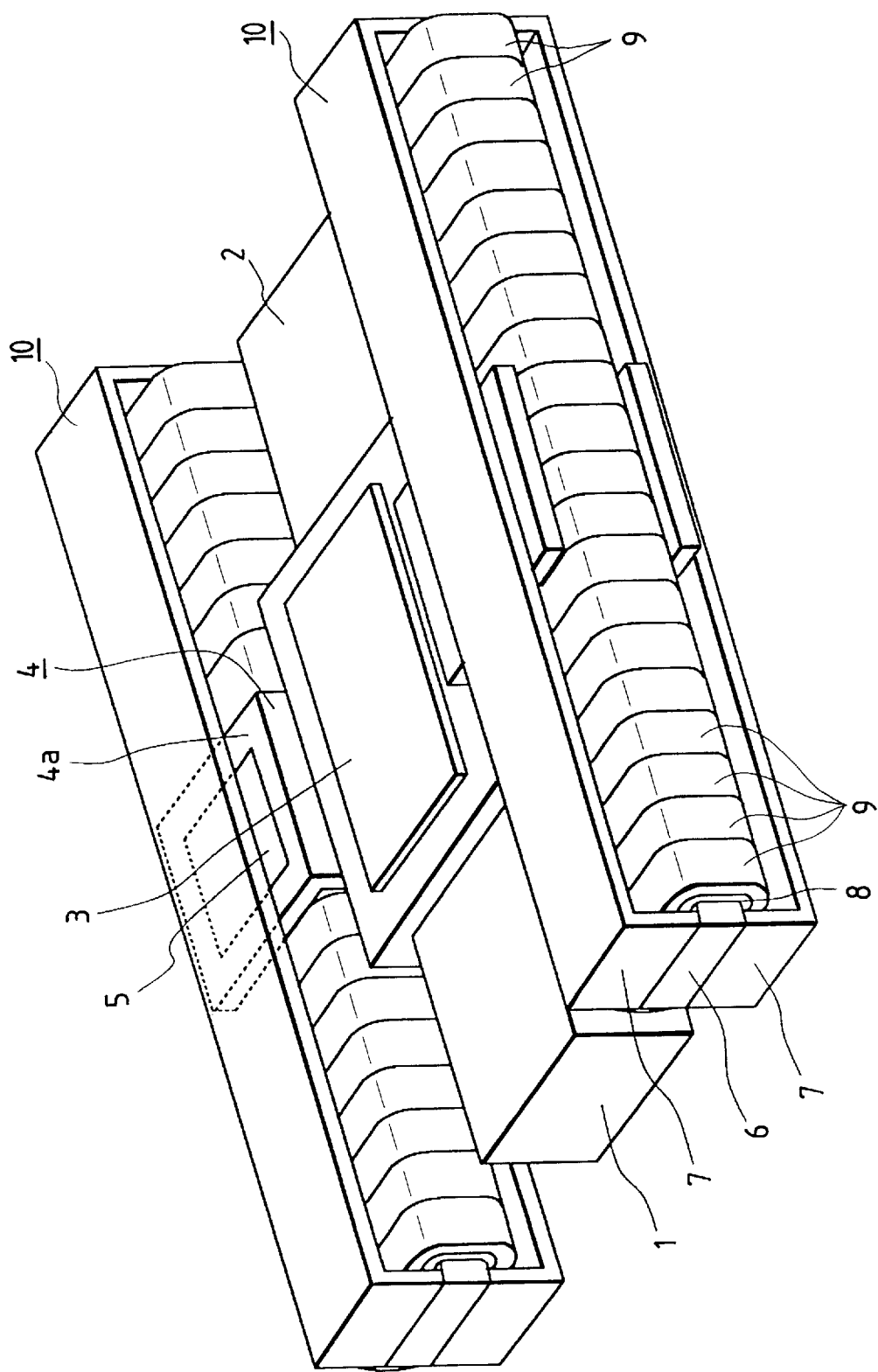
FIG. 1 is a perspective view showing the arrangement of a driving mechanism according to the first embodiment of the present invention.

FIGS. 1 to 3 are perspective views showing the arrangement of a reticle stage using a driving mechanism according to the first embodiment of the present invention. FIG. 1 is a perspective view showing the overall arrangement. FIG. 2 is a partially cutaway view of the yoke and coil portion. FIG. 3 is an exploded view showing a movable unit and a fixed unit, which are shifted from each other. In the reticle stage shown in FIGS. 1 to 3, a stage guide 1 is fixed on an anti-vibration base (not shown). A stage 2 is supported on the stage guide 1 through a lubricating means such as an air film to be slidable in the scanning direction. A reticle 3 is held on the stage 2. Magnet holding plates 4 each having a U-shaped section are fixed on both sides of the stage 2. Rectangular holes for receiving magnets are formed in horizontal portions 4a of the magnet holding plates 4, as shown in FIGS. 1 to 3. Magnets 5 are fitted in the rectangular holes and fixed. The stage 2, the reticle 3, the magnet holding plates 4, and the magnets 5 together constitute a movable unit.

A fixed unit is constituted by yoke/coil units 10 arranged on both sides of the movable unit. Each of the units 10 is formed by a center yoke 6, two side yokes 7, a single-phase speed control coil 8, and a plurality of accelerating and decelerating coils 9.

To construct each unit, first, the speed control coil 8 is wound on the center yoke 6 such that the dimension of the speed control coil 8 in the longitudinal direction almost equals the total length of the center yoke 6. The speed control coil 8 electrically has a single-phase structure. The accelerating and decelerating coil 9 is wound on the speed control coil 8 such that the dimension of the accelerating and decelerating coil 9 in the longitudinal direction is sufficiently smaller than that of the speed control coil 8. A plurality of accelerating and decelerating coils 9 are arranged along the longitudinal direction of the center yoke 6. The plurality of accelerating and decelerating coils 9 are constituted to be electrically independent. That is, current control in units of phases is possible.

The upper and lower side yokes 7 are fixed to sandwich the center yoke 6. The fixed unit and the movable unit are assembled such that the magnet 5 portions of each magnet holding plate 4 are inserted between the accelerating and decelerating coils 9 and the side yokes 7 in the yoke/coil unit 10 without contacting the accelerating and decelerating coils 9 and the side yokes 7.

Figures 4A, 4B, 4C:
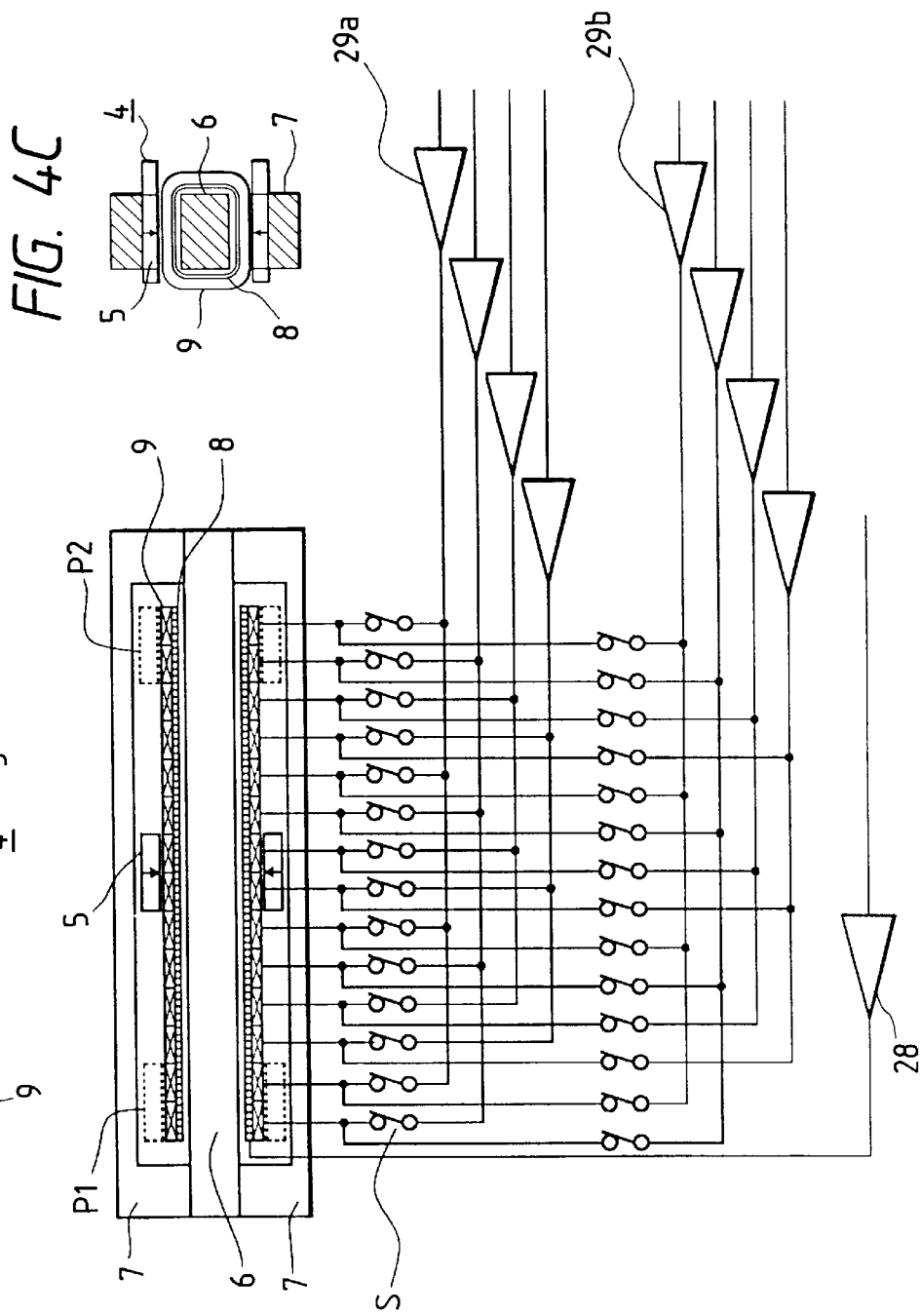
FIGS. 4A to 4C are views of the driving mechanism shown in FIG. 1.

The magnets 5 of the movable unit are magnetized in the direction of thickness (vertical direction), as indicated by arrows in FIGS. 4B and 4C. More specifically, the two magnets 5 attached to each magnet holding plate 4 are magnetized such that their N poles oppose each other, i.e., the N poles are directed to the center yoke 6.

With this arrangement, the magnetic fluxes generated from each magnet 5 enter the center yoke 6 and branch forward and backward in the longitudinal direction. The magnetic fluxes reach the two end portions (front and rear end portions) of the center yoke 6, branch upward and downward, and enter the side yokes 7. In each of the upper and lower side yokes 7, the magnetic fluxes flow from the front and rear end portions to a position where they oppose the magnet 5 (the central portion of the side yoke 7 in FIGS. 4A and 4B), and reach the S pole of the opposing magnet 5. A magnetic circuit is formed in the above manner. When a current is flowed to the speed control coil 8 in this state, the magnet 5 receives a force in the scanning direction (the longitudinal direction of the yokes 6 and 7) in accordance with the Fleming's rule. Similarly, when a current is flowed to the accelerating and decelerating coils 9 opposing the magnet 5, the magnet 5 receives a force in the scanning direction.

FIGS. 4A to 4C are views showing the connection state of the electrical system circuit of the driving circuit shown in FIGS. 1 to 3. As for the actuator (movable and fixed units) portion, only part of the movable unit and one side of the fixed unit are shown. FIG. 4A is a partially cutaway plan view of the one side portion of the actuator. FIG. 4B is a view showing the longitudinal section of the actuator portion and connection of the electrical system. FIG. 4C is a cross-sectional view at the magnet 5 portion. As shown in FIG. 4B, four accelerating drivers 29a, four decelerating drivers 29b, and a speed control driver 28 are provided as drivers. The accelerating or decelerating driver is divided into a plurality of units because the driver must have a margin in its capacity. If the driver has a sufficient margin, only one accelerating or decelerating driver suffices. One of the accelerating drivers 29a and one of the decelerating drivers 29b are parallelly connected to each accelerating and decelerating coil 9 through a switch means S.

The switch means S of each accelerating and decelerating coil 9 acts such that the coil is connected to neither the accelerating drivers 29a nor the decelerating drivers 29b, or the coil is connected to only one of them. That is, the coil is never connected to both the accelerating driver 29a and the decelerating driver 29b.

In this embodiment, four groups of the four-phase accelerating and decelerating coils are connected to the four accelerating drivers 29a or the four decelerating drivers 29b, respectively, through the switch means S. More specifically, the coils are sequentially assigned to the respective groups such that the coils of one group, which are located every four coils, can be connected to the corresponding one of the accelerating drivers 29a or decelerating drivers 29b. With this arrangement, the four accelerating and decelerating coils 9 continuously arranged to be adjacent to each other can be respectively connected to the four accelerating drivers 29a or decelerating drivers 29b independently of the positions of the coils at whichever these coils might be positioned.

FIG. 4B shows a start position P1 and a stop position P2 of the movable unit which is accelerated from one stroke end, travels at a constant speed, and is decelerated to the other stroke end. The switch means S are closed such that the four-phase coils 9 at the left end are connected to only the accelerating drivers 29a. The switch means S are also closed such that the four-phase coils 9 at the right end are connected to only the decelerating drivers 29b. The remaining accelerating and decelerating coils 9 are not connected to any drivers. The total length of the four-phase coils 9 in the scanning direction is designed to be larger than (magnet size+acceleration stroke+deceleration stroke). That is, acceleration ends with only four-phase coils. In other words, the coils are not switched during acceleration.

Figure 31:
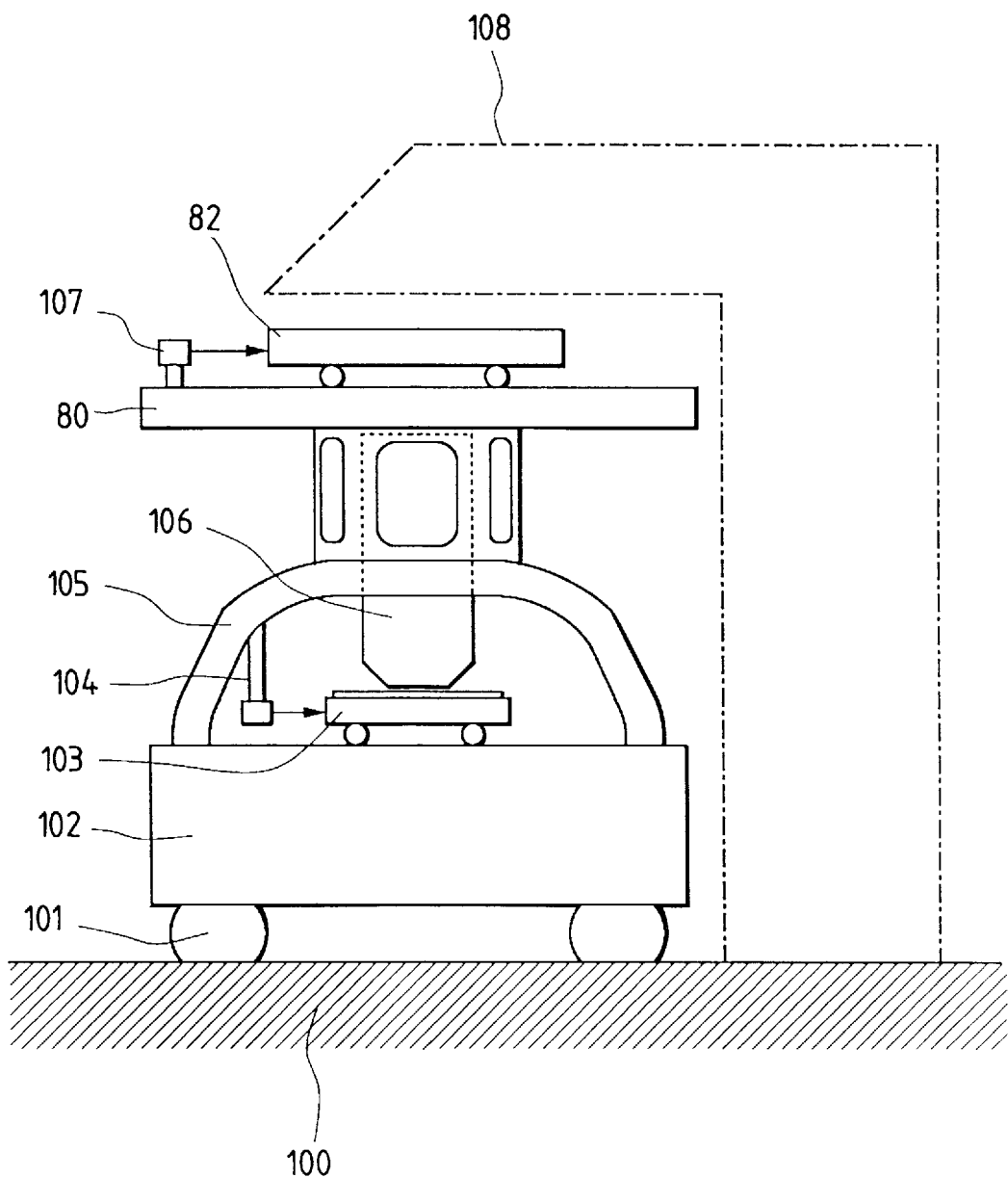
FIG. 31 is a view showing the overall arrangement of a conventional scan type exposure apparatus to which the present invention is applied.

The driving mechanism having the above arrangement is used as the reticle stage 82 of the scan type exposure apparatus shown in FIG. 31. Assuming that the wafer stage 103 and the reticle stage 82 are synchronously moved, only the function of the reticle stage 82 (reference numeral "2" in FIGS. 1 to 3) will be described below with reference to FIGS. 1 to 4C. First, the reticle stage 2 is set at the initial position. More specifically, a current in a predetermined direction is flowed to the speed control coil 8 to move the movable unit in one direction. At the timing of turning off an origin switch (not shown), an interferometer (not shown) for measuring the reticle stage position is reset. While referring to the measurement value of the interferometer, a current is flowed to the speed control coil 8, thereby moving the movable unit (the stage 2, the magnet holding plates 4, and the magnets 5, etc.) to the start position P1 in FIG. 4B. At the start position P1, positioning control is performed by the speed control coil 8.

In accordance with a command from a control system (not shown), a current is flowed to the four-phase coils 9 connected to the accelerating drivers 29a for acceleration, thereby accelerating the reticle stage 2. When the movable unit enters the exposure region, acceleration is stopped. Speed control is then performed by a control circuit (not shown) such that the movable unit is moved at a constant speed. At this time, the movable magnets 5 do not oppose the coils 9 connected to the accelerating drivers 29a, so that the correction force for speed control is obtained by interaction with the current flowed to the speed control coil 8 driven by the speed control driver 28. An exposure operation is performed at a constant speed. When the movable unit leaves the exposure region, the magnets 5 of the movable unit oppose the four-phase coils 9 connected to the decelerating drivers 29b. The movable unit is decelerated by the four-phase coils 9 and stopped at the stop position P2.

An example in which the movable unit is moved from one stroke end to the other stroke end has been described with reference to FIGS. 4A to 4C. However, when the exposure field angle is set to be small in the scan type exposure apparatus, the reticle stage moving time, i.e., the exposure time can be shortened by moving the reticle stage from an intermediate position to another intermediate position instead of moving the reticle stage from end to end, resulting in an improvement of productivity. In such a case, the switch means S are closed such that the accelerating and decelerating coils 9 corresponding to the intermediate start position or intermediate stop position are connected to the accelerating drivers 29a or decelerating drivers 29b. As in the case shown in FIGS. 4A to 4C, the scanning exposure operation may be performed after initial position setting is performed up to the "intermediate start position" by the speed control coil 8.

According to this embodiment, in either case, the switch means S are only switched in correspondence with the exposure field angle. Whether the coils 9 and the drivers 29a or 29b to be connected to the coils or not is determined in correspondence with the field angle. Therefore, unlike a general polyphase coil driving linear motor which selects driving coils while sensing the position of the movable unit, no complex driving sequence is needed.

In this embodiment, the length of the magnet 5 in the scanning direction corresponds to the length of the driving coil 85 of the conventional art (FIG. 32) in the scanning direction. Since only magnetic fluxes corresponding to the length pass through the yokes, the sectional areas of the yokes 6 and 7 can be made small. In addition, since only the coils 9 corresponding to the field angle are driven during acceleration/deceleration, though the accelerating and decelerating coils 9 are arranged all the way along the scanning direction, wasteful heat generation during acceleration/deceleration can be prevented. While speed control is performed, the speed control coil 8 arranged all the way along the scanning direction is driven, resulting in wasteful heat generation. However, the driving current in speed control is sufficiently smaller than the accelerating/decelerating current, i.e., the absolute value of the wasteful heat is sufficiently small, so no problem is posed.

In addition, since the accelerating and decelerating coils can be selected in correspondence with the exposure field angle, a change in exposure field angle can be flexibly coped with.

FIGS. 5A and 5B are views showing a reticle stage actuator according to the second embodiment of the present invention. FIG. 5A is a view showing the longitudinal section of the actuator and connection of the electrical system. FIG. 5B is a cross-sectional view at a magnet 5 portion. In this embodiment, a plurality of accelerating and decelerating coils 9, which are wound on the center yoke 6 in the first embodiment, are wound on upper and lower side yokes 7. Two sets of accelerating drivers and two sets of decelerating drivers are arranged accordingly. The movable unit consisting of a stage 2, magnet holding plates 4, and the magnets 5 has the same arrangement as that in the first embodiment except that the magnets 5 are made closer to the center yoke 6 by a distance corresponding to the thickness of the accelerating and decelerating coils 9.

As stated in the first embodiment, only the movement of the reticle stage 2 will be described. After the initial position of the reticle stage 2 is detected, a current is flowed to the driving coils to accelerate the reticle stage. When the shift between the center of gravity of the reticle stage and the position where the driving force is applied is represented by Δ, and the thrust for acceleration is represented by F, a moment corresponding to F*Δ acts on the reticle stage base and the main body to swing or deform the main body. In this embodiment, however, the amount of the current flowed to drivers 29a in synchronism with acceleration is made different for the upper and lower accelerating coils 9. As a result, a moment for offsetting or canceling the moment F*Δ is applied to the movable unit.

To control the current, an acceleration corresponding to the swing of the main body may be measured and changed in proportion to the current difference between the upper and lower drivers. Alternatively, the upper and lower drivers may be driven while maintaining a predetermined current difference, like open-loop control.

Acceleration is stopped in the exposure region, and speed control is performed by a control circuit (not shown) such that the movable unit moves at a constant speed. At this time, the movable magnets 5 do not oppose the coils 9 connected to the accelerating drivers 29a, so that the correction force for speed control is obtained by interaction with the current flowed to a speed control coil 8 driven by a speed control driver 28.

When the movable unit leaves the exposure region, the movable unit is decelerated by decelerating drivers 29b and stopped. At this time, the moment need not always be offset by forming a current difference between the upper and lower drivers 29b. Even when the main body swings, this moment need only be settled before the next synchronization. Positional information during acceleration/deceleration or constant-speed control is obtained by a position measurement means such as a laser interferometer (not shown).

In this embodiment, the same effect as in the first embodiment can be obtained, and additionally, the moment around the optical axis caused, during acceleration, by the shift between the center of gravity of the reticle stage 2 and the position where the driving force is applied can be offset. As a result, deformation of the main body or a disturbance acting on synchronization of the reticle and the wafer can be minimized.

An example in which the reactive moment during acceleration is offset by forming a current difference between the upper and lower accelerating and decelerating coils 9 has been described above, assuming that the number of turns of the accelerating and decelerating coils 9 wound on the upper side yoke 7 is the same as that on the lower side yoke 7. However, since the shift Δ of the point of application and the center of gravity of the movable unit with respect to the position of the optical axis is often known and unchanged, the number of turns of the accelerating and decelerating coils 9 may be made different for the upper and lower side yokes 7 in advance in correspondence with the shift Δ. With this arrangement, the reactive moment can be offset by supplying the same current to the upper and lower accelerating and decelerating coils 9. For this reason, only one group of accelerating drivers 29a and one group of decelerating drivers 29b suffice, as in the first embodiment, so that the arrangement can be simplified.

Figure 6:
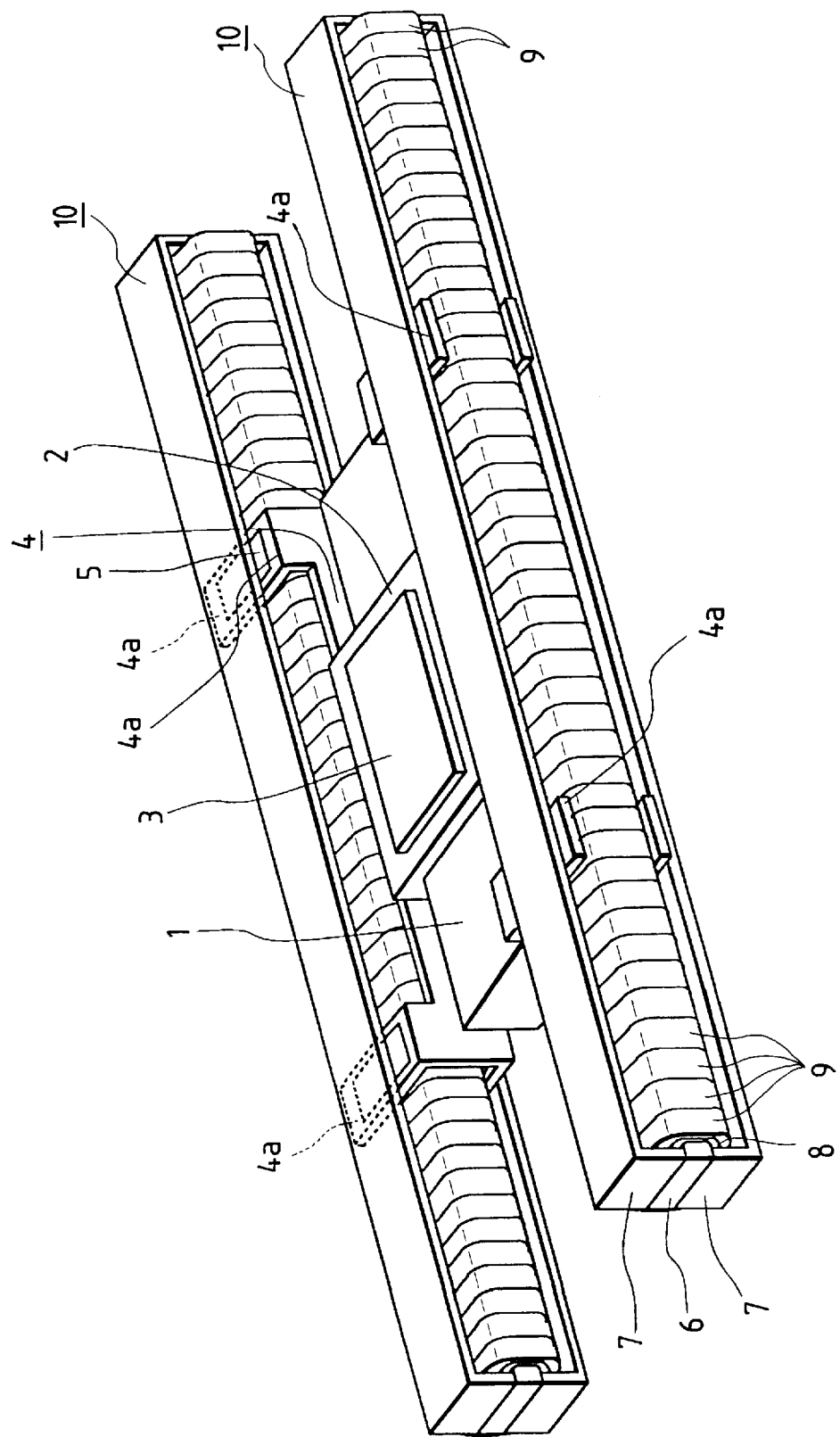
FIG. 6 is a perspective view showing the arrangement of a driving mechanism according to the third embodiment of the present invention.
Figure 7:
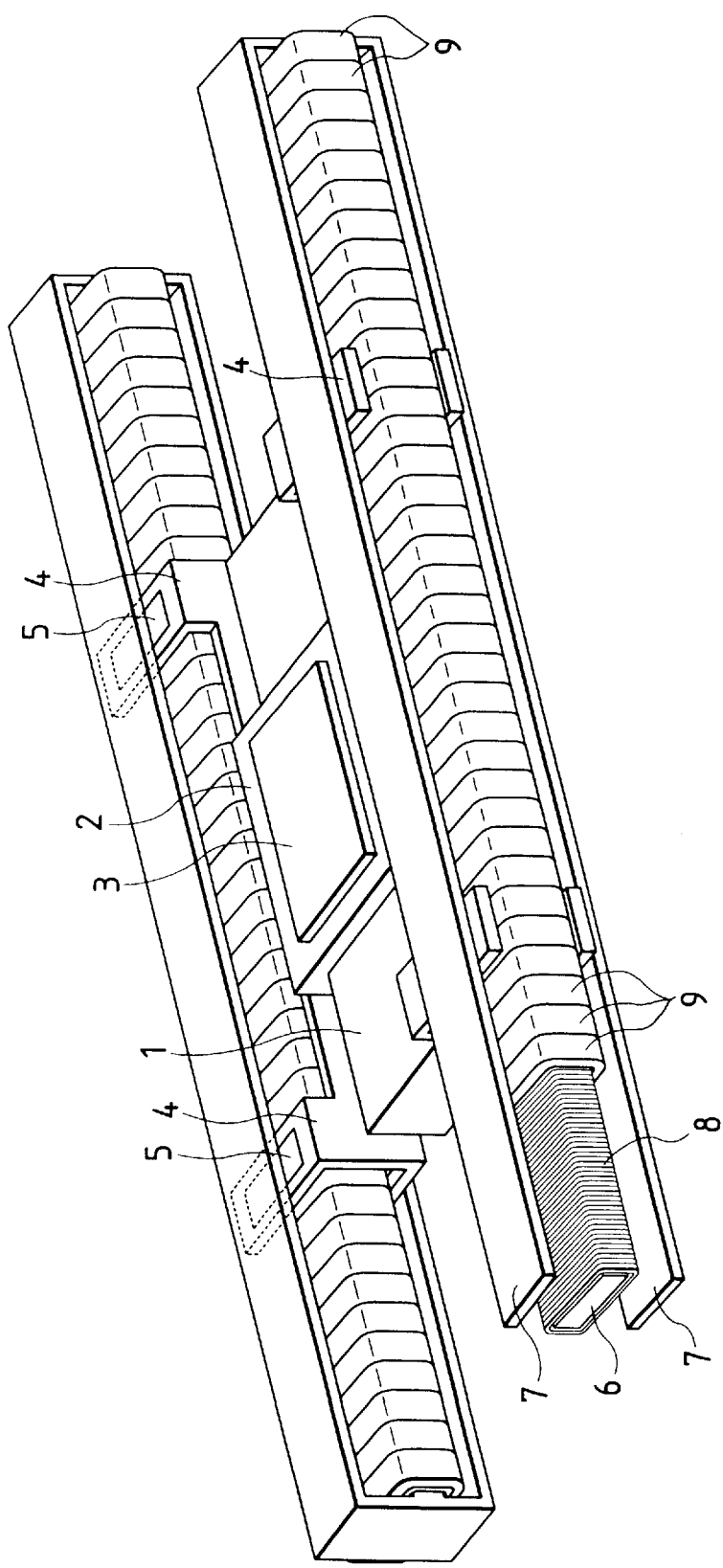
FIG. 7 is a partially cutaway perspective view of the driving mechanism shown in FIG. 6.
Figure 8:
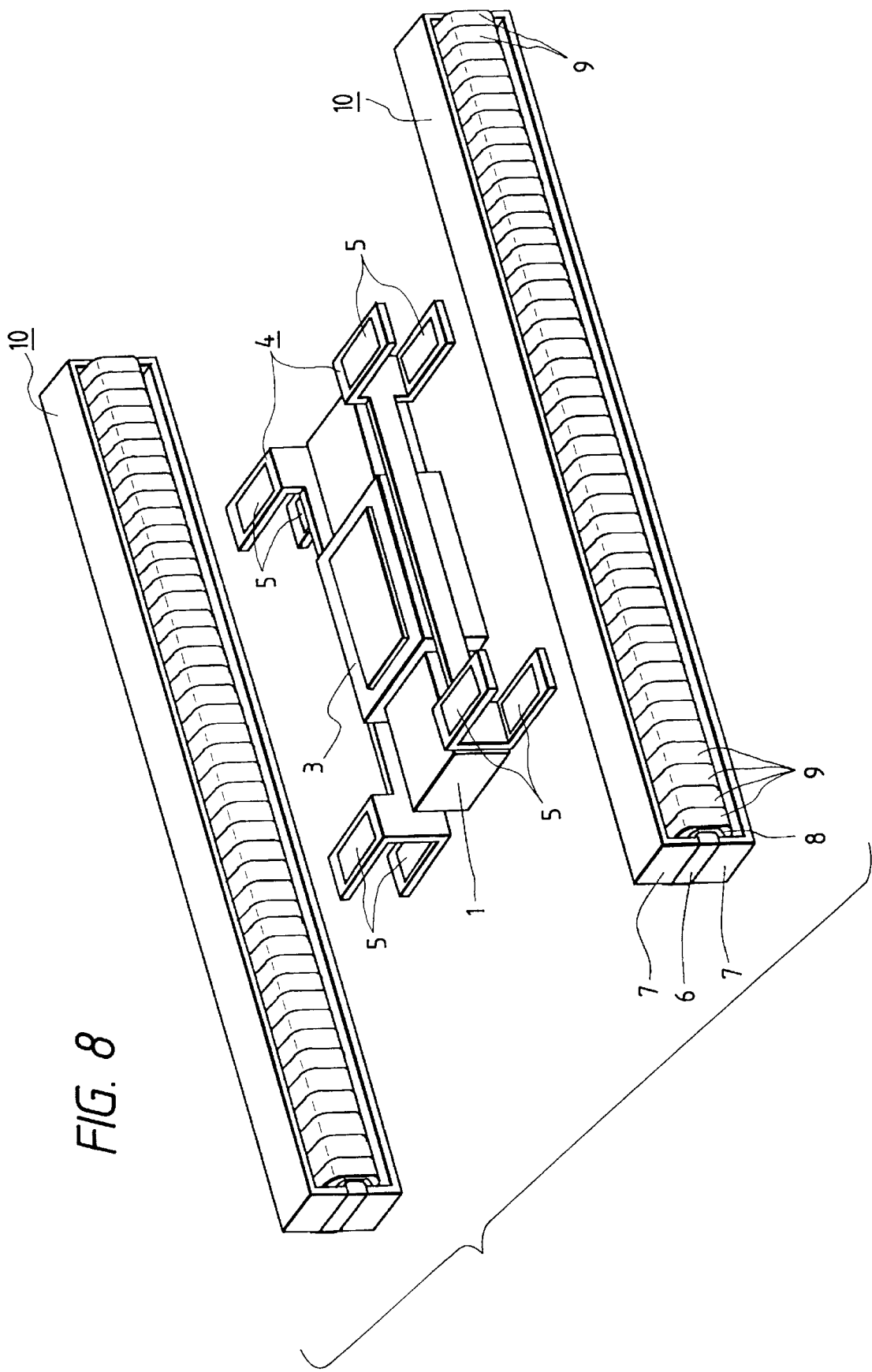
FIG. 8 is an exploded perspective view of the driving mechanism shown in FIG. 6.

FIGS. 6 to 8 are perspective views showing the arrangement of a reticle stage according to the third embodiment of the present invention. FIG. 6 is a perspective view showing the overall arrangement. FIG. 7 is a partially cutaway view of the yoke and coil portion. FIG. 8 is an exploded view showing a movable unit and a fixed unit, which are shifted from each other. In the reticle stage shown in FIGS. 6 to 8, a stage guide (not shown) is fixed on an anti-vibration base (not shown). A stage 2 is supported on the stage guide through a lubricating means such as an air film to be slidable in the scanning direction. A reticle 3 is held on the stage 2. Magnet holding plates 4 each having a U-shaped section and a narrow central portion are fixed on both sides of the stage 2. Rectangular holes for receiving magnets are formed in four horizontal portions 4a at the front and rear ends of each magnet holding plate 4, as shown in FIGS. 6 to 8. Four magnets 5 are fitted in the rectangular holes and fixed. The distance between the magnet 5 at the front end and that at the rear end of each magnet holding plate 4 is set to be larger than the maximum stroke of the stage 2. The stage 2, the reticle 3, the magnet holding plates 4, and the magnets 5 constitute a movable unit.

A fixed unit is constituted by yoke/coil units 10 arranged on both sides of the movable unit. Each of the units 10 is formed by a center yoke 6, two side yokes 7, a single-phase speed control coil 8, and a plurality of accelerating and decelerating coils 9.

To construct each unit, first, the speed control coil 8 is wound on the center yoke 6 such that the dimension of the speed control coil 8 in the longitudinal direction almost equals the total length of the center yoke 6. The speed control coil 8 electrically has a single-phase structure. The speed control coil 8 is mechanically constituted by two coils whose boundary corresponds to the center of the speed control coil 8. These coils are formed such that currents in the opposite directions are flowed around the center yoke 6. The speed control coil 8 may be constituted by, e.g., series-connecting two coils having opposite winding directions.

The accelerating and decelerating coil 9 is wound on the speed control coil 8 such that the dimension of the accelerating and decelerating coil 9 in the longitudinal direction is sufficiently smaller than that of the speed control coil 8. A plurality of accelerating and decelerating coils 9 are arranged along the longitudinal direction of the center yoke 6. The plurality of accelerating and decelerating coils 9 are constituted to be electrically independent. That is, current control in units of phases is possible. Two accelerating and decelerating coils 9, which are separated by the distance between the two front magnets 5 and the two rear magnets 5 of the four magnets 5 provided on the magnet holding plate 4, are series-connected. These two coils are constituted such that currents in the opposite directions are flowed around the center yoke 6.

The upper and lower side yokes 7 are fixed to sandwich the center yoke 6. The fixed unit and the movable unit are assembled such that the magnet 5 portions of each magnet holding plate 4 are inserted between the accelerating and decelerating coils 9 and the side yokes 7 of the yoke/coil unit 10 without contacting the accelerating and decelerating coils 9 and the side yokes 7.

Figure 9:
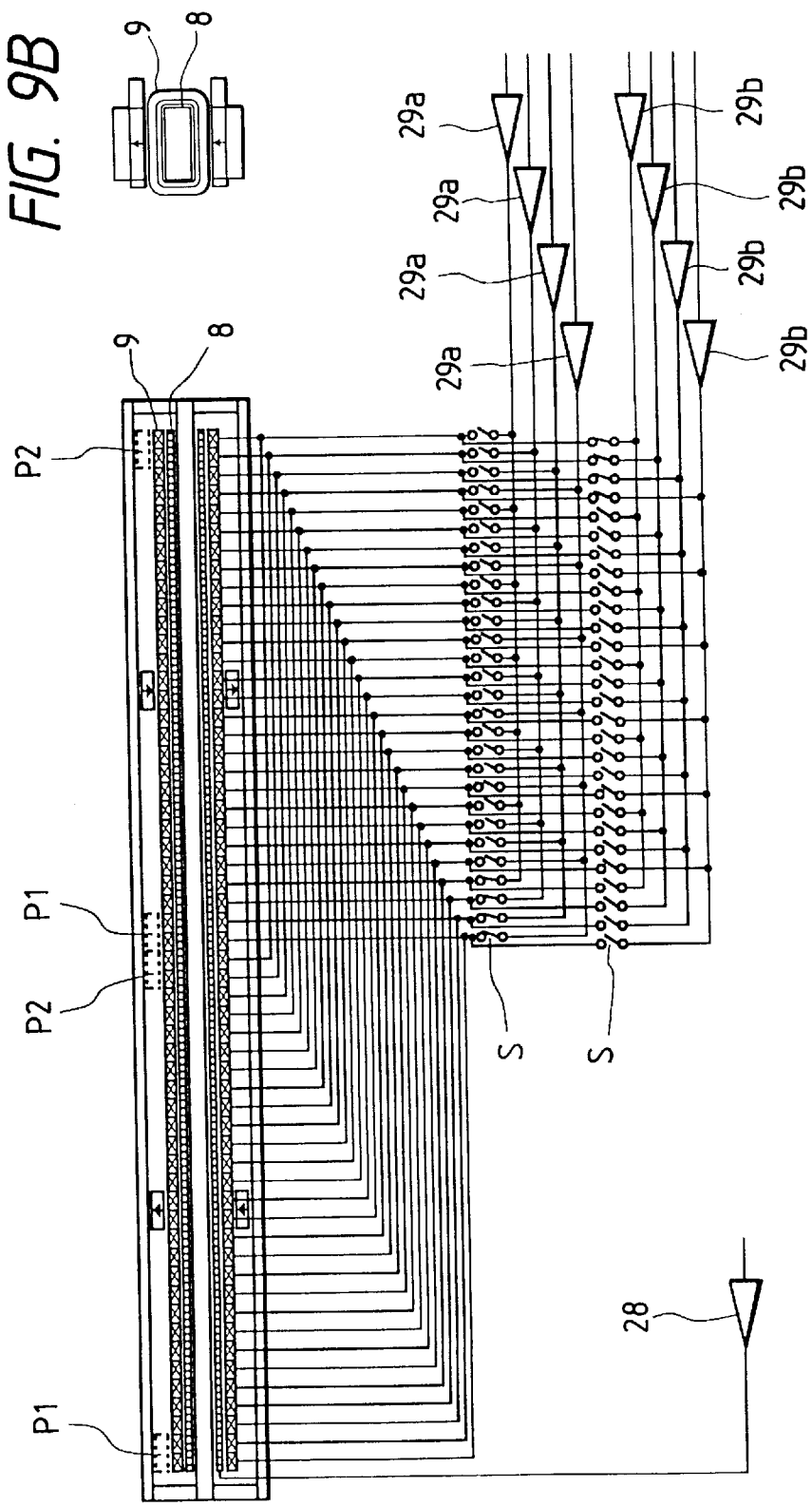
FIGS. 9A and 9B are views of the driving mechanism shown in FIG. 6.

The magnets 5 of the movable unit are magnetized in the direction of thickness (vertical direction), as indicated by arrows in FIGS. 9A and 9B. More specifically, the two front magnets 5 attached to each magnet holding plate 4 are magnetized such that their N poles oppose each other, i.e., the N poles are directed to the center yoke 6. The two rear magnets 5 are magnetized such that their S poles oppose each other, i.e., the S poles are directed to the center yoke 6.

With this arrangement, the magnetic fluxes generated from the N pole of each front magnet 5 enter the center yoke 6, flow to a position where they oppose the rear magnet 5, and reach the S pole of the opposing rear magnet 5. The magnetic fluxes generated from the N pole of the rear magnet 5 enter the side yoke 7, flow to a position where they oppose the front magnet 5, and reach the S pole of the opposing front magnet 5. A magnetic circuit is formed in the above manner. When a current is flowed to the speed control coil 8 in this state, the front and rear magnets 5 receive a force in the scanning direction (the longitudinal direction of the yokes 6 and 7) in accordance with the Fleming's rule. Similarly, when a current is flowed to the accelerating and decelerating coils 9 opposing the front and rear magnets 5, the magnets 5 receive a force in the scanning direction.

FIGS. 9A and 9B are views showing the connection state of the electrical system circuit of the driving mechanism shown in FIGS. 6 to 8. As for the actuator (movable and fixed units) portion, only part of the movable unit and one side of the fixed unit are shown. FIG. 9A is a view showing the longitudinal section of and connection of the electrical system. FIG. 9B is a cross-sectional view at the magnet 5 portion. As shown in FIG. 9A, four accelerating drivers 29a, four decelerating drivers 29b, and a speed control driver 28 are provided as driving drivers. The accelerating or decelerating driver is divided into a plurality of units because the driver must have a margin in its capacity. If the driver has a sufficient margin, only one accelerating or decelerating driver suffices. One of the accelerating drivers 29a and one of the decelerating drivers 29b are parallelly connected to each accelerating and decelerating coil 9 through a switch means S.

The switch means S of the pair of accelerating and decelerating coils 9, which are constituted to flow currents in the opposite directions about the center yokes 6, act such that each coil is connected to neither the accelerating drivers 29a nor the decelerating drivers 29b, or each coil is connected to only one of them. That is, the coil is never connected to both the accelerating driver 29a and the decelerating driver 29b.

In this embodiment, the four-phase accelerating or decelerating coils are selected and connected to the four accelerating drivers 29a or decelerating drivers 29b through the switch means S. When viewed from the accelerating drivers 29a or the decelerating drivers 29b side, the coils 9 which are located every four coils can be connected to the corresponding one of the accelerating drivers 29a or decelerating drivers 29b through the switch means S. With this arrangement, the four accelerating and decelerating coils 9 continuously arranged to be adjacent to each other can be respectively connected to the four accelerating drivers 29a or decelerating drivers 29b independently of the positions of the coils.

FIG. 9A shows a start position P1 and a stop position P2 of the movable unit which is accelerated from one stroke end, travels at a constant speed, and is decelerated to the other stroke end. The switch means S are closed such that the four-phase coils 9 at the left end are connected to only the accelerating drivers 29a. The switch means S are also closed such that the four-phase coils 9 at the right end are connected to only the decelerating drivers 29b. The remaining accelerating and decelerating coils 9 are not connected to the drivers. The total length of the four-phase coils 9 in the scanning direction is designed to be larger than (magnet size+acceleration stroke+deceleration stroke). That is, acceleration ends with only the four-phase coils. In other words, the coils are not switched during acceleration.

The driving mechanism having the above arrangement is used as the reticle stage 82 of the scan type exposure apparatus shown in FIG. 31. Assuming that the wafer stage 103 and the reticle stage 82 are synchronously moved, only the function of the reticle stage 82 (reference numeral "2" in FIGS. 6 to 8) will be described below with reference to FIGS. 6 to 9B. First, the reticle stage 2 is set at the initial position. More specifically, a current in a predetermined direction is flowed to the speed control coil 8 to move the movable unit in one direction. At the timing of turning off an origin switch (not shown), an interferometer (not shown) for measuring the reticle stage position is reset. While referring to the measurement value of the interferometer, a current is flowed to the speed control coil 8, thereby moving the movable unit (the stage 2, the magnet holding plates 4, and the magnets 5) to the start position P1 in FIG. 9A. At the start position P1, positioning control is performed by the speed control coil 8.

In accordance with a command from a control system (not shown), a current is flowed to the four-phase coils 9 connected to the accelerating drivers 29a for acceleration, thereby accelerating the reticle stage 2. When the movable unit enters the exposure region, acceleration is stopped. Speed control is performed by a control circuit (not shown) such that the movable unit is moved at a constant speed. At this time, the movable magnets 5 do not oppose the coils 9 connected to the accelerating drivers 29a, so that the correction force for speed control is obtained by interaction with the current flowed to the speed control coil 8 driven by the speed control driver 28. An exposure operation is performed at a constant speed. When the movable unit leaves the exposure region, the magnets 5 of the movable unit oppose the four-phase coils 9 connected to the decelerating drivers 29b. The movable unit is decelerated by the four-phase coils 9 and stopped at the stop position P2.

An example in which the movable unit is moved from one stroke end to the other stroke end has been described with reference to FIGS. 9A and 9B. However, when the exposure field angle is set to be small in the scan type exposure apparatus, the reticle stage moving time, i.e., the exposure time can be shortened by moving the reticle stage from an intermediate position to another intermediate position instead of moving the reticle stage from end to end, resulting in an improvement of productivity. In this case, the switch means S are closed such that the accelerating and decelerating coils 9 corresponding to the intermediate start position or intermediate stop position are connected to the accelerating drivers 29a or decelerating drivers 29b. As in the case shown in FIGS. 9A and 9B, the scanning exposure operation may be performed after initial position setting is performed up to the "intermediate start position" by the speed control coil 8.

According to this embodiment, in either case, the switch means S are only switched in correspondence with the exposure field angle. The coils 9 and the drivers 29a or 29b to be connected to the coils are determined in correspondence with the field angle. Therefore, unlike a general polyphase coil driving linear motor which selects driving coils while sensing the position of the movable unit, no complex driving sequence is needed.

In this embodiment, the length of the magnet 5 in the scanning direction corresponds to the length of the driving coil 85 of the prior art (FIG. 32) in the scanning direction. Since only magnetic fluxes corresponding to the length pass through the yokes, the sectional areas of the yokes 6 and 7 can be made small. In addition, since only the coils 9 corresponding to the field angle are driven during acceleration/deceleration, though the accelerating and decelerating coils 9 are arranged all the way along the scanning direction, wasteful heat generation during acceleration/deceleration can be prevented. While speed control is performed, the speed control coil 8 arranged all the way of the scanning direction is driven, resulting in wasteful heat generation. However, the driving current in speed control is sufficiently smaller than the accelerating/decelerating current, i.e., the absolute value of the wasteful heat is sufficiently small, so no problem is posed.

In addition, since the accelerating and decelerating coils can be selected in correspondence with the exposure field angle, a change in exposure field angle can be flexibly coped with.

Figure 10:
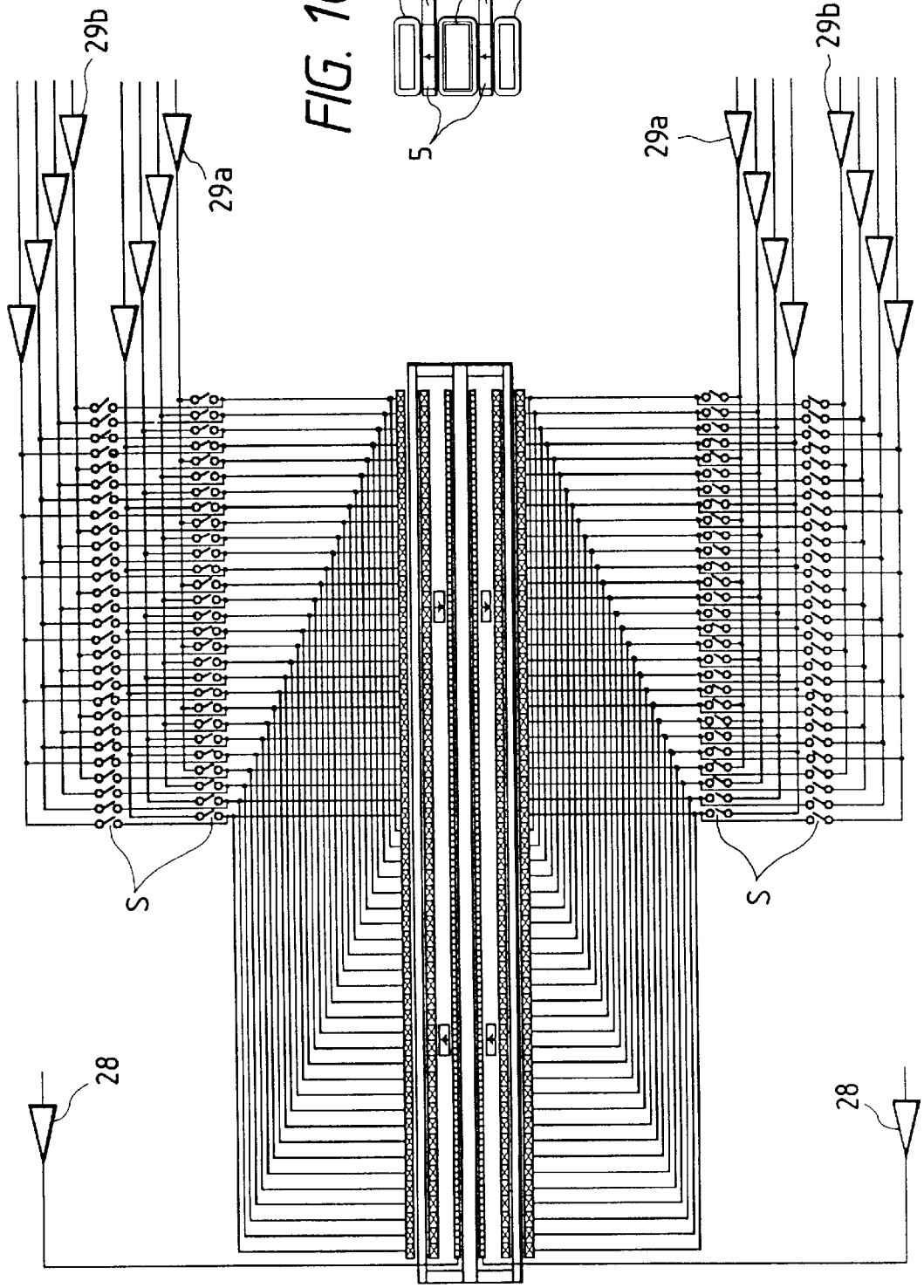
FIGS. 10A and 10B are a control block diagram and a sectional view of a driving mechanism according to the fourth embodiment of the present invention, respectively.

FIGS. 10A and 10B are views showing a reticle stage actuator according to the fourth embodiment of the present invention. FIG. 10A is a view showing the longitudinal section of the actuator and connection of the electrical system. FIG. 10B is a cross-sectional view at a magnet 5 portion. In this embodiment, a plurality of accelerating and decelerating coils 9, which are wound on the center yoke 6 in the third embodiment, are wound on upper and lower side yokes 7. Two sets of accelerating drivers and two sets of decelerating drivers are arranged accordingly. The movable unit consisting of a stage 2, magnet holding plates 4, and the magnets 5 has the same arrangement as that in the third embodiment except that the magnets 5 are made closer to the center yoke 6 by a distance corresponding to the thickness of the accelerating and decelerating coils 9.

As in the third embodiment, only the movement of the reticle stage 2 will be described. After the initial position of the reticle stage 2 is detected, a current is flowed to the driving coils 9 to accelerate the reticle stage 2. When the shift between the center of gravity of the reticle stage 2 and the position where the driving force is applied is represented by $\Delta$, and the thrust for acceleration is represented by F, a moment corresponding to F*$\Delta$ acts on the reticle stage base and the main body to swing or deform the main body. In this embodiment, however, the amount of the current flowed to drivers 29a in synchronism with acceleration is made different for the upper and lower accelerating coils 9. As a result, a moment for offsetting the moment F*$\Delta$ is applied to the movable unit.

To control the current, an acceleration corresponding to the swing of the main body may be measured and changed in proportion to the current difference between the upper and lower drivers. Alternatively, the upper and lower drivers may be driven while maintaining a predetermined current difference, like open-loop control.

Acceleration is stopped in the exposure region, and speed control is performed by a control circuit (not shown) such that the movable unit is moved at a constant speed. At this time, the movable magnets 5 do not oppose the coils 9 connected to the accelerating drivers 29a, so that the correction force for speed control is obtained by interaction with the current flowed to a speed control coil 8 driven by a speed control driver 28.

When the movable unit leaves the exposure region, the movable unit is decelerated by decelerating drivers 29b and stopped. At this time, the moment need not always be offset by forming a current difference between the upper and lower drivers 29b. Even when the main body swings, this moment need only be settled before the next synchronization. Positional information during acceleration/deceleration or constant-speed control is obtained by a position measurement means such as a laser interferometer (not shown).

In this embodiment, the same effect as in the third embodiment can be obtained, and additionally, the moment around the optical axis caused, during acceleration, by the shift between the center of gravity of the reticle stage 2 and the position where the driving force is applied can be offset. As a result, deformation of the main body or a disturbance acting on synchronization of the reticle and the wafer can be minimized.

An example in which the reactive moment during acceleration is offset by forming a current difference between the upper and lower accelerating and decelerating coils 9 has been described above, assuming that the number of turns of the accelerating and decelerating coils 9 wound on the upper side yoke 7 is the same as that on the lower side yoke 7. However, since the shift $\Delta$ of the point of application and the center of gravity of the movable unit with respect to the position of the optical axis is often known and unchanged, the number of turns of the accelerating and decelerating coils 9 may be made different for the upper and lower side yokes 7 in advance in correspondence with the shift $\Delta$. With this arrangement, the reactive moment can be offset by supplying the same current to the upper and lower accelerating and decelerating coils 9. For this reason, only one group of accelerating drivers 29a and one group of decelerating drivers 29b suffice, as in the first embodiment, so that the arrangement can be simplified.

Figure 11:
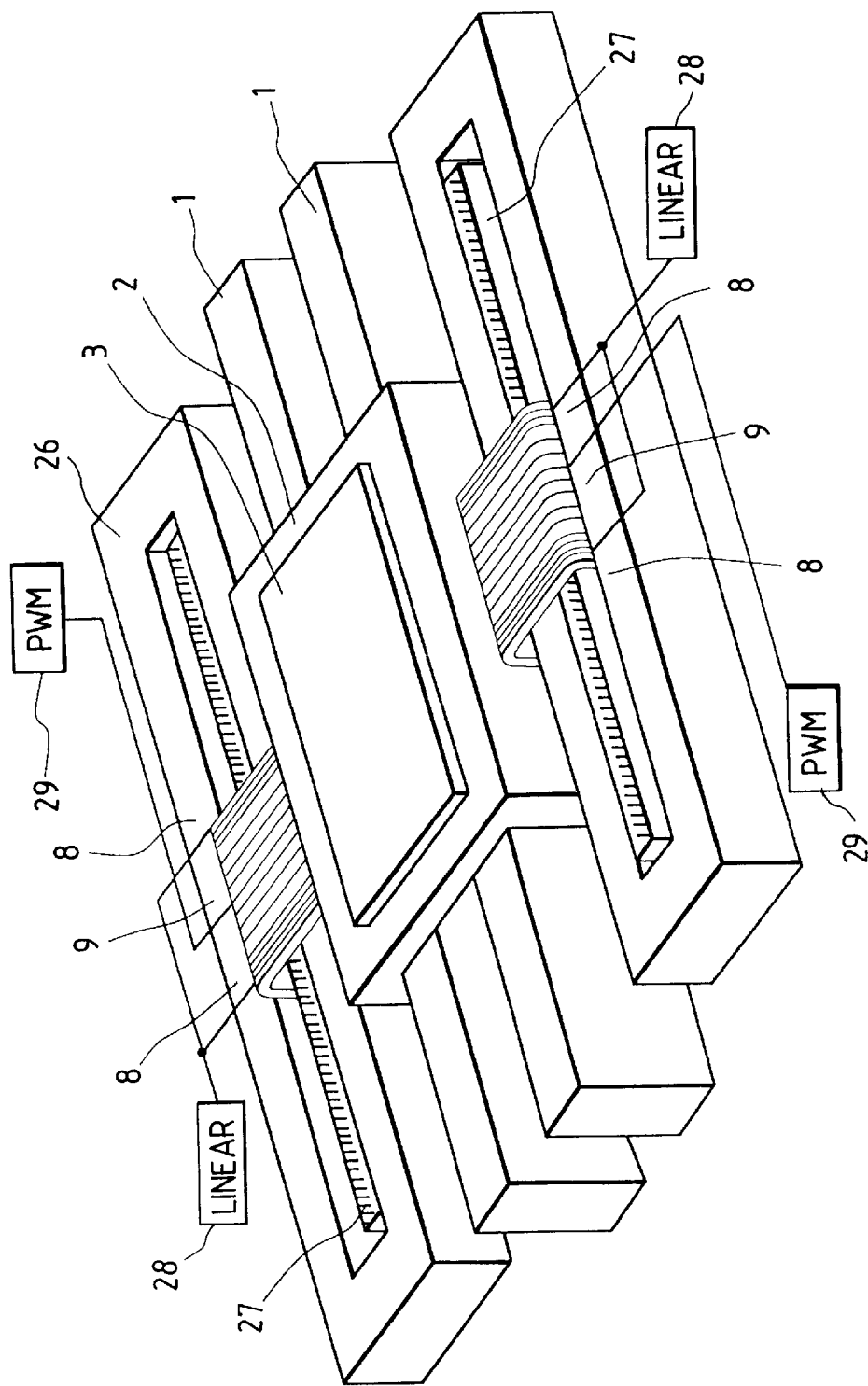
FIG. 11 is a perspective view showing the arrangement of a driving mechanism according to the fifth embodiment of the present invention.

FIG. 11 is a perspective view showing the arrangement of a driving mechanism according to the fifth embodiment of the present invention. As shown in FIG. 11, in this mechanism, a guide 1 is fixed on a base (not shown), and a stage 2 is supported on the guide 1 through a lubricating means such as an air film to be slidable in the scanning direction. A workpiece 3 is held on the stage 2. Driving coils are fixed on both the sides of the stage 2. Each driving coil comprises positioning/speed control coils 8 arranged at the front and rear ends, and accelerating and decelerating coils 9 arranged between the positioning/speed control coils 8. The front and rear positioning/speed control coils 8 are connected to be electrically in phase, so that each driving coil has a two-phase structure. A linear motor stator constituted by a yoke 26 and a magnet 27 is arranged over the entire stroke of the stage 2 to apply a predetermined magnetic field to part of the driving coil. The magnet 27 is magnetized such that the surface contacting the yoke 26 becomes an S pole, and the opposing surface opposing the driving coils 8 and 9 becomes an N pole. The linear motor stator is fixed on the base (not shown). Power amplifiers are connected to the driving coils. A PWM amplifier 29 is connected to the accelerating and decelerating coils 9 to generate a high output power. A linear amplifier 28 is connected to the positioning/speed control coils 8 to respond to a current command up to high frequencies. The position of the stage 2 is measured by a laser interferometer (not shown) and fed back to a position/speed control circuit (not shown).

The function of this arrangement will be described below with reference to the control block diagram in FIG. 12. When a position command is output from a control apparatus 31, an error between the position command and a position signal measured by the laser interferometer is calculated and time-serially input to an arithmetic circuit 32. The arithmetic circuit 32 performs various filter calculations for this positional error signal to output a current command. The current command is input to both the PWM amplifier 29 and the linear amplifier 28. During acceleration/deceleration, a large value is input as the current command. However, the input value to the linear amplifier 28 is limited by a clamp circuit 34 inserted in its input stage not to exceed a predetermined value, so that only a current corresponding to the limited maximum value is flowed. On the other hand, the PWM amplifier 29 flows a current corresponding to the command value. That is, during acceleration/deceleration, the thrust is applied mainly by the PWM amplifier 29.

When movement by acceleration/deceleration is completed, and a positioning operation is started, a small current command value is output as a signal at a relatively high frequency. More specifically, the servo gain of the arithmetic circuit 32 is set to be high to obtain a high accuracy. When the positioning operations is started, the stage 2 moves to the target position while oscillating with small displacements at a relatively high frequency by an electrical spring constituted by the servo system. This current command is also input to both the PWM amplifier 29 and the linear amplifier 28. The PWM amplifier 29 can hardly respond to the input signal at a relatively high frequency, so a desired control current cannot be flowed to the coils. At the worst, an undesired disturbance may be generated by flowing a current having a distorted waveform with respect to the input waveform. Therefore, in this embodiment, a low-pass filter 33 is inserted to the input stage of the PWM amplifier 29 to shield a current command at a relatively high frequency for positioning.

On the linear amplifier 28 side, the small current command value passes through the clamp circuit 34 without being clamped and is input to the linear amplifier 28. The linear amplifier 28 flows a current waveform corresponding to the waveform of the current command to the positioning/speed control coils 8. That is, during positioning/speed control, a thrust is applied mainly by the linear amplifier 28, so that a high positioning accuracy can be achieved.

Figure 13:
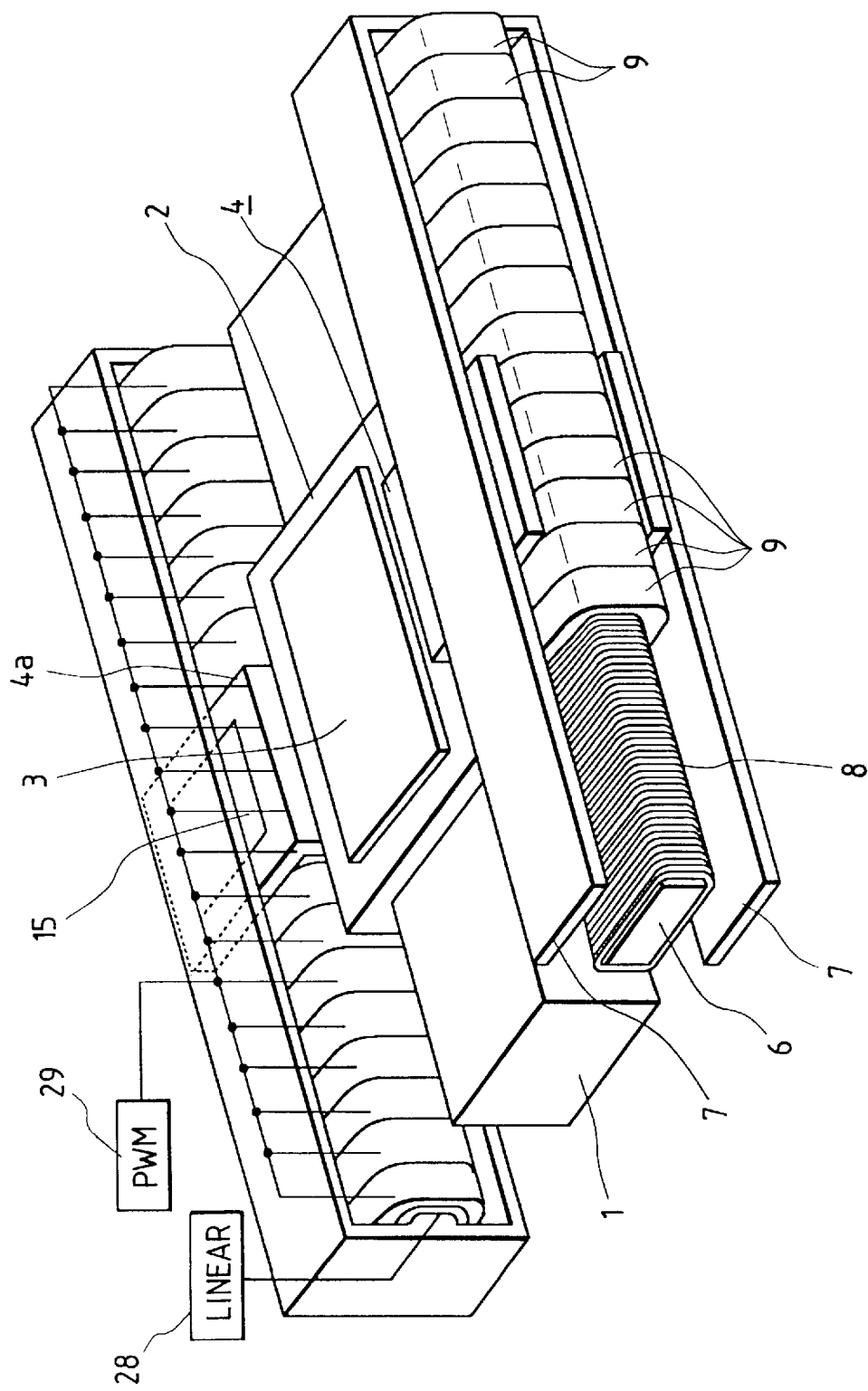
FIG. 13 is a perspective view showing the outer appearance of a driving mechanism according to the sixth embodiment of the present invention.
Figure 14:
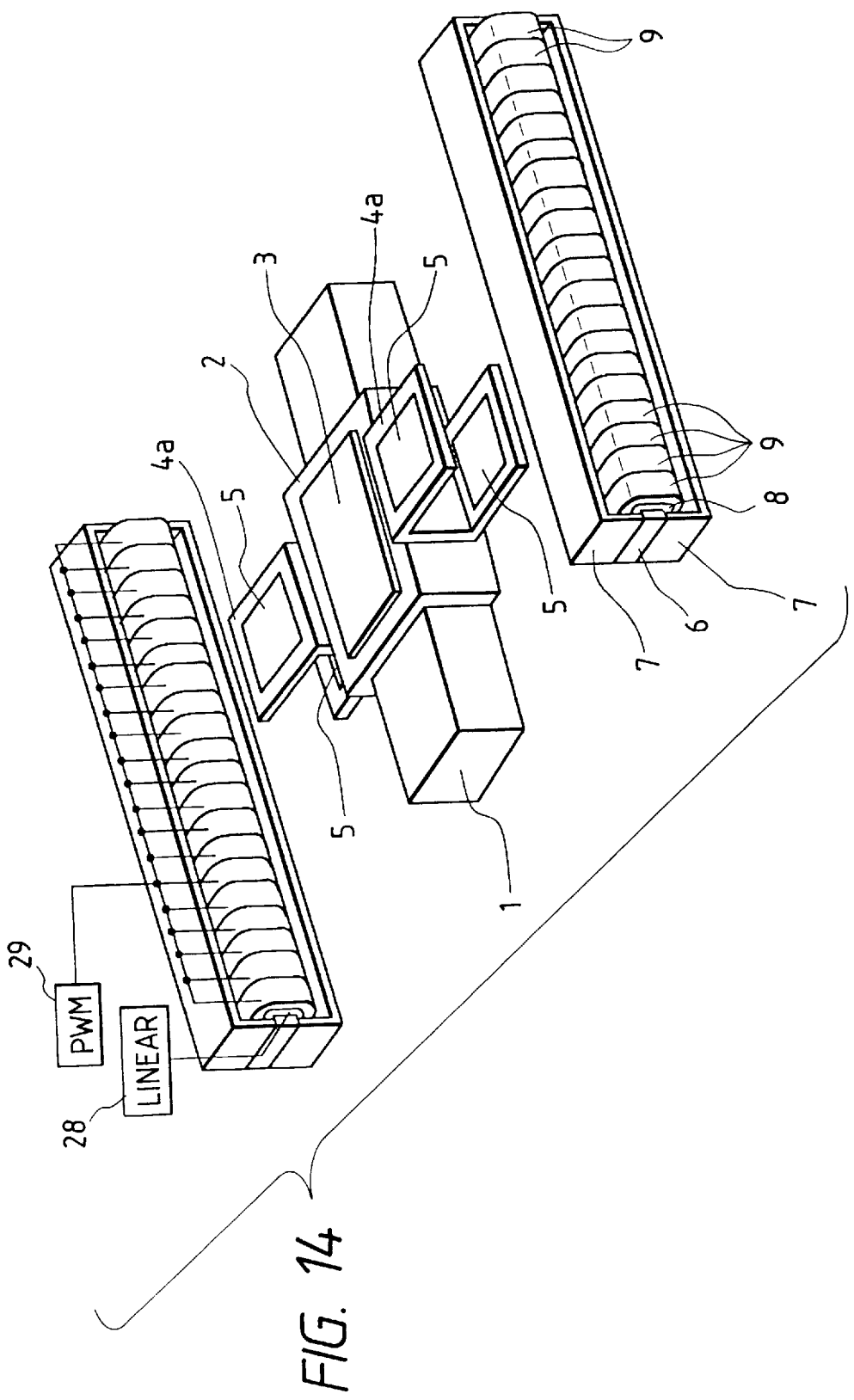
FIG. 14 is a perspective view showing the arrangement of the driving mechanism shown in FIG. 13.

FIG. 13 is a perspective view showing the outer appearance of a driving mechanism according to the sixth embodiment of the present invention. FIG. 14 is a perspective view showing the arrangement of the driving mechanism shown in FIG. 13. This driving mechanism is used to uniaxially scan/exposure a workpiece 3. As shown in FIGS. 13 and 14, in this apparatus, a stage guide 1 is fixed on an anti-vibration base (not shown). A stage 2 is supported on the stage guide 1 through a lubricating means such as an air film to be slidable in the scanning direction. The workpiece 3 is held on the stage 2. Magnet holding plates 4 each having a U-shaped section are fixed on both sides of the stage 2. Rectangular holes for receiving magnets 5 are formed in horizontal portions 4a of each magnet holding plate 4. The magnets 5 are fitted in the rectangular holes and fixed. The stage 2, the workpiece 3, the magnet holding plates 4, and the magnets 5 constitute a movable unit.

A fixed unit is constituted by yoke/coil units arranged with respect to the movable unit. Each yoke/coil unit is formed by a center yoke 6, two side yokes 7, a single-phase speed control coil 8, and a plurality of accelerating and decelerating coils 9. The speed control coil 8 is wound on the center yoke 6 such that the dimension of the speed control coil 8 in the longitudinal direction almost equals the total length of the center yoke 6. The speed control coil 8 electrically has a single-phase structure.

The accelerating and decelerating coil 9 is wound on the speed control coil 8 such that the dimension of the accelerating and decelerating coil 9 in the longitudinal direction is sufficiently smaller than that of the speed control coil 8. A plurality of accelerating and decelerating coils 9 are arranged along the longitudinal direction of the center yoke 6. The plurality of accelerating and decelerating coils 9 are constituted to be electrically independent. That is, the current can be controlled in units of phases. The upper and lower side yokes 7 are fixed to sandwich the center yoke 6.

The fixed unit and the movable unit are fixed such that the magnets 5 of each magnet holding plate 4 are inserted between the accelerating and decelerating coils 9 and the side yokes 7 of the yoke/coil unit without contacting the accelerating and decelerating coils 9 and the side yokes 7.

Figures 15A, 15B, 15C:
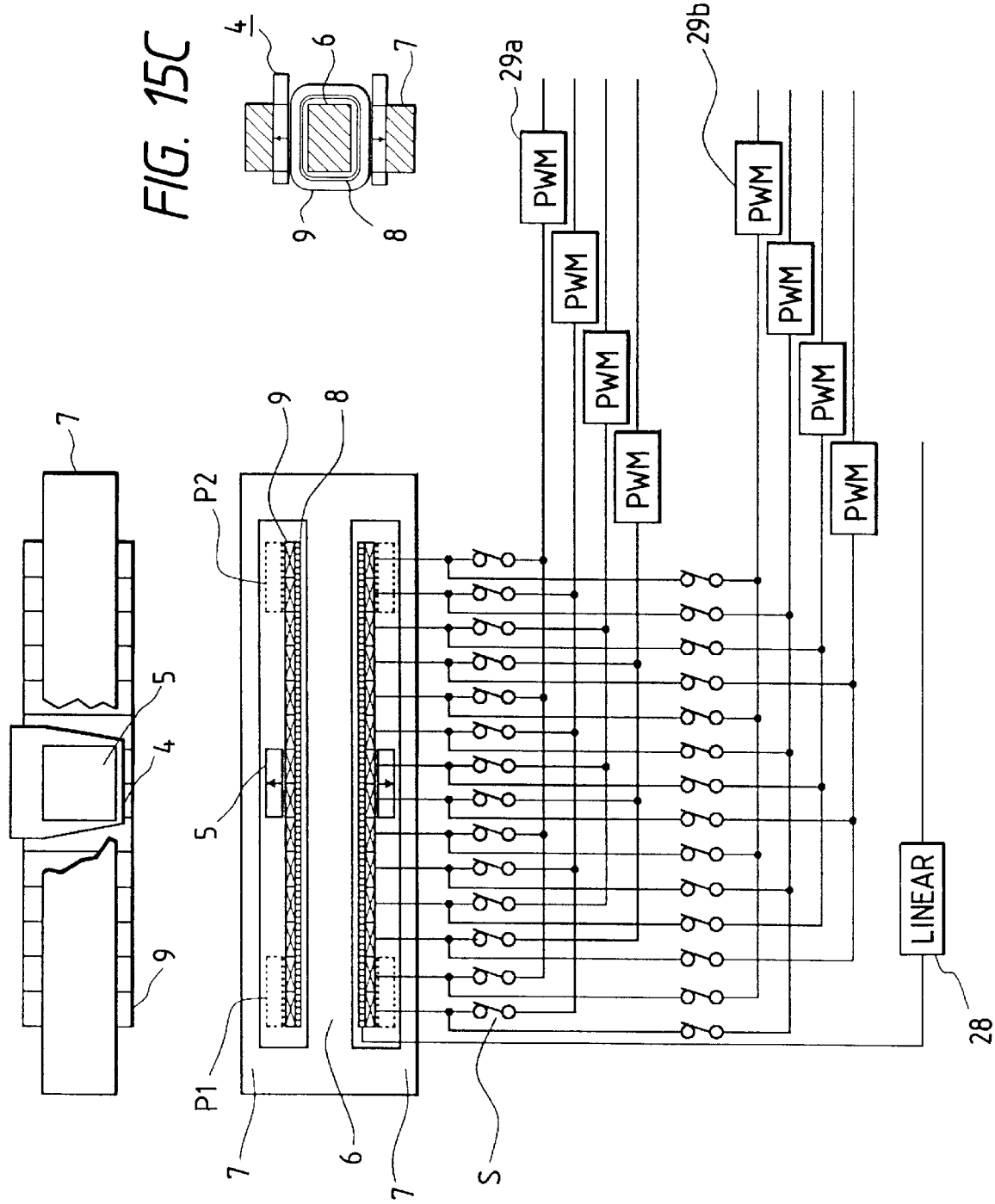
FIGS. 15A to 15C are circuit diagrams showing the electrical system of the driving mechanism shown in FIGS. 13 and 14.

The magnets 5 of the movable unit are arranged along the direction of thickness (vertical direction) of the fixed unit, as shown in FIGS. 15A to 15C (to be described later). More specifically, the two magnets 5 contained in each magnet holding plate 4 are arranged such that their N poles are directed to the center yoke 6.

The magnetic fluxes generated from each magnet 5 enter the center yoke 6 and branch forward and backward in the longitudinal direction. The magnetic fluxes reach the two end portions (front and rear end portions) of the center yoke 6, branch upward and downward at the front and rear end portions, and enter the upper and lower side yokes 7. In each of the upper and lower side yokes 7, the magnetic fluxes flow to a position where the they oppose the magnet 5 and reach the S pole of the opposing magnet 5. A magnetic circuit is formed in the above manner. When a current is flowed to the speed control coil 8 in this state, the magnet 5 receives a force in the scanning direction (the longitudinal direction of the yokes 6 and 7) in accordance with the Fleming's rule. Similarly, when a current is flowed to the accelerating and decelerating coils 9 opposing the magnet 5, the magnet 5 receives a force in the scanning direction.

FIGS. 15A to 15C are views showing the connection state of the electrical system circuit of the driving mechanism shown in FIGS. 13 and 14. Only part of the movable unit and one side of the fixed unit are shown. FIG. 15A is a partially cutaway plane view of the one side portion of the fixed unit. FIG. 15B is a view showing the longitudinal section of the fixed unit and connection of the electrical system. FIG. 15C is a cross-sectional view at the magnet 5 portion. As shown in FIG. 15B, four accelerating drivers 29a, four decelerating drivers 29b, and a speed control driver 28 are provided as drivers. The accelerating or decelerating driver is divided into a plurality of units because the driver must have a margin in its capacity. If the driver has a sufficient margin, only one accelerating or decelerating driver suffices. One of the accelerating drivers 29a and one of the decelerating drivers 29b are parallelly connected to each accelerating and decelerating coil 9 through a switch means S.

The switch means S of each accelerating and decelerating coil 9 acts such that the coil is connected to neither the accelerating drivers 29a nor the decelerating drivers 29b, or the coil is connected to only one of them. That is, each coil is never connected to both the accelerating driver 29a and the decelerating driver 29b.

In this embodiment, four groups of the four-phase accelerating and decelerating coils are connected to the four accelerating drivers 29a or the four decelerating drivers 29b, respectively, through the switch means S. More specifically, the coils are sequentially assigned to the respective groups such that the coils of one group, which are located every four coils, can be connected to the corresponding one of the accelerating drivers 29a or decelerating drivers 29b. With this arrangement, the four accelerating and decelerating coils 9 continuously arranged to be adjacent to each other can be respectively connected to the four accelerating drivers 29a or decelerating drivers 29b independently of the positions of the coils.

As the most important feature of this embodiment, PWM amplifiers are used as the accelerating drivers 29a and the decelerating drivers 29b, and a linear amplifier are used as the speed control driver 28.

FIG. 15B shows a start position P1 and a stop position P2 of the movable unit which is accelerated from one stroke end, travels at a constant speed, and is decelerated to the other stroke end. The switch means S are closed such that the four-phase coils 9 at the left end are connected to only the accelerating drivers 29a. The switch means S are also closed such that the four-phase coils 9 at the right end are connected to only the decelerating drivers 29b. The remaining accelerating and decelerating coils 9 are not connected to the drivers. The total length of the four-phase coils 9 in the scanning direction is designed to be larger than (magnet size+acceleration and deceleration strokes). That is, acceleration ends with only the four-phase coils. In other words, the coils cannot be switched during acceleration.

Figure 12:
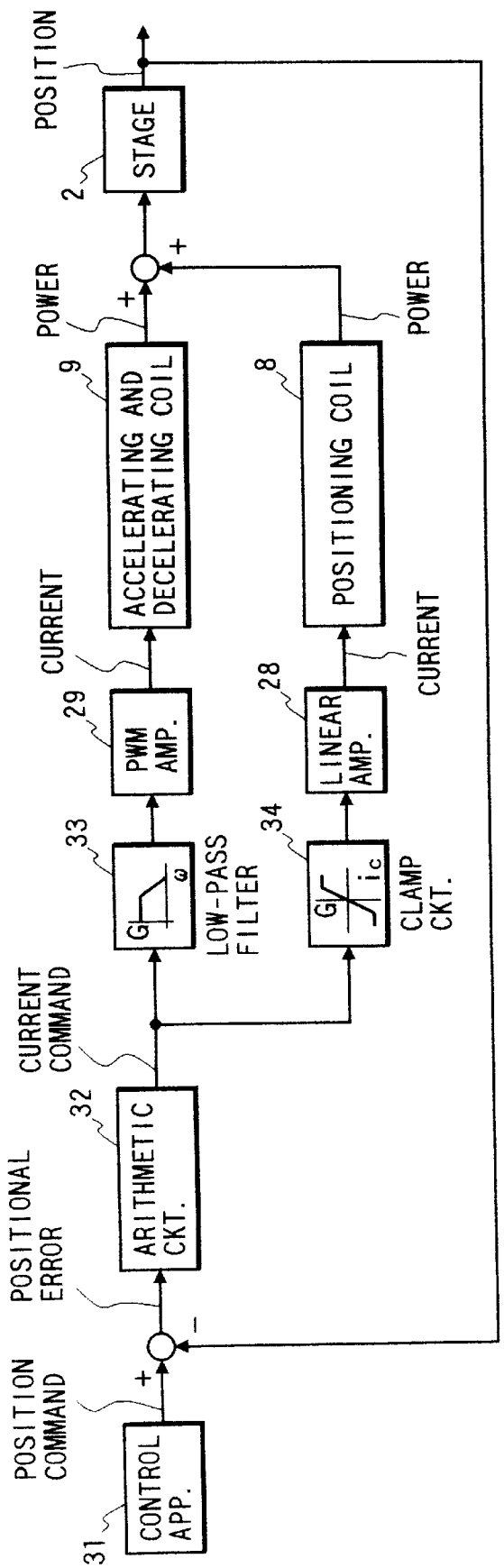
FIG. 12 is a control block diagram of the driving mechanism shown in FIG. 11.

The control block diagram is the same as that shown in FIG. 12.

The function of this arrangement will be described below with reference to the control block diagram in FIG. 12. When a position command is output from a control apparatus 31, an error between the position command and a position signal measured by the laser interferometer is calculated and time-serially input to an arithmetic circuit 32. The arithmetic circuit 32 performs various filter calculations for this time-serially input positional error signal to output a current command. The current command is input to both the PWM amplifier 29 and the linear amplifier 28. During acceleration/deceleration, a large value is input as the current command. However, the input value to the linear amplifier 28 is limited by a clamp circuit 34 inserted to the input stage not to exceed a predetermined value, so that only a current corresponding to the limited maximum value is flowed.

On the other hand, the PWM amplifier 29 flows a current corresponding to the command value to the four-phase accelerating coils 9. That is, during acceleration, a thrust is applied mainly by the PWM amplifier 29 for acceleration and the four-phase coils 9 connected to the PWM amplifier 29.

When movement by acceleration is completed, and the movable unit enters the exposure region, speed control is performed. At this time, the movable magnets 5 do not oppose the accelerating coils 9, so that the correction force for speed control is obtained by interaction with the current flowed to the speed control coil 8 driven by the speed control driver 28. Since the speed is constant, an electrically small current command value is output as a signal at a relatively high frequency. The servo gain of the speed loop of the arithmetic circuit 32 is set to be high to obtain a high accuracy. The stage 2 is constantly controlled to its target position while oscillating with small displacements at a relatively high frequency by an electrical spring constituted by the servo system. This current command is also input to both the PWM amplifier 29 and the linear amplifier 28. The PWM amplifier 29 can hardly respond to the input signal at a relatively high frequency, so a desired control current cannot be flowed to the coils. At the worst, an undesired disturbance may be generated by flowing a current having a distorted waveform with respect to the input waveform. Therefore, in this embodiment, a low-pass filter 33 is inserted in the input stage of the PWM amplifier 29 to shield a current command at a relatively high frequency for positioning.

On the linear amplifier 28 side, the small current command value passes through the clamp circuit 34 without being clamped. The linear amplifier 28 flows a current waveform corresponding to the waveform of the current command to the speed control coils 8. That is, during speed control, a thrust for speed control is applied mainly by the linear amplifier 28, so that a high positioning accuracy can be achieved.

When the movable unit leaves the exposure region, the four-phase decelerating coils 9 connected to the PWM amplifier 29 oppose the magnets 5 of the movable unit. The movable unit is decelerated by the four-phase decelerating coils 9 and stopped. The roles and functions of the PWM amplifier 29 and the linear amplifier 28 in the decelerating operation are the same as those in the accelerating operation.

Figure 16:
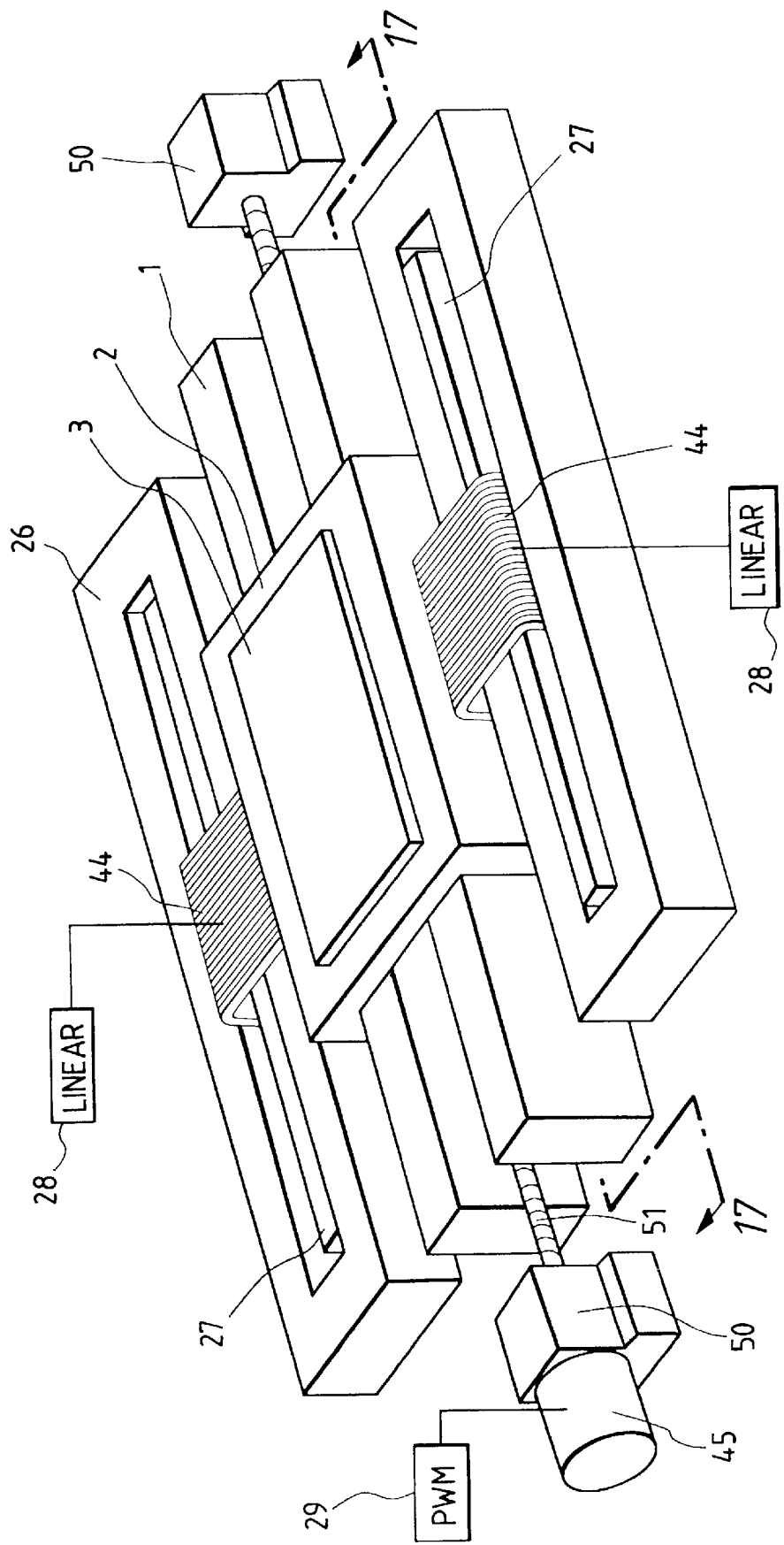
FIG. 16 is a perspective view showing the arrangement of a driving mechanism according to the seventh embodiment of the present invention.
Figure 17:
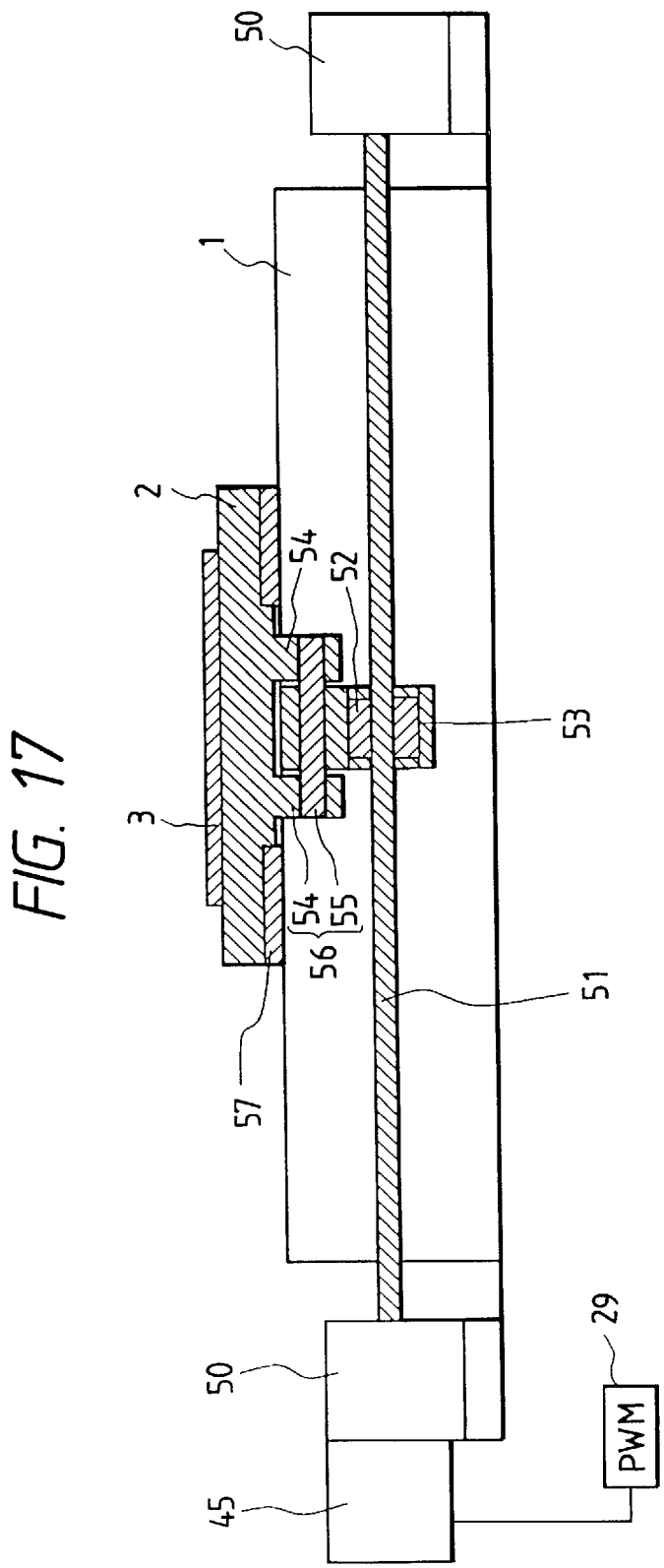
FIG. 17 is a sectional view taken along a line 17—17 in FIG. 16.

FIG. 16 is a perspective view showing the arrangement of a driving mechanism according to the seventh embodiment of the present invention. FIG. 17 is a sectional view taken along a line 17—17 in FIG. 16. As shown in FIG. 16, a guide 1 is fixed on a base (not shown). A stage 2 is supported on the guide 1 through a lubricating means such as an air film to be slidable in the scanning direction. A workpiece 3 is held on the stage 2. Driving coils 44 are fixed on both sides of the stage 2. Linear motor stators each comprising a yoke 26 and a magnet 27 are arranged over the entire stroke of the stage 2 to apply a predetermined magnetic field to part of the driving coils 44. The linear motor stators are fixed on the base (not shown).

A driving mechanism using a screw 51 is arranged to be parallel to the linear motor driving mechanism. As shown in FIG. 17, the screwing mechanism comprises tow bearing units 50 arranged on the base (not shown), the screw 51 supported by the bearing units 50, a motor 45 fixed to one of the bearing unit 50 to rotate the screw 51, a ball nut 52 fed by the screw 51, a housing 53 containing the ball nut 52, and a power transmission unit 56 for transmitting a power from the housing 53 to the stage 2.

The power transmission unit 56 is constituted by a housing slider 55 for slidably supporting the housing 53 in the scanning direction, and a housing stopper 54 for limiting the slide range of the housing 53. When the housing 53 abuts against the housing stopper 54, a power is transmitted from the housing 53 to the stage 2.

In FIG. 16, a linear amplifier 28 is connected to each driving coil 44 to respond to a current command up to high frequencies. A PWM amplifier 29 is connected to the motor 45 for rotating the screw 51 to generate a high output power. That is, accelerating and decelerating operations are performed by the screwing mechanism, and a positioning operation is performed by the driving coils 44. The position of the stage 2 is measured by a laser interferometer (not shown) and fed back to a position/speed control circuit (not shown).

Figure 18:
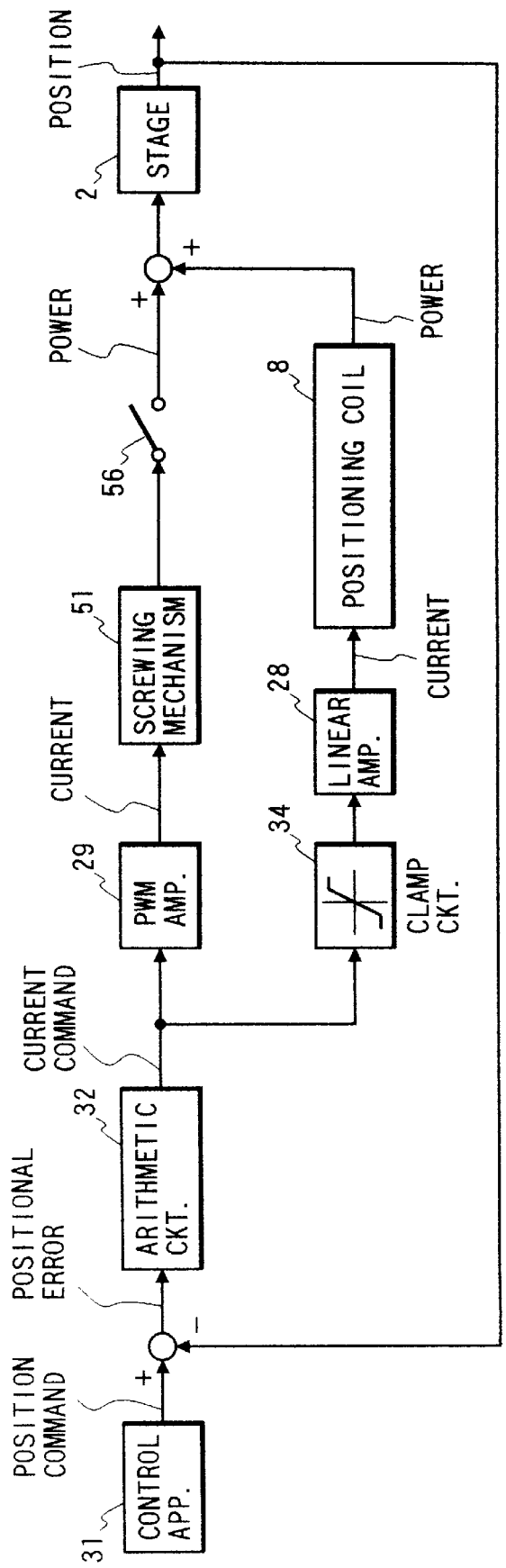
FIG. 18 is a control block diagram of the driving mechanism shown in FIGS. 16 and 17.

FIG. 18 is a control block diagram of this driving mechanism. The same reference numerals as in FIG. 12 denote the same parts in FIG. 18, and a detailed description thereof will be omitted. The arrangement and operation of the driving mechanism shown in FIGS. 16 to 18 are almost the same as those of the driving mechanism shown in FIGS. 11 and 12 except for the method of shielding power transmission of the screwing mechanism in the positioning operation. In the positioning operation, instead of shielding a signal on the basis of the frequency of the current waveform, the housing 53 containing the ball nut 52 is separated from the housing stopper 54 to shield power transmission from the screw 51, thereby realizing highly accurate position control by only the driving coils 44.

Figure 20:
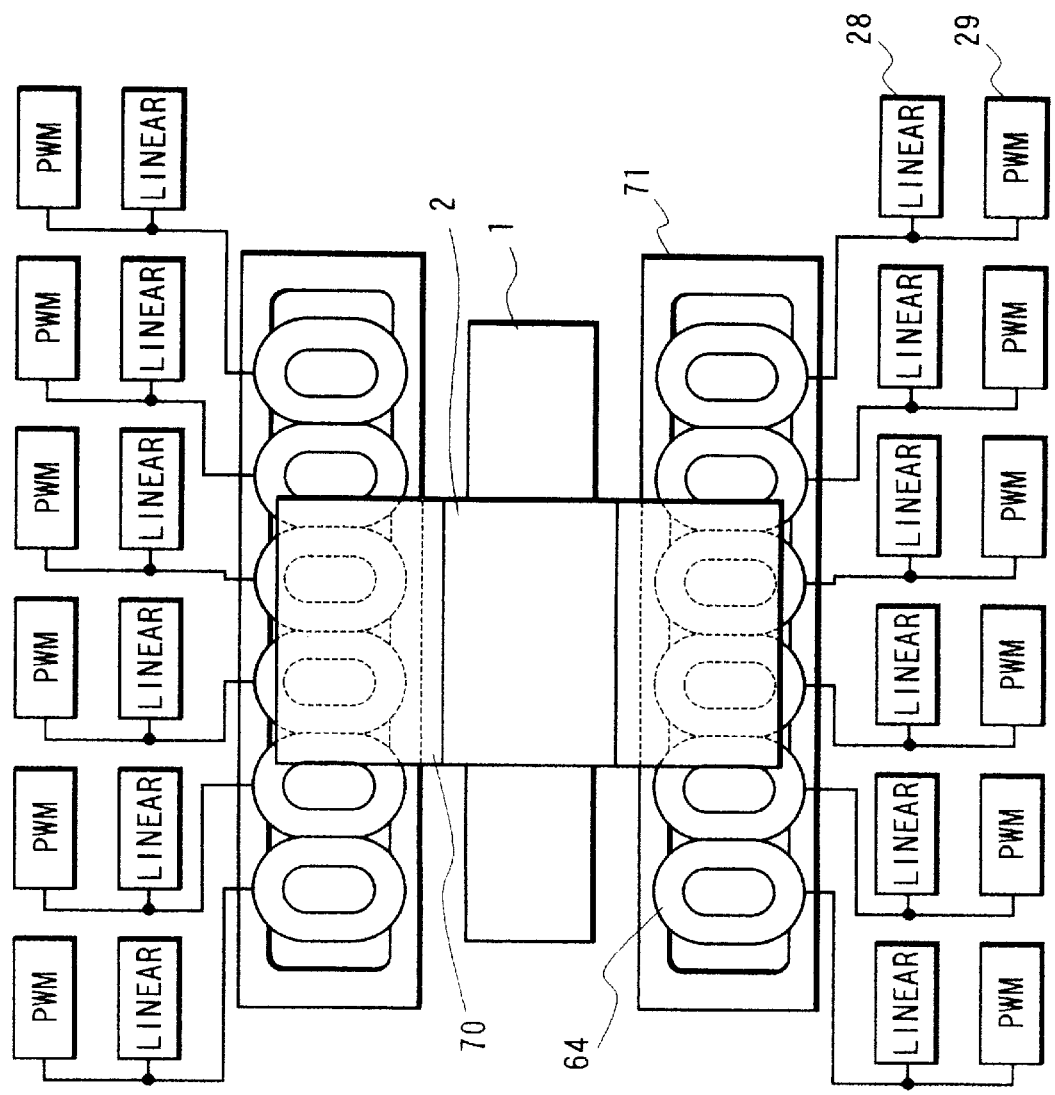
FIG. 20 is a circuit diagram showing the electrical system of the driving mechanism shown in FIGS. 19A and 19B.

FIGS. 19A and 19B are perspective views showing the outer appearance and arrangement of a driving mechanism according to the eighth embodiment of the present invention, respectively. As shown in FIGS. 19A and 19B, a guide 1 is fixed on a base (not shown). A stage 2 is supported on the guide 1 through a lubricating means such as an air film to be slidable in the scanning direction. A workpiece 3 is held on the stage 2. Yokes 66 and quadripole magnets 67, which serve as linear motor moving members 70, are fixed on both sides of the stage 2. Stator frames 71 each having six coil units fixed therein are arranged as linear motor stators. The stator frames 71 are fixed on the base (not shown). Each coil unit is constituted by a positioning/speed control coil 8 at the upper portion and an accelerating and decelerating coil 9 at the lower portion. Each accelerating and decelerating coil 9 is connected to a PWM amplifier 29, and each positioning/speed control coil 8 is connected to a linear amplifier 28. FIG. 20 is a view showing the connection state of the electrical system of the driving mechanism shown in FIGS. 19A and 19B.

Figure 21:
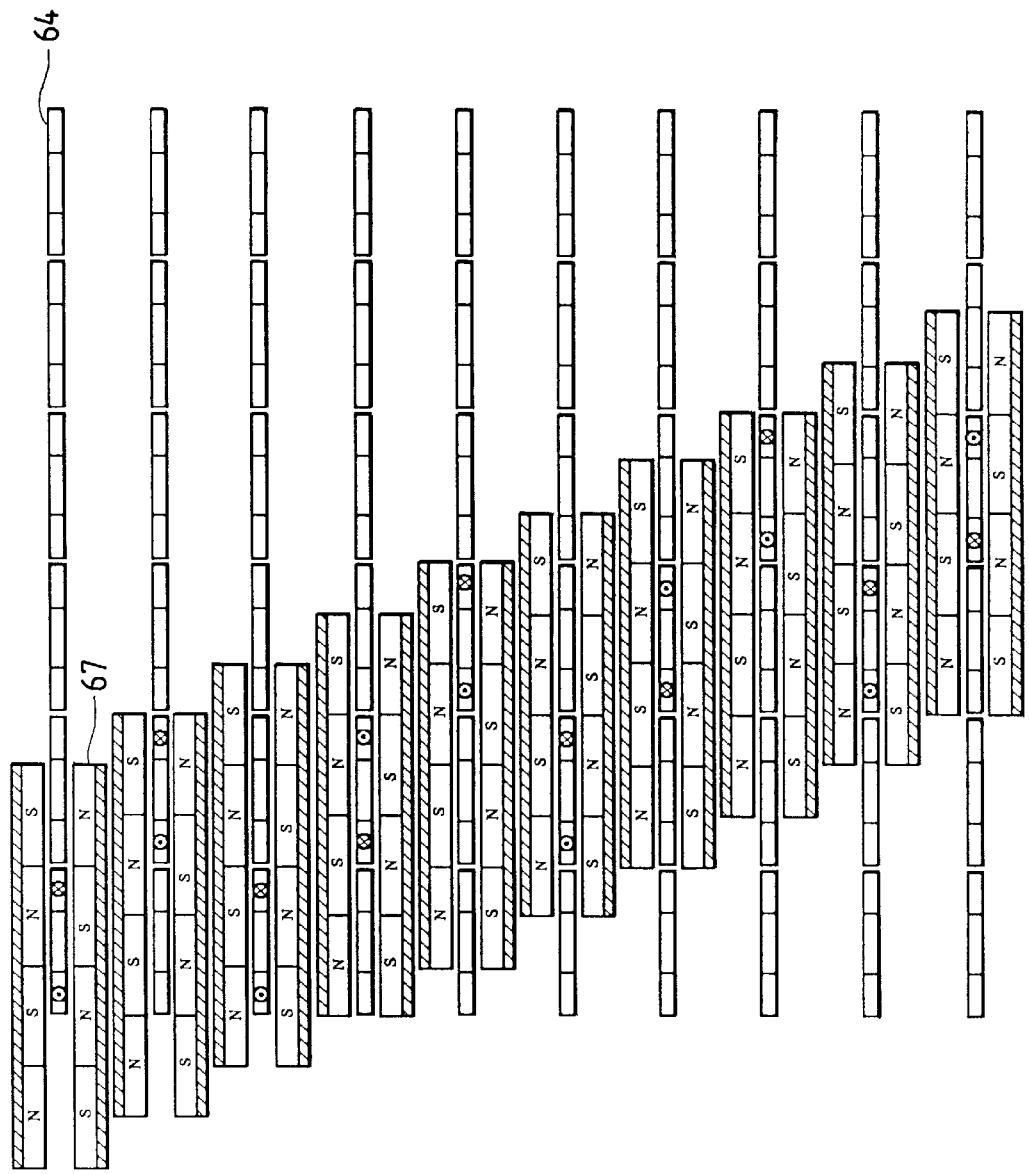
FIG. 21 is a diagram showing the coil selection sequence of the driving mechanism shown in FIGS. 19A and 19B.

In this arrangement, when the stage 2 is moved from the left side to the right side, the six coil units (only on one side) are driven in accordance with the driving sequence shown in FIG. 21. The relative position of the coils 8 and 9 and the magnets 67 is detected by an encoder (not shown). The driving coils and the direction of flowing the current are selected on the basis of the relative position. Referring to FIG. 21, ⊗ and ⊙ represent the selected coils, and a current pointing out of the page and a current pointing into the page, respectively.

The operation of this embodiment is the same as that of the fifth embodiment except that the six coils are selectively used, as shown in FIG. 21. Control for each coil unit is the same as in FIG. 12.

Figure 22:
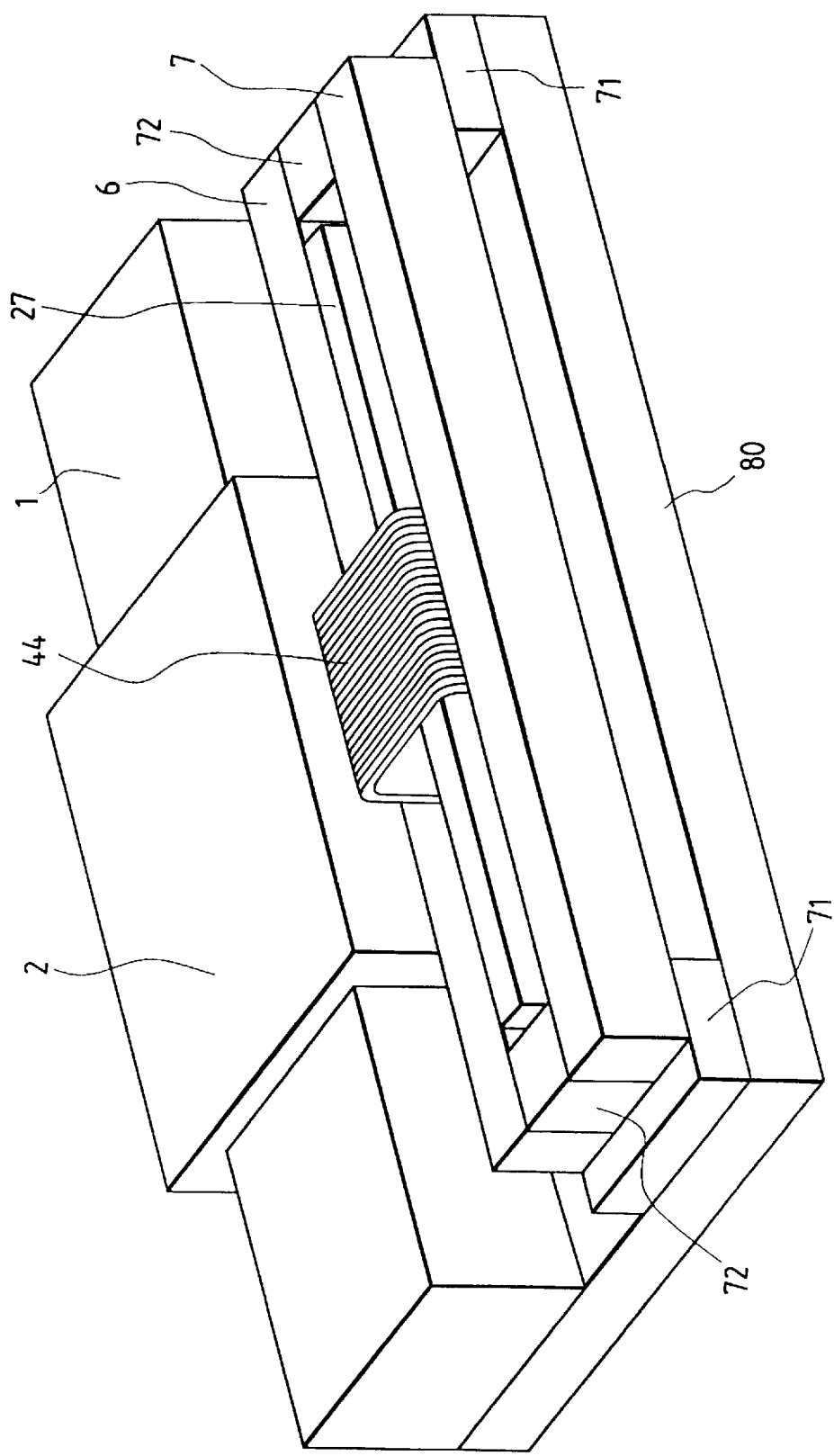
FIG. 22 is a perspective view showing the outer appearance and arrangement of a driving mechanism according to the ninth embodiment of the present invention.
Figure 34:
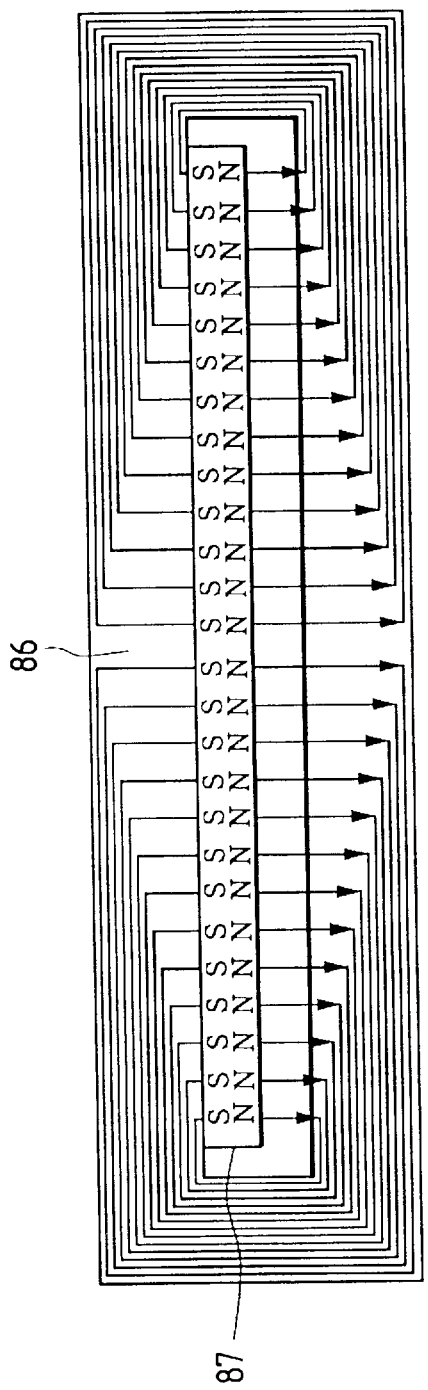
FIG. 34 is a view showing the flow of magnetic fluxes in a magnet and a yoke in FIG. 32 or 33.

FIG. 22 is a perspective view showing the arrangement of a driving mechanism according to the ninth embodiment of the present invention. Referring to FIG. 22, a guide 1 is fixed on a base 80. A movable stage 2 is arranged on the guide 1 to be slidable in one direction. A first yoke 6 is fixed on the base 80 through spacers 71. A homopolar magnet 27 is fixed to the first yoke 6 over the entire stroke of the movable stage 2 and magnetized in the direction of thickness, like the magnet 87 shown in FIG. 34. A second yoke 7 is fixed on the reticle stage base 80 through the spacers 71 to be substantially parallel to the first yoke 6 along the longitudinal direction. In addition, permanent magnets 72 are arranged independently of the homopolar magnet to connect the first yoke 6 and the second yoke 7. The two permanent magnets 72 are magnetized in a direction parallel and opposite to the magnetization direction of the homopolar magnet 27. More specifically, the S pole of the homopolar magnet 27 opposes the first yoke 6, and the N pole thereof opposes the second yoke 7. However, as for each of the two permanent magnets 72, its N pole opposes the first yoke 6, and its S pole opposes the second yoke 7. The permanent magnets 72 arranged at the two ends of the yokes 6 and 7 will be referred to as current/magnetic flux regulating magnets hereinafter.

When the yokes 6 and 7 and the magnets 27 and 72 are arranged as described above, the magnetic fluxes generated from the N pole of the homopolar magnet 27 arranged over the entire stroke pass through the gap between the homopolar magnet 27 and the second yoke 7 and enter the second yoke 7. The magnetic fluxes flow to the two ends of the second yoke 7 and enter the S poles of the current/magnetic flux regulating magnets 72 at the two ends of the second yoke 7. On the other hand, the magnetic fluxes generated from the N poles of the current/magnetic flux regulating magnets 72 at the two ends of the first yoke 6 enter the first yoke 6, flow toward the center of the first yoke 6, and enter the S pole of the homopolar magnet 27 arranged over the entire stroke.

A movable coil 44 is wound on the first yoke 6 and the homopolar magnet 27 without contacting the first yoke 6 and the homopolar magnet 27. The movable coil 44 is fixed on the movable stage 2 slidable in one direction.

Figure 32:
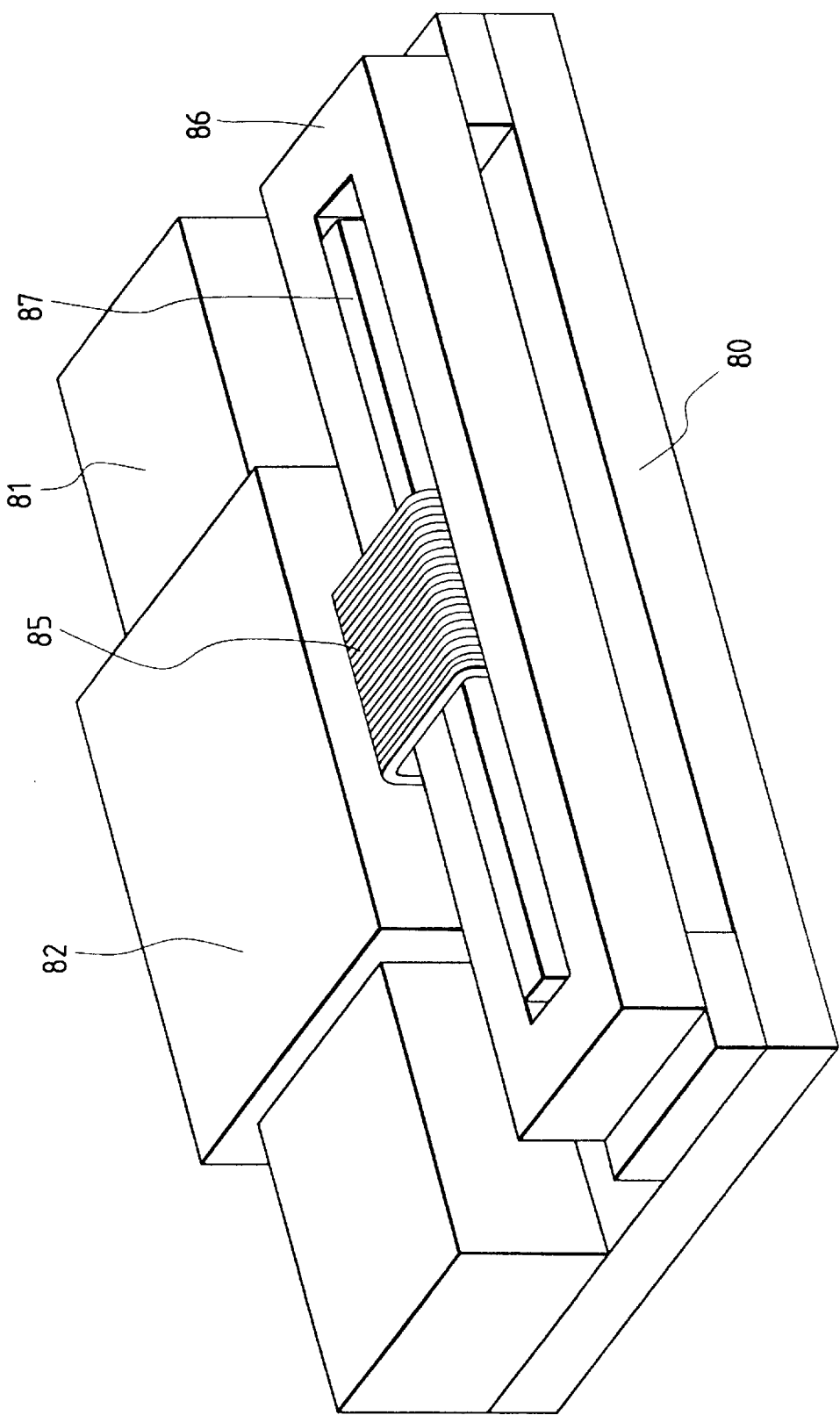
FIG. 32 is a perspective view showing the arrangement of a conventional driving mechanism.
Figure 33:
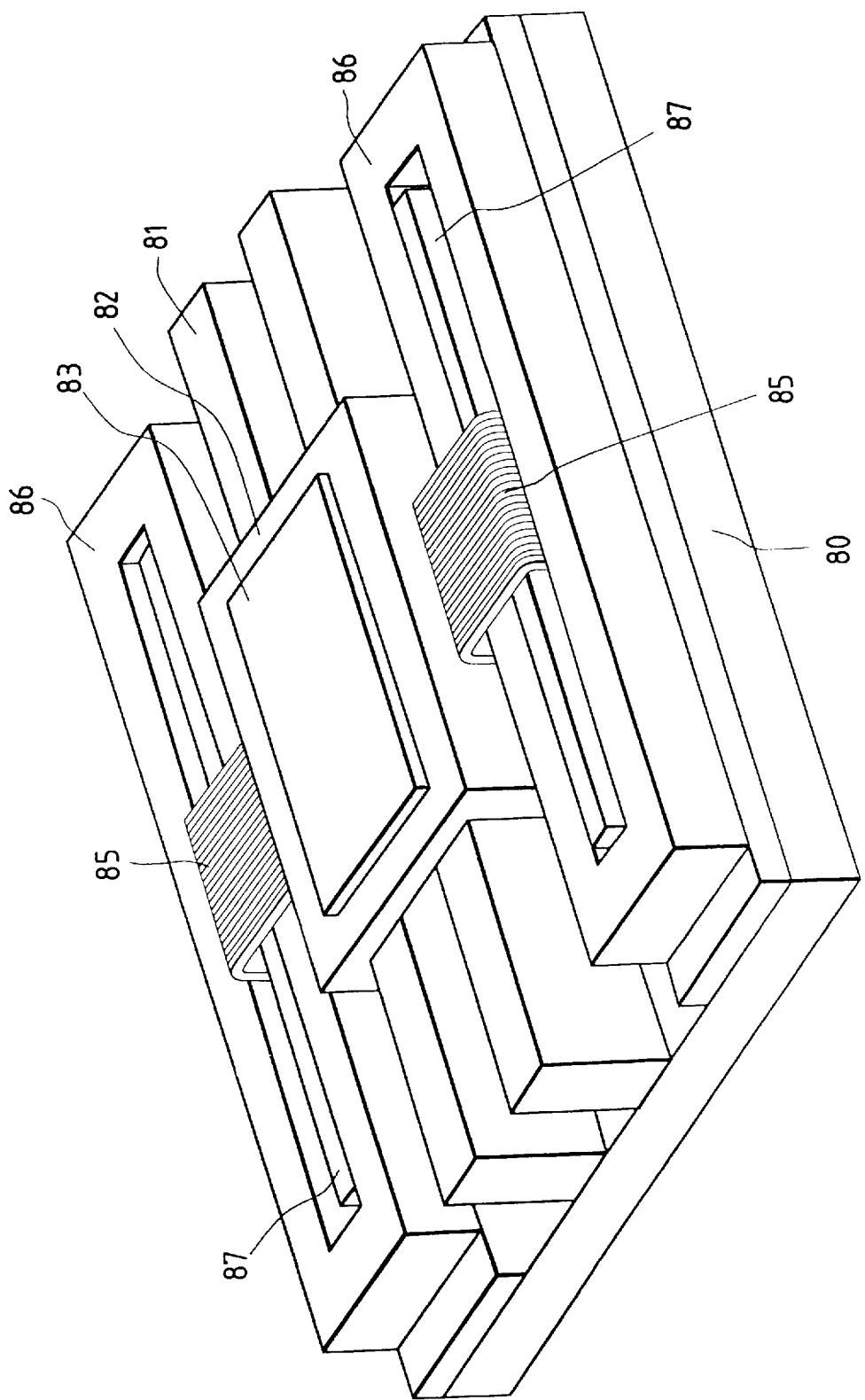
FIG. 33 is a perspective view showing the arrangement of another conventional driving mechanism.

In the above arrangement, when a current is flowed to the movable coil 44, the movable stage 2 receives a force in the guided direction, as in the conventional art shown in FIG. 32. In the prior art, since the yoke is integrally formed, the magnetic fluxes generated by the coil current circulate in the yoke 86. In this embodiment, however, since the yoke is divided into the first yoke 6 and the second yoke 7 through the current/magnetic flux regulating magnets 72, the magnetic fluxes generated by the coil current lose the circulation path in the ferromagnetic substance. As a result, less magnetic fluxes are generated in the first yoke 6 and the second yoke 7 by the coil current. Therefore, even when the yokes 6 and 7 have minimum thicknesses for circulating the magnetic fluxes from the homopolar magnet 27 arranged over the entire stroke, a large thrust can be generated for the movable stage 2 by flowing a large current to the movable coil 44.

Figure 23:
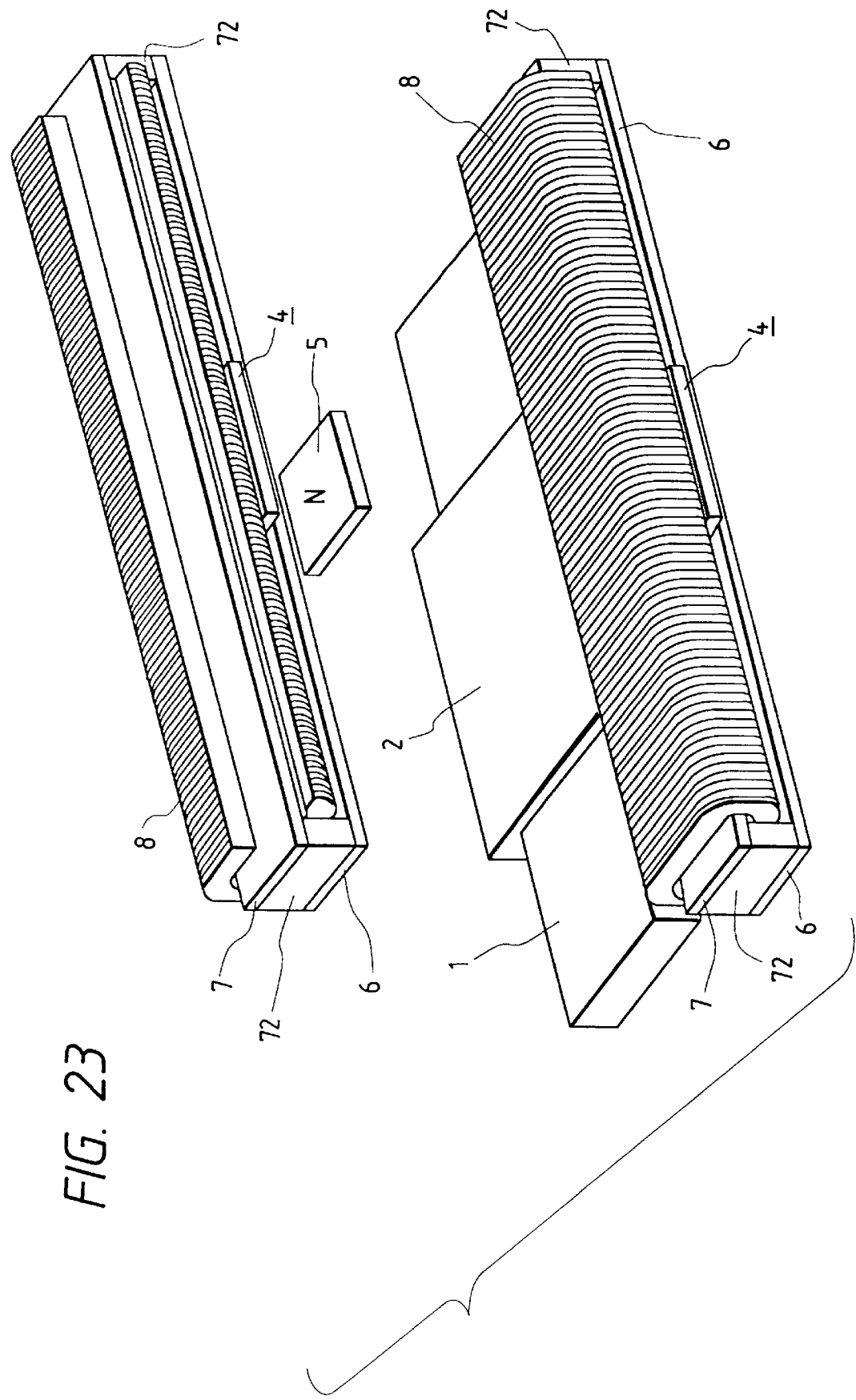
FIG. 23 is a perspective view showing the outer appearance and arrangement of a driving mechanism according to the 10th embodiment of the present invention.

FIG. 23 is a perspective view showing the arrangement of a driving mechanism according to the 10th embodiment of the present invention. In the mechanism shown in FIG. 23, a guide 1 is fixed on a base (not shown). A movable stage 2 is arranged on the guide 1 to be slidable in one direction. A first yoke 6 is fixed on the base. Current/magnetic flux regulating magnets 72 are fixed on the two end portions of the first yoke 6. A second yoke 7 is fixed on the current/magnetic flux regulating magnets 72. A single-phase coil 8 is wound on the second yoke 7 over the entire stroke of the movable stage 2. A movable magnet 5 is arranged in a gap between the single-phase coil 8 and the first yoke 6 to oppose, at its one pole, the single-phase coil 8 and fixed to the movable stage 2 through a frame 4. In this embodiment, the movable magnet 5 is magnetized in the direction of thickness such that the N pole faces upward. The two current/magnetic flux regulating magnets 72 arranged at the two ends are magnetized in a direction parallel and opposite to the magnetization direction of the movable magnet 5. More specifically, the N pole of the movable magnet 5 opposes the first yoke 6, and the S pole thereof opposes the second yoke 7.

The magnetic fluxes generated from the N pole of the movable magnet 5 pass through the gap and enter the second yoke 7. The magnetic fluxes flow to the two ends of the reticle stage 2 and enter the S poles of the current/magnetic flux regulating magnets 72 at the two ends of the second yoke 7. On the other hand, the magnetic fluxes generated from the N poles of the current/magnetic flux regulating magnets 72 at the two ends of the first yoke 6 enter the first yoke 6 and flow toward the center of the first yoke 6. The magnetic fluxes pass through part of the winding of the single-phase coil 8 and the gap and enter the S pole of the movable magnet 5.

Figure 35:
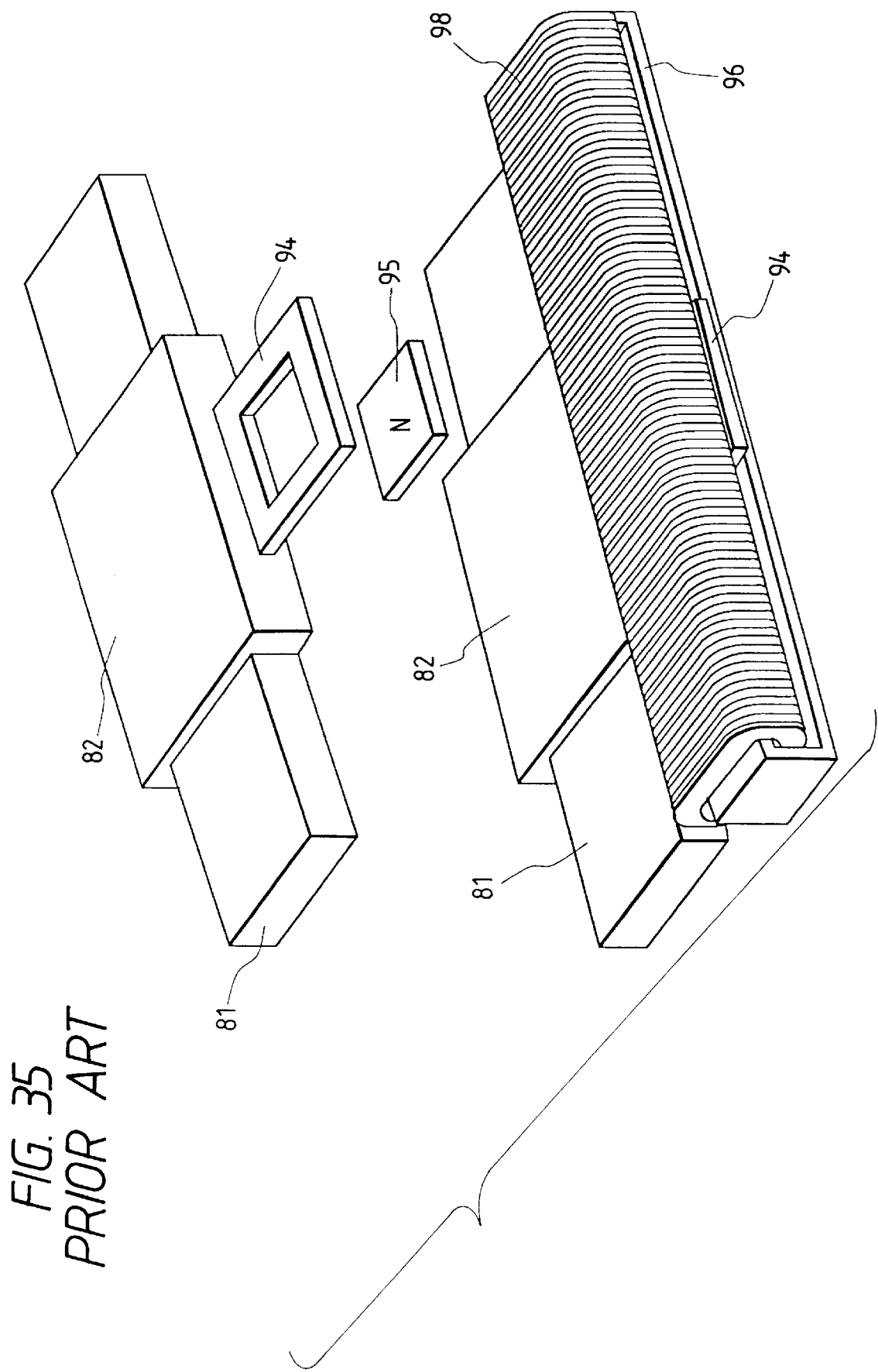
FIG. 35 is a perspective view showing the arrangement of still another conventional driving mechanism.

In the above arrangement, when a current is flowed to the single-phase coil 8, the movable stage 2 receives a force in the guided direction, as in the prior art shown in FIG. 35. In the prior art, since the yoke is integrally formed, the magnetic fluxes generated by the coil current circulate in the yoke 96. In this embodiment, however, since the yoke is divided into the first yoke 6 and the second yoke 7 through the current/magnetic flux regulating magnets 72, the magnetic fluxes generated by the coil current lose the circulation path in the ferromagnetic substance. As a result, less magnetic fluxes are generated in the first yoke 6 and the second yoke 7 by the coil current. Therefore, even when the yokes 6 and 7 have minimum thicknesses for circulating the magnetic fluxes from the movable magnet 5 arranged over the entire stroke, a large thrust can be generated for the movable stage 2 by flowing a large current to the single-phase coil 8.

Figure 24:
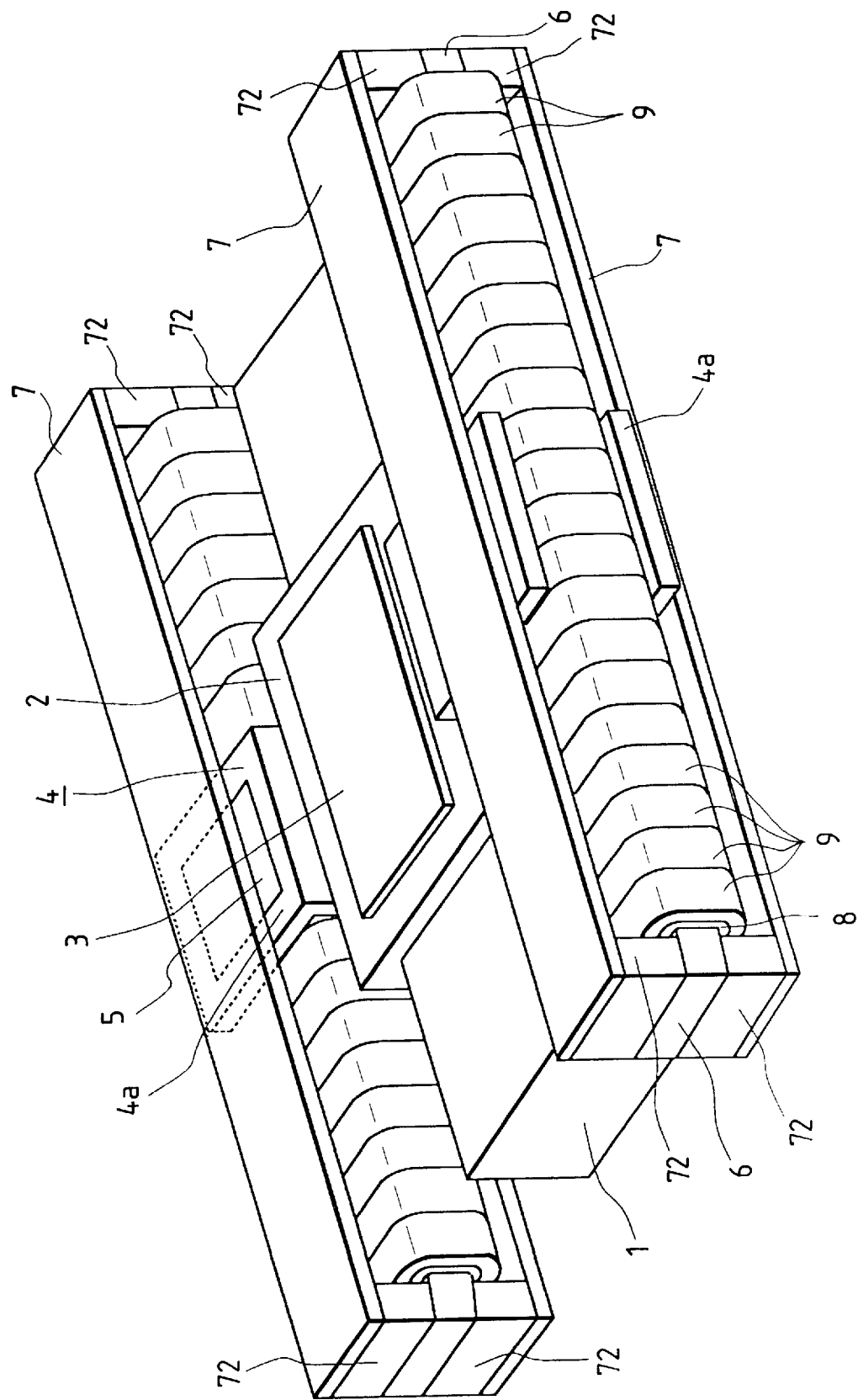
FIG. 24 is a perspective view showing the arrangement of a driving mechanism according to the 11th embodiment of the present invention.
Figure 25:
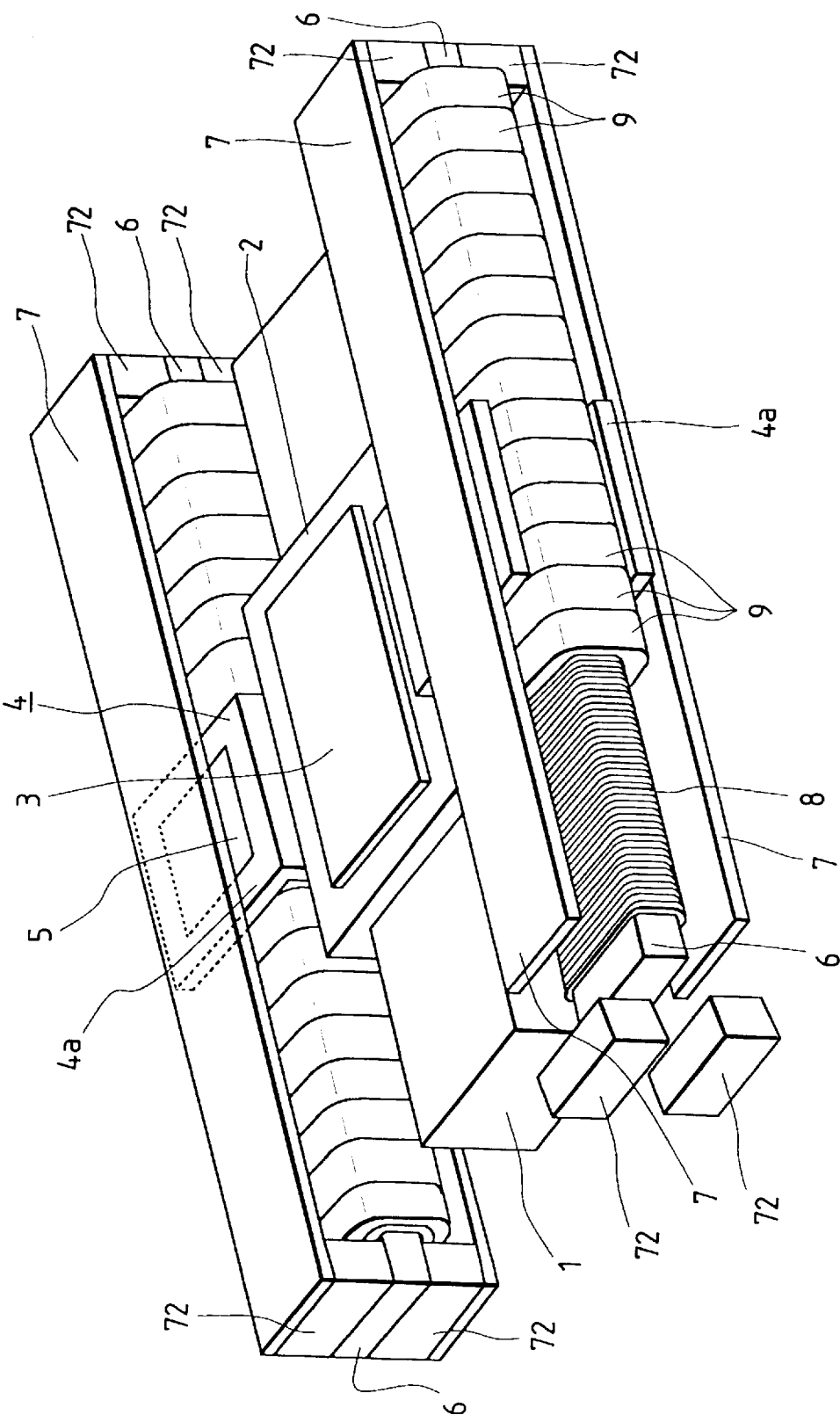
FIG. 25 is a partially cutaway perspective view of the driving mechanism shown in FIG. 24.
Figure 26:
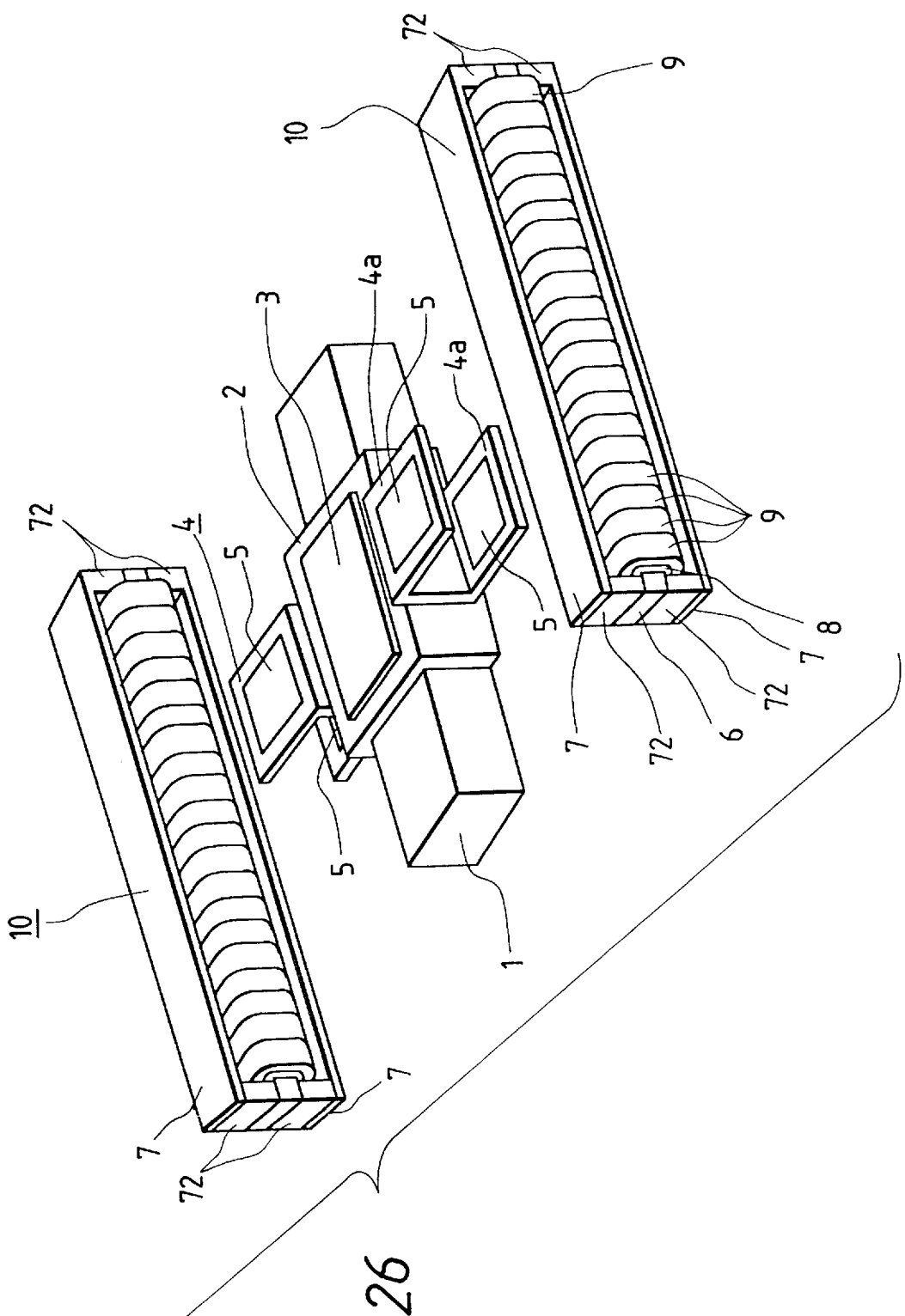
FIG. 26 is an exploded perspective view of the driving mechanism shown in FIG. 24.

FIGS. 24 to 26 are perspective views showing the arrangement of a reticle stage using a driving mechanism according to the 11th embodiment of the present invention. FIG. 24 is a perspective view showing the overall arrangement. FIG. 25 is a partially cutaway view of the yoke and coil portion. FIG. 26 is an exploded view showing a movable unit and a fixed unit, which are shifted from each other. In the reticle stage shown in FIGS. 24 to 26, a stage guide 1 is fixed on an anti-vibration base (not shown). A stage 2 is supported on the stage guide 1 through a lubricating means such as an air film to be slidable in the scanning direction. A reticle 3 is held on the stage 2. Magnet holding plates 4 each having a U-shaped section are fixed on both sides of the stage 2. Rectangular holes for receiving magnets are formed in horizontal portions 4a of each magnet holding plate 4. Magnets 5 are fitted in the rectangular holes and fixed. The stage 2, the reticle 3, the magnet holding plates 4, and the magnets 5 constitute a movable unit.

A fixed unit is constituted by yoke/coil units 10 arranged on both sides of the movable unit. Each of the units 10 is formed by a center yoke 6, two side yokes 7, four current/magnetic flux regulating magnets 72, a single-phase speed control coil 8, and a plurality of accelerating and decelerating coils 9.

To construct the unit 10, first, the speed control coil 8 is wound on the center yoke 6 such that the dimension of the speed control coil 8 in the longitudinal direction almost equals the total length of the center yoke 6. The speed control coil 8 electrically has a single-phase structure. The accelerating and decelerating coil 9 is wound on the speed control coil 8 such that the dimension of the accelerating and decelerating coil 9 in the longitudinal direction is sufficiently smaller than that of the speed control coil 8. A plurality of accelerating and decelerating coils 9 are arranged along the longitudinal direction of the center yoke 6. The plurality of accelerating and decelerating coils 9 are constituted to be electrically independent. That is, current control in units of phases is possible. The two upper and lower side yokes 7 are fixed to sandwich the center yoke 6 through the four current/magnetic flux regulating magnets 72.

The fixed unit and the movable unit are assembled such that the magnet 5 portions of each magnet holding plate 4 are inserted between the accelerating and decelerating coils 9 and the side yokes 7 of the yoke/coil unit 10 without contacting the accelerating and decelerating coils 9 and the side yokes 7.

Figure 27A:
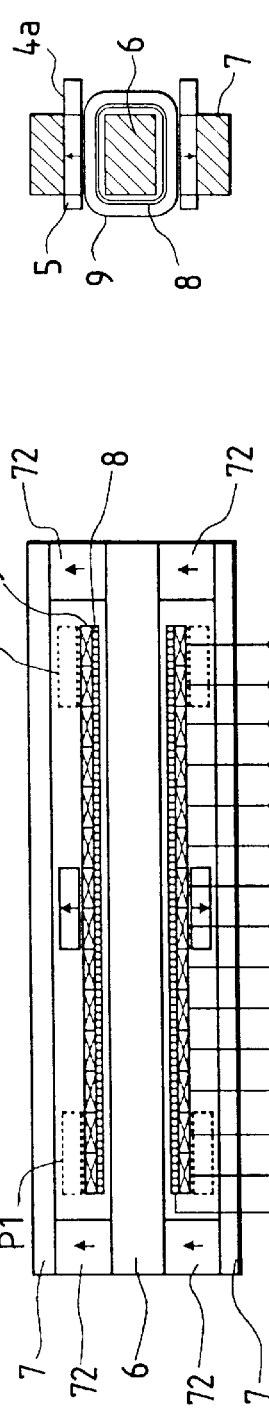
FIGS. 27A to 27C are views of the driving mechanism shown in FIG. 24.
Figure 27B:
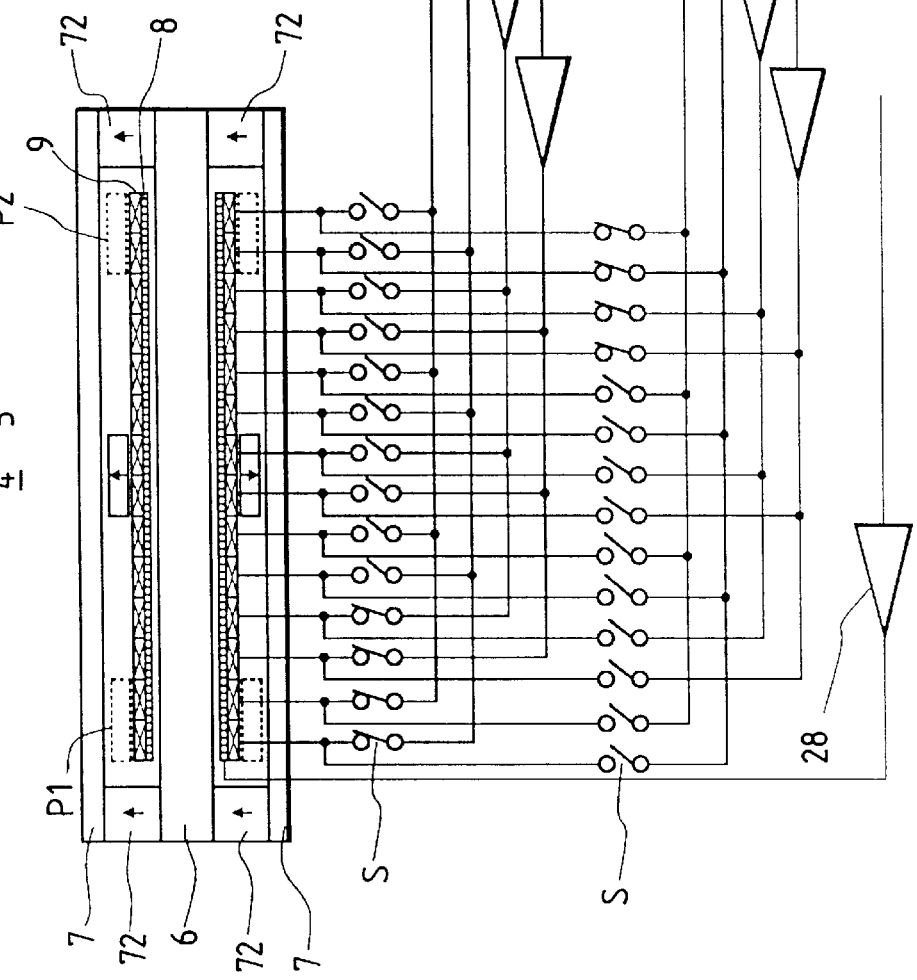
Figure 27C:
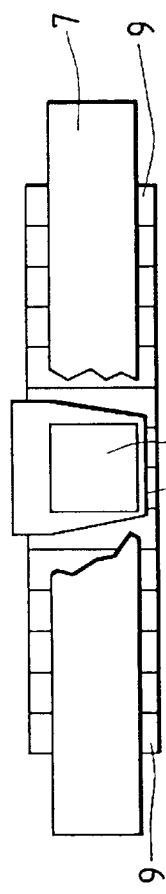

As indicated by arrows in FIGS. 27B and 27C, the magnets 5 of the movable unit are magnetized in the direction of thickness (vertical direction). More specifically, the two magnets 5 attached to each magnet holding plate 4 are magnetized such that their N poles oppose each other.

The four current/magnetic flux regulating magnets 72 provided in the fixed unit are also magnetized in the vertical direction. Each current/magnetic flux regulating magnet 72 is arranged such that the S pole opposes the center yoke 6, and the N pole opposes the side yoke 7.

The magnetic fluxes generated from the N pole of each magnet 5 contained in the movable unit pass through the gap and part of the windings of the coils 8 and 9 and enter the center yoke 6. The magnetic fluxes branch forward and backward in the longitudinal direction of the center yoke 6. The magnetic fluxes reach the two end portions (front and rear end portions) of the center yoke 6 and enter the S poles of the current/magnetic flux regulating magnets 72. On the other hand, the magnetic fluxes generated from the S pole of the magnet 5 pass through the gap and enter the side yoke 7. The magnetic fluxes branch forward and backward in the longitudinal direction, reach the two end portions (front and rear end portions) of the side yoke 7, and enter the N poles of the current/magnetic flux regulating magnets 72. In the above manner, a magnetic circuit for circulating the magnetic fluxes between the magnets 5 of the movable unit and the magnets 72 of the fixed unit is constituted.

When a current is flowed to the speed control coil 8 in this state, the magnet 5 receives a force in the scanning direction (the longitudinal direction of the yokes 6 and 7) in accordance with the Fleming's rule. Similarly, when a current is flowed to the accelerating and decelerating coils 9 opposing the magnet 5, the magnet 5 receives a force in the scanning direction.

When a current is flowed to the accelerating and decelerating coils 9 or the speed control coil 8 in this state, magnetic fluxes are generated by the current in the center yoke 6. Conventionally, the magnetic fluxes circulate through the side yoke 7. In this embodiment, however, since the current/magnetic flux regulating magnets 72 are arranged between the center yoke 6 and the side yoke 7, the magnetic fluxes generated in the center yoke 6 by the current flowing through the coils 8 and 9 are prevented from circulating through the side yoke 7. In a magnetic circuit using a current as an electromotive force, the magnet consists of a material having a large reluctance. Consequently, magnetic fluxes are hardly generated in the yoke by the current. Therefore, in designing the sectional area of the yoke, saturation of the magnetic fluxes by the current need not be taken into consideration, so that the sectional area of the yoke can be made small. In addition, the transit characteristics of the current can be improved.

FIGS. 27A to 27C are views showing the connection state of the electrical system circuit of the driving mechanism shown in FIGS. 24 to 26. As for the actuator (movable and fixed units) portion, only part of the movable unit and one side of the fixed unit are shown. FIG. 27A is a partially cutaway plan view of the one side portion of the actuator. FIG. 27B is a view showing the longitudinal section of the actuator portion and connection of the electrical system. FIG. 27C is a cross-sectional view at the magnet 5 portion of the actuator. As shown in FIG. 27B, four accelerating drivers 29a, four decelerating drivers 29b, and a speed control driver 28 are provided as drivers. The accelerating or decelerating driver is divided into a plurality of units because the driver must have a margin in its capacity. If the driver has a sufficient margin, only one accelerating or decelerating driver suffices. One of the accelerating drivers 29a and one of the decelerating drivers 29b are parallelly connected to each accelerating and decelerating coil 9 through a switch means S.

The switch means S of each accelerating and decelerating coil 9 acts such that the coil is connected to neither the accelerating drivers 29a nor the decelerating drivers 29b, or the coil is connected to only one of them. That is, the coil is never connected to both the accelerating driver 29a and the decelerating driver 29b.

In this embodiment, four groups of the four-phase accelerating and decelerating coils are connected to the four accelerating drivers 29a or the four decelerating drivers 29b, respectively, through the switch means S. More specifically, the coils are sequentially assigned to the respective groups such that the coils of one group, which are located every four coils, can be connected to the corresponding one of the accelerating drivers 29a or decelerating drivers 29b. With this arrangement, the four accelerating and decelerating coils 9 continuously arranged to be adjacent to each other can be respectively connected to the four accelerating drivers 29a or decelerating drivers 29b independently of the positions of the coils.

FIG. 27B shows a start position P1 and a stop position P2 of the movable unit which is accelerated from one stroke end, travels at a constant speed, and is decelerated to the other stroke end. The switch means S are closed such that the four-phase coils 9 at the left end are connected to only the accelerating drivers 29a. The switch means S are also closed such that the four-phase coils 9 at the right end are connected to only the decelerating drivers 29b. The remaining accelerating and decelerating coils 9 are not connected to the drivers. The total length of the four-phase coils 9 in the scanning direction is designed to be larger than (magnet size+acceleration stroke+deceleration stroke). That is, acceleration ends with only the four-phase coils. In other words, the coils cannot be switched during acceleration.

The driving mechanism having the above arrangement is used as the reticle stage 82 of the scan type exposure apparatus shown in FIG. 31. Assuming that the wafer stage 103 and the reticle stage 82 are synchronously moved, only the function of the reticle stage 82 (reference numeral "2" in FIGS. 24 to 27C) will be described below with reference to FIGS. 24 to 27C. First, the reticle stage 2 is set at the initial position. More specifically, a current in a predetermined direction is flowed to the speed control coil 8 to feed the movable unit in one direction. At the timing of turning off an origin switch (not shown), an interferometer (not shown) for measuring the reticle stage position is reset. While referring to the measurement value of the interferometer, a current is flowed to the speed control coil 8, thereby moving the movable unit (the stage 2, the magnet holding plates 4, and the magnets 5) to the start position P1 in FIG. 27B. At the start position P1, positioning control is performed by the speed control coil 8.

In accordance with a command from a control system (not shown), a current is flowed to the four-phase coils 9 connected to the accelerating drivers 29a for acceleration, thereby accelerating the reticle stage 2. When the movable unit enters the exposure region, acceleration is stopped. Speed control is performed by a control circuit (not shown) such that the movable unit is moved at a constant speed. At this time, the movable magnets 5 do not oppose the coils 9 connected to the accelerating drivers 29a, so that the correction force for speed control is obtained by interaction with the current flowed to the speed control coil 8 driven by the speed control driver 28. An exposure operation is performed at a constant speed. When the movable unit leaves the exposure region, the magnets 5 of the movable unit oppose the four-phase coils 9 connected to the decelerating drivers 29b. The movable unit is decelerated by the four-phase coils 9 and stopped at the stop position P2.

An example in which the movable unit is moved from one stroke end to the other stroke end has been described with reference to FIGS. 27A to 27C. However, when the exposure field angle is set to be small in the scan type exposure apparatus, the reticle stage moving time, i.e., the exposure time can be shortened by moving the reticle stage from an intermediate position to another intermediate position instead of moving the reticle stage from end to end, resulting in an improvement of productivity. In this case, the switch means S are closed such that the accelerating and decelerating coils 9 corresponding to the intermediate start position or intermediate stop position are connected to the accelerating drivers 29a or decelerating drivers 29b. As in the case shown in FIGS. 27A to 27C, the scanning exposure operation may be performed after initial position setting is performed up to the "intermediate start position" by the speed control coil 8.

According to this embodiment, in either case, the switch means S are only switched in correspondence with the exposure field angle. The coils 9 and the drivers 29a or 29b to be connected to the coils are determined in correspondence with the field angle. Therefore, unlike a general polyphase coil driving linear motor which selects driving coils while sensing the position of the movable unit, no complex driving sequence is needed.

In this embodiment, the length of the magnet 5 in the scanning direction corresponds to the length of the coil 85 of the conventional art (FIG. 32) in the scanning direction. Since magnetic fluxes corresponding to the length suffice, the sectional areas of the yokes 6 and 7 can be made small. In addition, since only the coils 9 corresponding to the field angle are driven during acceleration/deceleration, though the accelerating and decelerating coils 9 are arranged all the way along the scanning direction, wasteful heat generation during acceleration/deceleration can be prevented. While speed control is performed, the speed control coil 8 arranged all the way of the scanning direction is driven, resulting in wasteful heat generation. However, the driving current in speed control is sufficiently smaller than the accelerating/decelerating current, i.e., the absolute value of the wasteful heat is sufficiently small, so no problem is posed.

In addition, since the accelerating and decelerating coils can be selected in correspondence with the exposure field angle, a change in exposure field angle can be flexibly coped with.

FIGS. 28A and 28B are views showing a reticle stage actuator according to the 12th embodiment of the present invention. FIG. 28A is a view showing the longitudinal section of the actuator and connection of the electrical system. FIG. 28B is a cross-sectional view at a magnet 5 portion. In this embodiment, a plurality of accelerating and decelerating coils 9, which are wound on the center yoke 6 in the 11th embodiment, are wound on upper and lower side yokes 7. Two sets of accelerating drivers and two sets of decelerating drivers are arranged accordingly. The movable unit consisting of a stage 2, magnet holding plates 4, and the magnets 5 has the same arrangement as that in the 11th embodiment except that the magnets 5 are made closer to the center yoke 6 by a distance corresponding to the thickness of the accelerating and decelerating coils 9.

As in the 11th embodiment, only the movement of the reticle stage 2 will be described. After the reticle stage 2 is set at the initial position, a current is flowed to the driving coils to accelerate the reticle stage. When the shift between the center of gravity of the reticle stage and the position where the driving force is applied is represented by $\Delta$, and the thrust for acceleration is represented by F, a moment corresponding to $F*\Delta$ acts on the reticle stage base and the main body to swing or deform the main body. In this embodiment, however, the amount of the current flowed to drivers 29a in synchronism with acceleration is made different for the upper and lower accelerating coils 9. As a result, a moment for offsetting the moment $F*\Delta$ is applied to the movable unit.

To control the current, an acceleration corresponding to the swing of the main body may be measured and changed in proportion to the current difference between the upper and lower drivers. Alternatively, the upper and lower drivers may be driven while maintaining a predetermined current difference, like open-loop control.

Acceleration is stopped in the exposure region, and speed control is performed by a control circuit (not shown) such that the movable unit moves at a constant speed. At this time, the movable magnets 5 do not oppose the coils 9 connected to the accelerating drivers 29a, so that the correction force for speed control is obtained by interaction with the current flowed to a speed control coil 8 driven by a speed control driver 28.

When the movable unit leaves the exposure region, the movable unit is decelerated by decelerating drivers 29b and stopped. At this time, the moment need not always be offset by forming a current difference between the upper and lower drivers 29b. Even when the main body swings, this moment need only be settled before the next synchronization. Positional information during acceleration/deceleration or constant-speed control is obtained by a position measurement means such as a laser interferometer (not shown).

In this embodiment, the same effect as in the first embodiment can be obtained, and additionally, the moment around the optical axis caused, during acceleration, by the shift between the center of gravity of the reticle stage 2 and the position where the driving force is applied can be offset. As a result, deformation of the main body or a disturbance acting on synchronization of the reticle and the wafer can be minimized.

An example in which the reactive moment during acceleration is offset by forming a current difference between the upper and lower accelerating and decelerating coils 9 has been described above, assuming that the number of turns of the accelerating and decelerating coils 9 wound on the upper side yoke 7 is the same as that on the lower side yoke 7. However, since the shift Δ of the point of application and the center of gravity of the movable unit with respect to the position of the optical axis is often known and unchanged, the number of turns of the accelerating and decelerating coils 9 may be made different for the upper and lower side yokes 7 in advance in correspondence with the shift Δ. With this arrangement, the reactive moment can be offset by supplying the same current to the upper and lower accelerating and decelerating coils 9. For this reason, only one group of accelerating drivers 29a and one group of decelerating drivers 29b suffice, as in the first embodiment, so that the arrangement can be simplified.

Any one of the driving mechanisms and reticle stages in the first to 12th embodiments can be applied as the reticle stage 82 of the scan type exposure apparatus shown in FIG. 31.

Referring to FIG. 31, a main body table 102 is supported on a reference base 100 through an anti-vibration means 101. A wafer stage 103 is mounted on the main body table 102 to be movable within the X-Y plane (horizontal plane). A projection optical system 106 is fixed above the wafer stage 103 through a main body supporting member 105. A reticle stage base 80 and the reticle stage 82 capable of uniaxially scanning on the reticle stage base 80 along a guide (not shown) are arranged above the supporting member 105. An interferometer second reference 104 is used to measure the position of the wafer stage 103. An interferometer first reference 107 is used to measure the position of the reticle stage 82. An illumination system 108 supplies an exposure energy to a wafer (not shown) on the wafer stage 103 through a reticle (not shown) on the reticle stage 82.

An illumination light beam from the illumination system 108 is irradiated on the reticle on the reticle stage only in its elongated rectangular or arcuated region which is perpendicular to the scanning direction of the reticle stage 82. For this reason, when the entire reticle pattern is to be exposed on the wafer, both the reticle stage 82 and the wafer stage 103 must be scanned. The scanning operation is performed at a constant speed. The ratio of the speed of the reticle stage 82 to that of the wafer stage 103 during the scanning operation is made precisely equal the reduction magnification of the projection optical system 106. The positions of the reticle stage 82 and the wafer stage 103 are measured by laser interferometers (not shown) through the interferometer first reference 107 and the interferometer second reference 104, respectively, and fed back to a control system (not shown).

In the above arrangement, the wafer stage 103 and the reticle stage 82 are moved to initial positions and accelerated. The acceleration is controlled to converge such that, before the wafer stage 103 and the reticle stage 82 enter a region where the illumination light beam is irradiated, they attain a predetermined positional relationship, and the speed ratio becomes equal to the reduction magnification of the projection optical system 106. An exposure operation is performed while maintaining this state. When the wafer stage 103 and the reticle stage 82 leave the region where the illumination light beam is irradiated, they are appropriately decelerated.

An embodiment of a method of producing a device by using the above-described scan type exposure apparatus will be described below.

FIG. 29 is a flow chart showing the flow of manufacturing a micro device (e.g., a semiconductor chip such as an IC or an LSI, a liquid crystal panel, a CCD, a thin film magnetic head, and a micromachine). In step 1 (circuit design), circuit design of a semiconductor device is performed. In step 2 (mask manufacturing), a mask on which the designed circuit pattern is formed is manufactured. In step 3 (wafer manufacturing), a wafer is manufactured using a material such as silicon. Step 4 (wafer process) is called a preceding process. Using the prepared mask and wafer, an actual circuit is formed on the wafer by lithography. Step 5 (assembly) is called a final process. A semiconductor chip is assembled using the wafer manufactured in step 4. Step 5 includes an assembly process (dicing and bonding), a packaging process (chip encapsulation), and the like. In step 6 (examination), examination such as a performance confirmation test and a durability test is performed for the semiconductor device manufactured in step 5. The semiconductor device is completed by the above processes and shipped (step 7).

Figure 30:
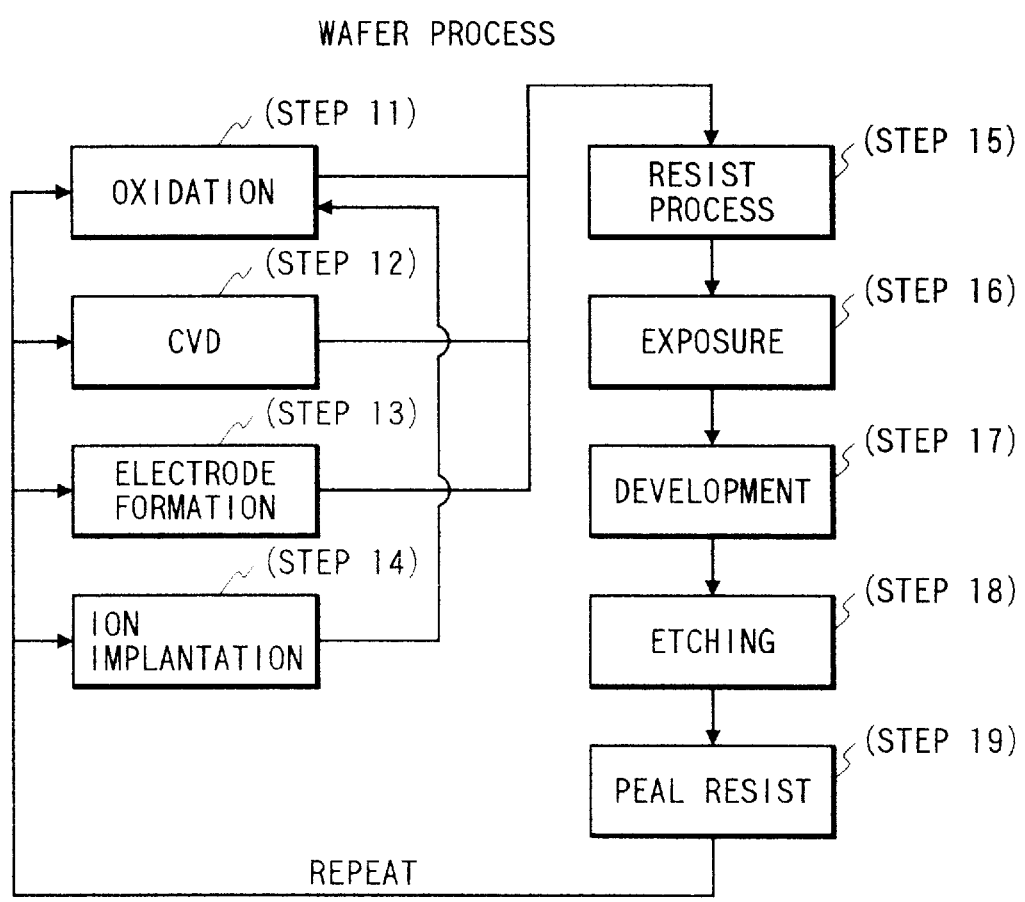
FIG. 30 is a flow chart showing the operation of the scan type exposure apparatus according to the 13th embodiment of the present invention.

FIG. 30 is a flow chart showing the details of the wafer process (step 4). In step 11 (oxidation), the surface of the wafer is oxidized. In step 12 (CVD), an insulating film is formed on the wafer surface. In step 13 (electrode formation), electrodes are formed on the wafer by deposition. In step 14 (ion implantation), ions are implanted in the wafer. In step 15 (resist process), a photosensitive material is applied to the wafer. In step 16 (exposure), the circuit pattern of the mask is exposed to the wafer by the above-described exposure apparatus. In step 17 (development), the exposed wafer is developed. In step 18 (etching), a portion except for the developed resist image is etched. In step 19 (resist peeling), the unnecessary resist after etching is removed. By repeating these processes, a multilayered circuit pattern is formed on the wafer.

When the manufacturing method of this embodiment is used, a highly integrated semiconductor device, which is conventionally difficult to manufacture, can be manufactured at a low cost.

What is claimed is:

1. A stage apparatus comprising:

a stage movable in a predetermined direction;

stage accelerating/decelerating thrust generation means arranged along the moving direction;

stage speed control thrust generation means arranged to be parallel to said stage accelerating/decelerating thrust generation means;

accelerating means for generating a stage accelerating thrust at a portion corresponding to a stage accelerating interval of said stage accelerating/decelerating thrust generation means;

decelerating means for generating a stage decelerating thrust at a portion corresponding to a stage decelerating interval of said stage accelerating/decelerating thrust generation means; and speed control means for controlling a stage thrust generated by said stage speed control thrust generation means at least within a predetermined range between the accelerating interval and the decelerating interval, wherein each of said stage accelerating/decelerating thrust generation means and said stage speed control thrust generation means comprises a linear motor whose movable unit has a magnet with its one pole opposing coils of a fixed unit, and said fixed unit comprises a yoke for applying a predetermined magnetic field to part of said coils in accordance with a position of said magnet over an entire stroke of said stage, and, as said coils, a single-phase speed control coil wound on said yoke and a plurality of polyphase accelerating/decelerating coils.

2. A stage apparatus comprising:

a stage movable in a predetermined direction;

stage accelerating/decelerating thrust generation means arranged along the moving direction;

stage speed control thrust generation means arranged to be parallel to said stage accelerating/decelerating thrust generation means;

accelerating means for generating a stage accelerating thrust at a portion corresponding to a stage accelerating interval of said stage accelerating/decelerating thrust generation means;

decelerating means for generating a stage decelerating thrust at a portion corresponding to a stage decelerating interval of said stage accelerating/decelerating thrust generation means; and speed control means for controlling a stage thrust generated by said stage speed control thrust generation means at least within a predetermined range between the accelerating interval and the decelerating interval, wherein each of said stage accelerating/decelerating thrust generation means and said stage speed control thrust generation means comprises a linear motor whose movable unit has a magnet with its two poles opposing coils of a fixed unit and separated from each other by at least a maximum stroke distance of said stage, and said fixed unit comprises a yoke for applying a predetermined magnetic field to part of said coils in accordance with a position of said magnet over an entire stroke of said stage, and, as said coils, two sets of a single-phase speed control coil wound on said yoke and a plurality of polyphase accelerating/decelerating coils, which two sets of coils are separated from each other by a distance substantially equal to a pole-to-pole distance of said magnet.

3. A stage apparatus according to claim 1 or 2, wherein said yoke has a main yoke having a straight portion parallel to the moving direction of said stage and arranged at least over the entire stroke of said stage, and a side yoke having a straight portion parallel to said straight portion of said main yoke at least over the entire stroke of said stage and magnetically connected to said main yoke outside the stroke.

4. A stage apparatus according to claim 3, wherein said plurality of polyphase accelerating/decelerating coils are wound on said single-phase speed control coil.

5. A stage apparatus according to claim 3, wherein said single-phase speed control coil is wound on said main yoke, and said plurality of polyphase accelerating/decelerating coils are wound on said side yoke.

6. A stage apparatus according to claim 3, wherein two side yokes are arranged on both sides of said main yoke, said single-phase speed control coil is wound on said main yoke, and two sets of said plurality of polyphase accelerating/decelerating coils are wound on said two side yokes, respectively.

7. A stage apparatus according to claim 3, wherein two sets of said movable unit and said fixed unit of said linear motor are arranged on both sides of said stage, respectively.

8. A stage apparatus comprising:

a stage movable in a predetermined direction;

stage accelerating/decelerating thrust generation means arranged along the moving direction;

stage speed control thrust generation means arranged to be parallel to said stage accelerating/decelerating thrust generation means;

accelerating means for generating a stage accelerating thrust at a portion corresponding to a stage accelerating interval of said stage accelerating/decelerating thrust generation means;

decelerating means for generating a stage decelerating thrust at a portion corresponding to a stage decelerating interval of said stage accelerating/decelerating thrust generation means;

speed control means for controlling a stage thrust generated by said stage speed control thrust generation means at least within a predetermined range between the accelerating interval and the decelerating interval; and position detection means for detecting a position of said stage, command means for outputting a current command on the basis of a current position of said stage, which is detected by said position detection means, and a target position of said stage, a PWM accelerating power amplifier and a PWM decelerating power amplifier each of which outputs a current corresponding to the current command, switch means for connecting an output from said accelerating power amplifier to said accelerating means and an output from said decelerating power amplifier to said decelerating means, and a linear speed control power amplifier for outputting a current corresponding to said current command to drive said stage speed control thrust generation means.

9. A stage apparatus comprising:

position detection means for detecting a position of a stage;

command means for outputting a current command on the basis of a current position of said stage, which is detected by said position detection means, and a target position of said stage;

a first power amplifier of a PWM type;

first driving means for driving said stage in accordance with an output current from said first power amplifier;

a second power amplifier of a linear type; and second driving means for driving said stage in accordance with an output current from said second power amplifier, wherein said first and second driving means are arranged to be parallel to each other.

10. A stage apparatus according to claim 9, further comprising means for selecting one of said first and second power amplifiers such that, in accelerating/decelerating said stage, said stage is driven through said first power amplifier, and in positioning and speed control of said stage, said stage is driven through said second power amplifier.

11. A stage apparatus according to claim 9, wherein each of said first and second driving means comprises a linear motor whose movable unit has accelerating/decelerating coils connected to said first power amplifier, and a positioning/speed control coil connected to said second power amplifier.

12. A stage apparatus according to claim 11, wherein two sets of said movable unit and said fixed unit of said linear motor are arranged on both sides of said stage, respectively.

13. A stage apparatus according to claim 9, wherein each of said first and second driving means comprises a linear motor whose movable unit has a magnet with its one pole opposing coils of a fixed unit, said fixed unit has a yoke for applying a predetermined magnetic field to part of said coils over an entire stroke of said stage, and said coils comprise a single-phase speed control coil wound on said yoke and a plurality of polyphase accelerating/decelerating coils.

14. A stage apparatus according to claim 13, wherein said plurality of polyphase accelerating/decelerating coils are wound on said single-phase speed control coil.

15. A stage apparatus according to claim 13, wherein said yoke has a main yoke having a straight portion parallel to the moving direction of said stage and arranged at least over the entire stroke of said stage, and a side yoke having a straight portion parallel to said straight portion of said main yoke at least over the entire stroke of said stage and magnetically connected to said main yoke outside the stroke.

16. A stage apparatus according to claim 15, wherein said single-phase speed control coil is wound on said main yoke, and said plurality of polyphase accelerating/decelerating coils are wound on said side yoke.

17. A stage apparatus according to claim 15, wherein two side yokes are arranged on both sides of said main yoke, said single-phase speed control coil is wound on said main yoke, and two sets of said plurality of polyphase accelerating/decelerating coils are wound on said two side yokes, respectively.

18. A stage apparatus according to claim 9, wherein said second driving means comprises a linear motor having a coil fixed on said stage, and a magnet and a yoke for applying a magnetic field to said coil, and said first driving means comprises a screwing mechanism, and a power transmission unit for transmitting a power of said screwing mechanism to said stage.

19. A stage apparatus according to claim 9, wherein each of said first and second driving means comprises a linear motor whose movable unit has a heteropolar magnet unit and whose fixed unit has a plurality of flat coil units, and each of said flat coil units has an accelerating/decelerating coil connected to said first power amplifier and positioning/speed control coil connected to said second power amplifier.

20. A scanning exposure apparatus using, as a reticle stage, a stage apparatus, said stage apparatus comprising:

a stage movable in a predetermined direction;

stage accelerating/decelerating thrust generation means arranged along the moving direction;

stage speed control thrust generation means arranged to be parallel to said stage accelerating/decelerating thrust generation means;

accelerating means for generating a stage accelerating thrust at a portion corresponding to a stage accelerating interval of said stage accelerating/decelerating thrust generation means;

decelerating means for generating a stage decelerating thrust at a portion corresponding to a stage decelerating interval of said stage accelerating/decelerating thrust generation means; and speed control means for controlling a stage thrust generated by said stage speed control thrust generation means at least within a predetermined range between the accelerating interval and the decelerating interval.

21. A device production method comprising producing a device by using a scanning exposure apparatus using, as a reticle stage, a stage apparatus, said stage apparatus comprising:

a stage movable in a predetermined direction;

stage accelerating/decelerating thrust generation means arranged along the moving direction;

stage speed control thrust generation means arranged to be parallel to said stage accelerating/decelerating thrust generation means;

accelerating means for generating a stage accelerating thrust at a portion corresponding to a stage accelerating interval of said stage accelerating/decelerating thrust generation means;

decelerating means for generating a stage decelerating thrust at a portion corresponding to a stage decelerating interval of said stage accelerating/decelerating thrust generation means; and speed control means for controlling a stage thrust generated by said stage speed control thrust generation means at least within a predetermined range between the accelerating interval and the decelerating interval.

* * * * *

UNITED STATES PATENT AND TRADEMARK OFFICE
CERTIFICATE OF CORRECTION

PATENT NO. : 5,841,250

DATED : November 24, 1998

INVENTOR(S): NOBUSHIGE KORENAGA, ET AL.   Page 1 of 11

It is certified that error appears in the above-identified patent and that said Letters Patent is hereby corrected as shown below:

IN THE DRAWINGS

FIGURE 1:

Change the lead line for reference numeral "2" as shown in the attached replacement Figure 1.

FIGURE 5B:

In upper element 4, change "↑" to --↓-- and in lower element 4, change "↓" to --↑--.

FIGURE 8:

Change reference numeral "3" to 2 and add reference numeral --3-- with lead line as shown in the attached replacement Figure 8.

FIGURE 9A:

In the lower left, change "↑" to --↓-- and in the lower right, change "↓" to --↑--.

FIGURE 9B:

In the upper element, change "↑" to --↓--.

UNITED STATES PATENT AND TRADEMARK OFFICE
CERTIFICATE OF CORRECTION

PATENT NO. : 5,841,250

DATED : November 24, 1998

INVENTOR(S) : NOBUSHIGE KORENAGA, ET AL.

It is certified that error appears in the above-identified patent and that said Letters Patent is hereby corrected as shown below:

FIG. 1

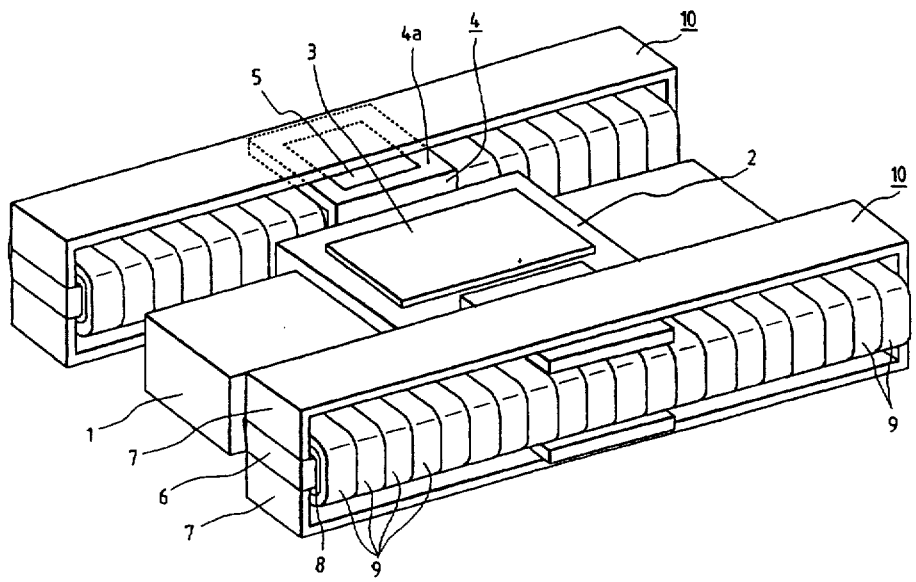

UNITED STATES PATENT AND TRADEMARK OFFICE
CERTIFICATE OF CORRECTION

PATENT NO. : 5,841,250

DATED : November 24, 1998

INVENTOR(S) : NOBUSHIGE KORENAGA, ET AL.        Page 3 of 11

It is certified that error appears in the above-identified patent and that said Letters Patent is hereby corrected as shown below:

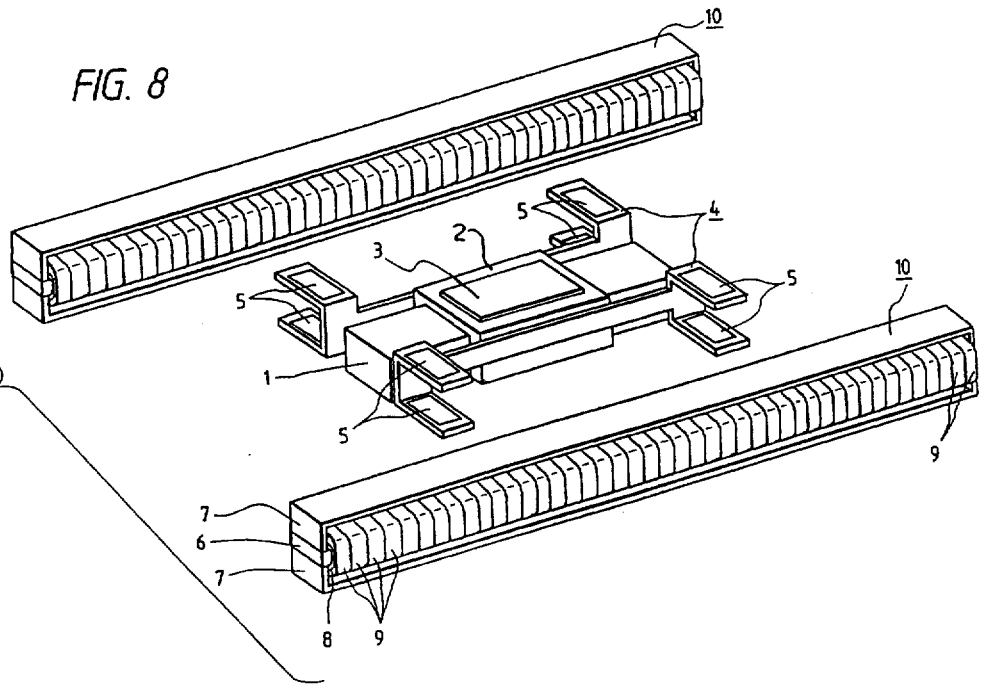

FIG. 8

UNITED STATES PATENT AND TRADEMARK OFFICE
CERTIFICATE OF CORRECTION

PATENT NO. : 5,841,250

DATED : November 24, 1998

INVENTOR(S) : NOBUSHIGE KORENAGA, ET AL.

It is certified that error appears in the above-identified patent and that said Letters Patent is hereby corrected as shown below:

FIGURE 10A:

In the lower left, change "↑" to --↓-- and in the lower right, change "↓" to --↑--.

FIGURE 10B:

In upper element 4, change "↑" to --↓--.

FIGURE 15B:

In upper element 5, change "↑" to --↓-- and in the corresponding lower element, change "↓" to --↑--.

FIGURE 15C:

In upper element 4, change "↑" to --↓-- and in the lower element, change "↓" to --↑--.

FIGURE 26:

In the lower right of the drawing, change "10" to --10--.

UNITED STATES PATENT AND TRADEMARK OFFICE
CERTIFICATE OF CORRECTION

PATENT NO. : 5,841,250

DATED : November 24, 1998

INVENTOR(S) : NOBUSHIGE KORENAGA, ET AL.

It is certified that error appears in the above-identified patent and that said Letters Patent is hereby corrected as shown below:

FIGURE 27B:

In the center of the upper element, change "↑" to --↓--, in the center of the lower element, change "↓" to --↑--, in the lower left element "72", change "↑" to --↓-- and in the lower right element "72", change "↑" to --↓--.

FIGURE 27C:

In upper element 4a, change "↑" to --↓-- and in the lower element, change "↓" to --↑--.

FIGURE 28A:

In the center of the upper element, change "↓" to --↑-- and in the center of the lower element, change "↑" to --↓--.

FIGURE 28B:

In upper element 4a, change "↑" to --↓-- and in lower element 4a, change "↓" to --↑--.

UNITED STATES PATENT AND TRADEMARK OFFICE
CERTIFICATE OF CORRECTION

PATENT NO. : 5,841,250

DATED : November 24, 1998

INVENTOR(S) : NOBUSHIGE KORENAGA, ET AL.

It is certified that error appears in the above-identified patent and that said Letters Patent is hereby corrected as shown below:

FIGURE 30:

In step 19, change "PEAL" to --PEEL--.

IN THE DISCLOSURE

COLUMN 1:

line 23, "exposure" should read --expose--; and
    line 50, "Liner" should read --Linear--.

COLUMN 2:

line 25, "equal" should read --equal to--; and
    line 67, "with at" should read --with--.

COLUMN 4:

line 62, "other" should read --other one--.

COLUMN 10:

line 15, "is flowed" should read --flows--; and
    line 18, "is flowed" should read --flows--.

UNITED STATES PATENT AND TRADEMARK OFFICE
CERTIFICATE OF CORRECTION

PATENT NO. : 5,841,250

DATED : November 24, 1998

INVENTOR(S): NOBUSHIGE KORENAGA, ET AL.

It is certified that error appears in the above-identified patent and that said Letters Patent is hereby corrected as shown below:

COLUMN 11:

line 36, "flowed" should read --flowing--;
    line 62, "Whether the coils 9 and" should read --Whether--;
    line 63, "29b to" should read --29b are to-- and "coils" should read --coils 9--; and
    line 65, "coil driving" should read --coil-driven--.

COLUMN 12:

line 39, "is flowed" should read --flows--;
    line 46, "flowed" should read --flowing--; and
    line 64, "flowed" should read --flowing--.

COLUMN 14:

line 44, "is flowed" should read --flows--; and
    line 48, "is flowed" should read --flows--.

COLUMN 15:

line 2, "flow" should read --allow-- and "currents" should read --currents to flow--;
    line 44, "is flowed" should read --flows--;
    line 49, "flowed" should read --driven--;
    line 55, "is flowed" should read --flows--; and
    line 64, "flowed" should read --flowing--.

UNITED STATES PATENT AND TRADEMARK OFFICE
CERTIFICATE OF CORRECTION

PATENT NO. : 5,841,250

DATED : November 24, 1998

INVENTOR(S) : NOBUSHIGE KORENAGA, ET AL.

Page 8 of 11

It is certified that error appears in the above-identified patent and that said Letters Patent is hereby corrected as shown below:

COLUMN 16:

line 23, "The coils 9 and" should read --Whether-- and "29b to" should read --29b are to--;
    line 24, "coils are" should read --coils 9 or not is--; and
    line 26, "coil driving" should read --coil-driven--.

COLUMN 17:

line 1, "is flowed" should read --flows--;
    line 8, "flowed" should read --flowing--; and
    line 25, "flowed" should read --flowing--.

COLUMN 18:

line 3, "both the" should read --both--;
    line 39, "is flowed" should read --flows--;
    line 40, "flows" should read --drives--;
    line 48, "operations" should read --operation--;
    line 55, "flowed" should read --driven--;
    line 57, "flowing" should read --driving--; and
    line 65, "flows" should read --drives--.

UNITED STATES PATENT AND TRADEMARK OFFICE
CERTIFICATE OF CORRECTION

PATENT NO. : 5,841,250

DATED : November 24, 1998

INVENTOR(S): NOBUSHIGE KORENAGA, ET AL.

It is certified that error appears in the above-identified patent and that said Letters Patent is hereby corrected as shown below:

COLUMN 19:

line 8, "exposure" should read --expose--;
    line 59, "is flowed" should read --flows--; and
    line 63, "is flowed" should read --flows--.

COLUMN 20:

line 37, "are" should read --is--.

COLUMN 21:

line 3, "is flowed" should read --flows--;
    line 5, "flows" should read --drives--;
    line 16, "flowed" should read --flowing--;
    line 28, "be flowed" should read --flow--;
    line 29, "flowing" should read --driving--; and
    line 66, "tow" should read --two--.

COLUMN 22:

line 2, "unit" should read --units--; and
    line 61, "flowing" should read --flow of--.

UNITED STATES PATENT AND TRADEMARK OFFICE
CERTIFICATE OF CORRECTION

PATENT NO. : 5,841,250

DATED : November 24, 1998

INVENTOR(S) : NOBUSHIGE KORENAGA, ET AL.

It is certified that error appears in the above-identified patent and that said Letters Patent is hereby corrected as shown below:

COLUMN 23:

line 45, "is flowed" should read --flows--; and
    line 60, "flowing" should read --driving--.

COLUMN 24:

line 7, "fixed" should read --is fixed--;
    line 14, "N" should read --S--;
    line 15, "S" should read --N--; and
    line 28, "is flowed" should read --flows--.

COLUMN 25:

line 51, "is flowed" should read --flows--;
    line 54, "is flowed" should read --flows--; and
    line 58, "is flowed" should read --flows--.

COLUMN 27:

line 3, "flowed" should read --driven--;
    line 8, "flowed" should read --driven--;
    line 14, "flowed" should read --driven--;
    line 23, "flowed" should read --flowing--;
    line 49, "The coils 9 and" should read --Whether-- and "29b to" should read --29b are to--;
    line 50, "coils are" should read --coils 9 or not is--; and
    line 52, "coil driving" should read --coil-driven--.

UNITED STATES PATENT AND TRADEMARK OFFICE
CERTIFICATE OF CORRECTION

PATENT NO. : 5,841,250

DATED : November 24, 1998

INVENTOR(S) : NOBUSHIGE KORENAGA, ET AL.

It is certified that error appears in the above-identified patent and that said Letters Patent is hereby corrected as shown below:

COLUMN 28:

line 25, "flowed" should read --driven--;
    line 32, "flowed" should read --flowing--; and
    line 49, "flowed" should read --flowing--.

Signed and Sealed this

Tenth Day of October, 2000

Attest:

*Attesting Officer*

Q. TODD DICKINSON
*Director of Patents and Trademarks*